(12) United States Patent
Hagiwara et al.

(10) Patent No.: US 6,381,004 B1
(45) Date of Patent: Apr. 30, 2002

(54) EXPOSURE APPARATUS AND DEVICE MANUFACTURING METHOD

(75) Inventors: Tsuneyuki Hagiwara, Tokyo; Hideyuki Tashiro, Fukaya, both of (JP)

(73) Assignee: Nikon Corporation, Tokyo (JP)

(*) Notice: Subject to any disclaimer, the term of this patent is extended or adjusted under 35 U.S.C. 154(b) by 0 days.

(21) Appl. No.: 09/672,850

(22) Filed: Sep. 29, 2000

(30) Foreign Application Priority Data

Sep. 29, 1999 (JP) .......................................... 11-275543

(51) Int. Cl.$^7$ ...................... G03B 27/42; G03B 27/52; G03B 27/54
(52) U.S. Cl. .............................. 355/53; 355/55; 355/67
(58) Field of Search ............................ 355/53, 55, 67, 355/77; 356/399–401; 250/548

(56) References Cited

U.S. PATENT DOCUMENTS

| | | | |
|---|---|---|---|
| 5,118,515 A | 6/1992 | Wakamoto et al. | 355/53 |
| 5,448,332 A | 9/1995 | Sakakibara et al. | 355/53 |
| 5,737,063 A | 4/1998 | Miyachi | 355/53 |
| 5,742,067 A * | 4/1998 | Imai | 250/548 |
| 5,991,007 A * | 11/1999 | Narimatsu | 355/53 |
| 6,118,515 A | 9/2000 | Wakamoto et al. | 355/53 |
| 6,172,373 B1 * | 1/2001 | Hara et al. | 250/548 |
| 6,236,447 B1 * | 5/2001 | Yamada et al. | 355/53 |

FOREIGN PATENT DOCUMENTS

| | | |
|---|---|---|
| EP | 0 867 771 | 9/1998 |
| JP | 10-116877 | 5/1998 |

OTHER PUBLICATIONS

United States Statutory Invention Registration, H17774, T. Miyachi, Jan. 5, 1999.

* cited by examiner

Primary Examiner—Russell Adams
Assistant Examiner—Hung Henry Nguyen
(74) Attorney, Agent, or Firm—Oblon, Spivak, McClelland, Maier & Neustadt, P.C.

(57) ABSTRACT

In the case the first selection criteria is set, a plurality of detection points are selected to control the pitching and rolling of the wafer, whereas in the case the second selection criteria is set, priority is put to control the rolling on the wafer. The exposure apparatus has a selection unit to choose between these criteria, and on scanning exposure the controller adjusts the wafer position in the optical axis direction, pitching, rolling or the wafer position in the optical axis direction and rolling according to the selection criteria. Accordingly, by precisely adjusting the wafer surface position in the optical axis direction and rolling that greatly affects defocus, the critical dimension variation by a macroscopic observation, which is caused by defocus, can be prevented. Moreover, by performing an alternate scanning on the entire shot area including shot areas to be exposed on the circumferential portion, throughput can be maintained extremely high.

30 Claims, 37 Drawing Sheets

*Fig. 7A*

| $S_{19}$ | $S_{18}$ | $S_{17}$ | $S_{16}$ | $S_{15}$ | $S_{14}$ | $S_{13}$ | $S_{12}$ | $S_{11}$ |
| --- | --- | --- | --- | --- | --- | --- | --- | --- |
| $S_{29}$ | $S_{28}$ | $S_{27}$ | $S_{26}$ | $S_{25}$ | $S_{24}$ | $S_{23}$ | $S_{22}$ | $S_{21}$ |
| $S_{39}$ | $S_{38}$ | $S_{37}$ | $S_{36}$ | $S_{35}$ | $S_{34}$ | $S_{33}$ | $S_{32}$ | $S_{31}$ |
| $S_{49}$ | $S_{48}$ | $S_{47}$ | $S_{46}$ | $S_{45}$ | $S_{44}$ | $S_{43}$ | $S_{42}$ | $S_{41}$ |
| $S_{59}$ | $S_{58}$ | $S_{57}$ | $S_{56}$ | $S_{55}$ | $S_{54}$ | $S_{53}$ | $S_{52}$ | $S_{51}$ |

*Fig. 7B*

| $S_{19}$ | $S_{18}$ | $S_{17}$ | $S_{16}$ | $S_{15}$ | $S_{14}$ | $S_{13}$ | $S_{12}$ | $S_{11}$ |
| --- | --- | --- | --- | --- | --- | --- | --- | --- |
| $S_{29}$ | $S_{28}$ | $S_{27}$ | $S_{26}$ | $S_{25}$ | $S_{24}$ | $S_{23}$ | $S_{22}$ | $S_{21}$ |
| $S_{39}$ | $S_{38}$ | $S_{37}$ | $S_{36}$ | $S_{35}$ | $S_{34}$ | $S_{33}$ | $S_{32}$ | $S_{31}$ |
| $S_{49}$ | $S_{48}$ | $S_{47}$ | $S_{46}$ | $S_{45}$ | $S_{44}$ | $S_{43}$ | $S_{42}$ | $S_{41}$ |
| $S_{59}$ | $S_{58}$ | $S_{57}$ | $S_{56}$ | $S_{55}$ | $S_{54}$ | $S_{53}$ | $S_{52}$ | $S_{51}$ |

*Fig. 7C*

| $S_{19}$ | $S_{18}$ | $S_{17}$ | $S_{16}$ | $S_{15}$ | $S_{14}$ | $S_{13}$ | $S_{12}$ | $S_{11}$ |
| --- | --- | --- | --- | --- | --- | --- | --- | --- |
| $S_{29}$ | $S_{28}$ | $S_{27}$ | $S_{26}$ | $S_{25}$ | $S_{24}$ | $S_{23}$ | $S_{22}$ | $S_{21}$ |
| $S_{39}$ | $S_{38}$ | $S_{37}$ | $S_{36}$ | $S_{35}$ | $S_{34}$ | $S_{33}$ | $S_{32}$ | $S_{31}$ |
| $S_{49}$ | $S_{48}$ | $S_{47}$ | $S_{46}$ | $S_{45}$ | $S_{44}$ | $S_{43}$ | $S_{42}$ | $S_{41}$ |
| $S_{59}$ | $S_{58}$ | $S_{57}$ | $S_{56}$ | $S_{55}$ | $S_{54}$ | $S_{53}$ | $S_{52}$ | $S_{51}$ |

Fig. 8A

| $S_{19}$ | $S_{18}$ | $S_{17}$ | $S_{16}$ | $S_{15}$ | $S_{14}$ | $S_{13}$ | $S_{12}$ | $S_{11}$ |
|---|---|---|---|---|---|---|---|---|
| $S_{29}$ | $S_{28}$ | $S_{27}$ | $S_{26}$ | $S_{25}$ | $S_{24}$ | $S_{23}$ | $S_{22}$ | $S_{21}$ |
| $S_{39}$ | $S_{38}$ | $S_{37}$ | $S_{36}$ | $S_{35}$ | $S_{34}$ | $S_{33}$ | $S_{32}$ | $S_{31}$ |
| $S_{49}$ | $S_{48}$ | $S_{47}$ | $S_{46}$ | $S_{45}$ | $S_{44}$ | $S_{43}$ | $S_{42}$ | $S_{41}$ |
| $S_{59}$ | $S_{58}$ | $S_{57}$ | $S_{56}$ | $S_{55}$ | $S_{54}$ | $S_{53}$ | $S_{52}$ | $S_{51}$ |

Fig. 8B

| $S_{19}$ | $S_{18}$ | $S_{17}$ | $S_{16}$ | $S_{15}$ | $S_{14}$ | $S_{13}$ | $S_{12}$ | $S_{11}$ |
|---|---|---|---|---|---|---|---|---|
| $S_{29}$ | $S_{28}$ | $S_{27}$ | $S_{26}$ | $S_{25}$ | $S_{24}$ | $S_{23}$ | $S_{22}$ | $S_{21}$ |
| $S_{39}$ | $S_{38}$ | $S_{37}$ | $S_{36}$ | $S_{35}$ | $S_{34}$ | $S_{33}$ | $S_{32}$ | $S_{31}$ |
| $S_{49}$ | $S_{48}$ | $S_{47}$ | $S_{46}$ | $S_{45}$ | $S_{44}$ | $S_{43}$ | $S_{42}$ | $S_{41}$ |
| $S_{59}$ | $S_{58}$ | $S_{57}$ | $S_{56}$ | $S_{55}$ | $S_{54}$ | $S_{53}$ | $S_{52}$ | $S_{51}$ |

Fig. 8C

| $S_{19}$ | $S_{18}$ | $S_{17}$ | $S_{16}$ | $S_{15}$ | $S_{14}$ | $S_{13}$ | $S_{12}$ | $S_{11}$ |
|---|---|---|---|---|---|---|---|---|
| $S_{29}$ | $S_{28}$ | $S_{27}$ | $S_{26}$ | $S_{25}$ | $S_{24}$ | $S_{23}$ | $S_{22}$ | $S_{21}$ |
| $S_{39}$ | $S_{38}$ | $S_{37}$ | $S_{36}$ | $S_{35}$ | $S_{34}$ | $S_{33}$ | $S_{32}$ | $S_{31}$ |
| $S_{49}$ | $S_{48}$ | $S_{47}$ | $S_{46}$ | $S_{45}$ | $S_{44}$ | $S_{43}$ | $S_{42}$ | $S_{41}$ |
| $S_{59}$ | $S_{58}$ | $S_{57}$ | $S_{56}$ | $S_{55}$ | $S_{54}$ | $S_{53}$ | $S_{52}$ | $S_{51}$ |

Fig. 9A

| S19 | S18 | S17 | S16 | S15 | S14 | S13 | S12 | S11 |
|-----|-----|-----|-----|-----|-----|-----|-----|-----|
| S29 | S28 | S27 | S26 | S25 | S24 | S23 | S22 | S21 |
| S39 | S38 | S37 | S36 | S35 | S34 | S33 | S32 | S31 |
| S49 | S48 | S47 | S46 | S45 | S44 | S43 | S42 | S41 |
| S59 | S58 | S57 | S56 | S55 | S54 | S53 | S52 | S51 |

Fig. 9B

| S19 | S18 | S17 | S16 | S15 | S14 | S13 | S12 | S11 |
|-----|-----|-----|-----|-----|-----|-----|-----|-----|
| S29 | S28 | S27 | S26 | S25 | S24 | S23 | S22 | S21 |
| S39 | S38 | S37 | S36 | S35 | S34 | S33 | S32 | S31 |
| S49 | S48 | S47 | S46 | S45 | S44 | S43 | S42 | S41 |
| S59 | S58 | S57 | S56 | S55 | S54 | S53 | S52 | S51 |

Fig. 9C

| S19 | S18 | S17 | S16 | S15 | S14 | S13 | S12 | S11 |
|-----|-----|-----|-----|-----|-----|-----|-----|-----|
| S29 | S28 | S27 | S26 | S25 | S24 | S23 | S22 | S21 |
| S39 | S38 | S37 | S36 | S35 | S34 | S33 | S32 | S31 |
| S49 | S48 | S47 | S46 | S45 | S44 | S43 | S42 | S41 |
| S59 | S58 | S57 | S56 | S55 | S54 | S53 | S52 | S51 |

*Fig. 10A*

| $S_{19}$ | $S_{18}$ | $S_{17}$ | $S_{16}$ | $S_{15}$ | $S_{14}$ | $S_{13}$ | $S_{12}$ | $S_{11}$ |
|---|---|---|---|---|---|---|---|---|
| $S_{29}$ | $S_{28}$ | $S_{27}$ | $S_{26}$ | $S_{25}$ | $S_{24}$ | $S_{23}$ | $S_{22}$ | $S_{21}$ |
| $S_{39}$ | $S_{38}$ | $S_{37}$ | $S_{36}$ | $S_{35}$ | $S_{34}$ | $S_{33}$ | $S_{32}$ | $S_{31}$ |
| $S_{49}$ | $S_{48}$ | $S_{47}$ | $S_{46}$ | $S_{45}$ | $S_{44}$ | $S_{43}$ | $S_{42}$ | $S_{41}$ |
| $S_{59}$ | $S_{58}$ | $S_{57}$ | $S_{56}$ | $S_{55}$ | $S_{54}$ | $S_{53}$ | $S_{52}$ | $S_{51}$ |

*Fig. 10B*

| $S_{19}$ | $S_{18}$ | $S_{17}$ | $S_{16}$ | $S_{15}$ | $S_{14}$ | $S_{13}$ | $S_{12}$ | $S_{11}$ |
|---|---|---|---|---|---|---|---|---|
| $S_{29}$ | $S_{28}$ | $S_{27}$ | $S_{26}$ | $S_{25}$ | $S_{24}$ | $S_{23}$ | $S_{22}$ | $S_{21}$ |
| $S_{39}$ | $S_{38}$ | $S_{37}$ | $S_{36}$ | $S_{35}$ | $S_{34}$ | $S_{33}$ | $S_{32}$ | $S_{31}$ |
| $S_{49}$ | $S_{48}$ | $S_{47}$ | $S_{46}$ | $S_{45}$ | $S_{44}$ | $S_{43}$ | $S_{42}$ | $S_{41}$ |
| $S_{59}$ | $S_{58}$ | $S_{57}$ | $S_{56}$ | $S_{55}$ | $S_{54}$ | $S_{53}$ | $S_{52}$ | $S_{51}$ |

*Fig. 10C*

| $S_{19}$ | $S_{18}$ | $S_{17}$ | $S_{16}$ | $S_{15}$ | $S_{14}$ | $S_{13}$ | $S_{12}$ | $S_{11}$ |
|---|---|---|---|---|---|---|---|---|
| $S_{29}$ | $S_{28}$ | $S_{27}$ | $S_{26}$ | $S_{25}$ | $S_{24}$ | $S_{23}$ | $S_{22}$ | $S_{21}$ |
| $S_{39}$ | $S_{38}$ | $S_{37}$ | $S_{36}$ | $S_{35}$ | $S_{34}$ | $S_{33}$ | $S_{32}$ | $S_{31}$ |
| $S_{49}$ | $S_{48}$ | $S_{47}$ | $S_{46}$ | $S_{45}$ | $S_{44}$ | $S_{43}$ | $S_{42}$ | $S_{41}$ |
| $S_{59}$ | $S_{58}$ | $S_{57}$ | $S_{56}$ | $S_{55}$ | $S_{54}$ | $S_{53}$ | $S_{52}$ | $S_{51}$ |

Fig. 11A

| $S_{19}$ | $S_{18}$ | $S_{17}$ | $S_{16}$ | $S_{15}$ | $S_{14}$ | $S_{13}$ | $S_{12}$ | $S_{11}$ |
|---|---|---|---|---|---|---|---|---|
| $S_{29}$ | $S_{28}$ | $S_{27}$ | $S_{26}$ | $S_{25}$ | $S_{24}$ | $S_{23}$ | $S_{22}$ | $S_{21}$ |
| $S_{39}$ | $S_{38}$ | $S_{37}$ | $S_{36}$ | $S_{35}$ | $S_{34}$ | $S_{33}$ | $S_{32}$ | $S_{31}$ |
| $S_{49}$ | $S_{48}$ | $S_{47}$ | $S_{46}$ | $S_{45}$ | $S_{44}$ | $S_{43}$ | $S_{42}$ | $S_{41}$ |
| $S_{59}$ | $S_{58}$ | $S_{57}$ | $S_{56}$ | $S_{55}$ | $S_{54}$ | $S_{53}$ | $S_{52}$ | $S_{51}$ |

Fig. 11B

| $S_{19}$ | $S_{18}$ | $S_{17}$ | $S_{16}$ | $S_{15}$ | $S_{14}$ | $S_{13}$ | $S_{12}$ | $S_{11}$ |
|---|---|---|---|---|---|---|---|---|
| $S_{29}$ | $S_{28}$ | $S_{27}$ | $S_{26}$ | $S_{25}$ | $S_{24}$ | $S_{23}$ | $S_{22}$ | $S_{21}$ |
| $S_{39}$ | $S_{38}$ | $S_{37}$ | $S_{36}$ | $S_{35}$ | $S_{34}$ | $S_{33}$ | $S_{32}$ | $S_{31}$ |
| $S_{49}$ | $S_{48}$ | $S_{47}$ | $S_{46}$ | $S_{45}$ | $S_{44}$ | $S_{43}$ | $S_{42}$ | $S_{41}$ |
| $S_{59}$ | $S_{58}$ | $S_{57}$ | $S_{56}$ | $S_{55}$ | $S_{54}$ | $S_{53}$ | $S_{52}$ | $S_{51}$ |

Fig. 11C

| $S_{19}$ | $S_{18}$ | $S_{17}$ | $S_{16}$ | $S_{15}$ | $S_{14}$ | $S_{13}$ | $S_{12}$ | $S_{11}$ |
|---|---|---|---|---|---|---|---|---|
| $S_{29}$ | $S_{28}$ | $S_{27}$ | $S_{26}$ | $S_{25}$ | $S_{24}$ | $S_{23}$ | $S_{22}$ | $S_{21}$ |
| $S_{39}$ | $S_{38}$ | $S_{37}$ | $S_{36}$ | $S_{35}$ | $S_{34}$ | $S_{33}$ | $S_{32}$ | $S_{31}$ |
| $S_{49}$ | $S_{48}$ | $S_{47}$ | $S_{46}$ | $S_{45}$ | $S_{44}$ | $S_{43}$ | $S_{42}$ | $S_{41}$ |
| $S_{59}$ | $S_{58}$ | $S_{57}$ | $S_{56}$ | $S_{55}$ | $S_{54}$ | $S_{53}$ | $S_{52}$ | $S_{51}$ |

Fig. 12A

| $S_{19}$ | $S_{18}$ | $S_{17}$ | $S_{16}$ | $S_{15}$ | $S_{14}$ | $S_{13}$ | $S_{12}$ | $S_{11}$ |
|---|---|---|---|---|---|---|---|---|
| $S_{29}$ | $S_{28}$ | $S_{27}$ | $S_{26}$ | $S_{25}$ | $S_{24}$ | $S_{23}$ | $S_{22}$ | $S_{21}$ |
| $S_{39}$ | $S_{38}$ | $S_{37}$ | $S_{36}$ | $S_{35}$ | $S_{34}$ | $S_{33}$ | $S_{32}$ | $S_{31}$ |
| $S_{49}$ | $S_{48}$ | $S_{47}$ | $S_{46}$ | $S_{45}$ | $S_{44}$ | $S_{43}$ | $S_{42}$ | $S_{41}$ |
| $S_{59}$ | $S_{58}$ | $S_{57}$ | $S_{56}$ | $S_{55}$ | $S_{54}$ | $S_{53}$ | $S_{52}$ | $S_{51}$ |

Fig. 12B

| $S_{19}$ | $S_{18}$ | $S_{17}$ | $S_{16}$ | $S_{15}$ | $S_{14}$ | $S_{13}$ | $S_{12}$ | $S_{11}$ |
|---|---|---|---|---|---|---|---|---|
| $S_{29}$ | $S_{28}$ | $S_{27}$ | $S_{26}$ | $S_{25}$ | $S_{24}$ | $S_{23}$ | $S_{22}$ | $S_{21}$ |
| $S_{39}$ | $S_{38}$ | $S_{37}$ | $S_{36}$ | $S_{35}$ | $S_{34}$ | $S_{33}$ | $S_{32}$ | $S_{31}$ |
| $S_{49}$ | $S_{48}$ | $S_{47}$ | $S_{46}$ | $S_{45}$ | $S_{44}$ | $S_{43}$ | $S_{42}$ | $S_{41}$ |
| $S_{59}$ | $S_{58}$ | $S_{57}$ | $S_{56}$ | $S_{55}$ | $S_{54}$ | $S_{53}$ | $S_{52}$ | $S_{51}$ |

Fig. 12C

| $S_{19}$ | $S_{18}$ | $S_{17}$ | $S_{16}$ | $S_{15}$ | $S_{14}$ | $S_{13}$ | $S_{12}$ | $S_{11}$ |
|---|---|---|---|---|---|---|---|---|
| $S_{29}$ | $S_{28}$ | $S_{27}$ | $S_{26}$ | $S_{25}$ | $S_{24}$ | $S_{23}$ | $S_{22}$ | $S_{21}$ |
| $S_{39}$ | $S_{38}$ | $S_{37}$ | $S_{36}$ | $S_{35}$ | $S_{34}$ | $S_{33}$ | $S_{32}$ | $S_{31}$ |
| $S_{49}$ | $S_{48}$ | $S_{47}$ | $S_{46}$ | $S_{45}$ | $S_{44}$ | $S_{43}$ | $S_{42}$ | $S_{41}$ |
| $S_{59}$ | $S_{58}$ | $S_{57}$ | $S_{56}$ | $S_{55}$ | $S_{54}$ | $S_{53}$ | $S_{52}$ | $S_{51}$ |

Fig. 20

EXPOSURE APPARATUS AND DEVICE MANUFACTURING METHOD

BACKGROUND OF THE INVENTION

1. Field of the Invention

The present invention relates to an exposure apparatus and a device manufacturing method. More particularly, the present invention relates to an exposure apparatus used to manufacture semiconductor devices and liquid crystal display devices in a lithographic process, and a device manufacturing method using the exposure apparatus.

2. Description of the Related Art

Conventionally, in a lithographic process to manufacture devices such as semiconductors and liquid crystal displays, projection exposure apparatus has been used to project and transfer a pattern formed on a mask or a reticle (to be generically referred to as a "reticle" hereinafter) onto a substrate such as a wafer or a glass plate (to be suitably referred to as a "substrate" or a "wafer" hereinafter) coated with a photo resist or the like. As an apparatus of this type, for example, in a manufacturing process for semiconductor devices, a static type (also referred to as a step-and-repeat type) exposure apparatus has been the mainstream. This exposure apparatus mounts a wafer as a substrate on a wafer stage, and after stepping the wafer stage by a predetermined amount XY in a two-dimensional direction, the reticle pattern is transferred onto a shot area on the substrate through an projection optical system. However, as the degree of integration increases in semiconductor devices and the circuit pattern becoming extremely fine, requirements for a higher resolution and exposure preciseness in the performance of exposure apparatus are also increasing. To meet these demands, in recent years, as an exposure apparatus employing a new method, the scanning type exposure apparatus based on a so-called step-and-scan method is becoming widely used. With this type of exposure apparatus, the wafer is illuminated with a slit-shaped illumination light through the reticle and the projection optical system. And along a direction perpendicular to the longitudinal direction of the illumination area of the illumination light, the reticle stage holding the reticle and the wafer stage holding the wafer are moved relatively with respect to the projection optical system, thus the reticle pattern being sequentially transferred onto the wafer.

With the scanning type exposure apparatus described above, when transferring the reticle pattern onto a shot area on the wafer, that is, on exposure, just before performing the exposure the positional information (focus information) of the wafer surface to the optical axis direction of the projection optical system is measured. The information is measured with a focus sensor at the exposure position (the shot area which is subject to exposure). And, scanning exposure is to be performed by positioning a sample holder (Z stage) holding the wafer which finely moves along the optical axis direction so that the surface of the shot area on the wafer coincides within the range of the depth of focus of the projection optical system.

With such a scanning type exposure apparatus, the focus information of the wafer just prior to exposure regarding shot areas excluding the circumferential shot areas of the wafer can be easily detected, therefore do not cause any problems. When exposing circumferential shot areas of the wafer, however, detecting focus information prior to exposure was often difficult, especially when an exposure area, conjugate with an illumination area of the reticle, was exposed with the relative scanning direction proceeding from the circumferential portion of the wafer to the center (the actual exposure is performed with the exposure area fixed and the wafer moving, however, the expressions above are used for the sake of convenience). In such a case, the Z stage movement lagged behind, thus, the reticle pattern was at times, transferred onto the shot area in a defocused state.

Meanwhile, in order to prevent the defocused state, a method is used in some cases where the scanning direction for the circumferential shot areas always proceed from the center of the wafer to the circumferential portion. However, in such a case, since the reticle and the wafer is always relatively scanned in a determined direction, the reticle stage and the wafer stage need to be restored to their original position. This naturally leads to a decrease in the throughput compared with when scanning exposure is performed alternately, to and fro, between one side of the scanning direction and the other side of the scanning direction.

Also, even if the circumferential shot areas were exposed with the scanning direction for the circumferential shot areas proceeding from the center of the wafer to the circumferential portion at all times, the detection points of the focus sensor did not entirely cover the wafer. Consequently, on some of the shot areas, the tilt of the wafer could not be adjusted, resulting at times in a pattern of a defocused state being transferred.

SUMMARY OF THE INVENTION

The present invention has been made in consideration of this situation, and has as its first object to provide an exposure apparatus that is capable of effectively suppressing the critical dimension variation by a macroscopic observation, which is caused by defocus during exposure.

It is the second object of the present invention to provide a device manufacturing method that can contribute to improving the productivity when microdevices with degree of high integration are produced.

With the scanning exposure apparatus, the substrate is relatively scanned with respect to the illumination area that is longitudinal in the non-scanning direction and transversal in the scanning direction. Therefore, in the case of any tilt error of the substrate surface in the scanning direction (pitching) to the image plane of the projection optical system, the contrast of the image transferred decreases, however, due to the averaging effect, defocus is suppressed at a moderate level. On the other hand, when there is a tilt error of the substrate surface in the non-scanning direction (rolling) to the image plane of the projection optical system, this directly becomes the cause of defocus. That is, the influence of the pitching and the rolling of the substrate on the exposure accuracy are not the same. The present invention has focused on this point, therefore has employed the following composition.

According to the first aspect of the present invention, there is provided a first exposure apparatus which relatively scans a mask and a substrate with respect to a projection optical system while the mask having a pattern formed is illuminated with an illumination light to transfer the pattern onto at least one shot area on the substrate via the substrate projection optical system, the exposure apparatus comprising: a focus detection system which detects positional information on the substrate surface in an optical axis direction of the projection optical system at a plurality of detection points; a selection unit capable to set a selection criteria and select detection points according to the selection criteria, the selection criteria including a first type detection point selection criteria to control a tilt of the substrate in a moving direction and a tilt of the substrate in a direction perpendicular to the moving direction, the moving direction being a first direction whereas the direction perpendicular being a second direction, and a second type detection point selection criteria to control the tilt of the substrate with priority on the second direction; and a substrate driving unit which controls a position of the substrate in the optical axis direction and a tilt with respect to a surface perpendicular to the optical axis to adjust a positional relationship between the substrate surface within an illumination area and an image plane of the projection optical system based on positional information of the substrate surface in an optical axis direction of the projection optical system at the detection points selected.

With this apparatus, when the first type detection point selection criteria is set, according to the selection criteria, the selection unit selects a plurality of detection points to control the tilt of the substrate in the first direction and in the second direction. The first direction in this case, is the substrate moving direction during scanning exposure, and the second direction is the direction perpendicular to the first direction. And when the second type detection point selection criteria is set, the priority of control is on the tilt of the substrate in the second direction, and thus the appropriate detection points are selected. On exposure, that is, when transferring the mask pattern onto the shot area on the substrate, the substrate driving unit controls the tilt of the substrate to the optical axis direction and the surface perpendicular to the optical axis. By this control, the positional relationship between the substrate surface within an illumination area and an image plane of the projection optical system is adjusted, based on positional information of the substrate surface in an optical axis direction of the projection optical system at the detection points selected. As a consequence, when the first type detection point selection criteria is set, on exposure, the position of the substrate in the optical axis direction, the tilt in the first direction (pitching), and the tilt in the second direction (rolling) are adjusted. By this adjustment, the illumination area on the substrate, which changes corresponding to the relative scanning of the mask and substrate, is always within a predetermined depth of focus of the image plane of the projection optical system. Also, in the case the second type detection point selection criteria is set on exposure, the position of the substrate in the optical axis direction and the tilt in the second direction (rolling) are adjusted. By this adjustment, the position in the optical axis direction and the tilt in the second direction (non-scanning direction) of the illumination area on the substrate, which changes corresponding to the relative scanning of the mask and substrate, is always within a permissive amount (within a range where an excessive amount of defocus does not occur). Accordingly, it becomes to possible to precisely adjust the position of the substrate surface in the optical axis direction as well as the rolling, which greatly affect defocus; therefore, it becomes possible to prevent the critical dimension variation by a macroscopic observation, which is caused by defocus on exposure. In this case, regardless of the type of detection point selection criteria set, that is, the first type or the second type, so long as the position of the substrate in the optical axis direction (Z) and the rolling, and in some cases the pitching can be adjusted, alternate scanning can be performed on the entire shot area on the substrate, including the circumferential portion, thus allowing extremely high throughput to be maintained.

In this case, as long as the selection unit chooses the detection points in accordance with the criteria described above, the selection unit may use any method, for example, the selection unit can perform selection of the detection points in accordance with a size of a shot area subject to exposure. In such a case, for example, it is preferable to select detection points in the shot area where the interval between the detection points is at a maximum width in the second direction (non-scanning direction) as detection points in the second direction on both sides. This consequently allows the rolling of the substrate to be precisely detected as much as possible.

With the first apparatus in the present invention, as described above, on selecting detection points of a shot area subject to exposure according to its size, for example, when the shot area subject to exposure is an outward shot, the selection unit can select the detection points located within an effective area of the substrate at a judgement position where a rear-edge of the illumination area coincides with a fore-edge on the shot area directly after starting exposure based on a shot map prepared in advance. In this description, the "fore-edge" is used to specify the side of edge in the scanning direction when the illumination area is relatively scanned with respect to the shot area, and the "rear-edge" refers to the edge opposite to the fore-edge.

In this description, an "outward shot" refers to a shot area where an axis extending in the non-scanning direction (the second direction) which passes through the center of the scanning direction (the first direction) of the substrate serves as a reference axis, and the illumination area is relatively scanned from the reference axis toward the circumferential portion of the substrate (in actual, the illumination area is fixed and the substrate moves, however, it is described as such for the sake of convenience).

With such an outward shot, by selecting the detection points within the effective area of the substrate at the judgement point, even if the shot area subject to exposure is a chipped shot, the most appropriate detection points can be selected to control the rolling of the substrate.

In this description, a "chipped shot" refers to a shot area other than a full shot. A "full shot" is a shot area that includes a first position (coinciding with the judgement position) where the edge (rear-edge) on the exposure area IA coincides with the edge (fore-edge) on the shot area directly after starting exposure. It also includes a second position where the edge (fore-edge) on the exposure area IA coincides with the edge (rear-edge) on the shot area. The full shot area is in between these positions, and the detection points that are within the width of the second direction (non-scanning direction) which interval between the points is maximum, are the detection points in the second direction. These basic detection points, in the case of a full shot, are all located within the effective area of the substrate.

The definition of the effective area of the substrate may vary, however, in this description, the "effective area of the substrate" refers to the inner area of the disable range (almost matches with inner portion of the area usually arranged on the circumferential portion of the wafer where a pattern cannot be transferred) that is set as; "edge bead remover width of the substrate +a margin around several mm".

Also, in the case of selecting the detection points based on the size of the shot area subject to exposure, for example, when the shot area subject to exposure is an inward shot, the selection unit can select the detection points located within an effective area of the substrate at a judgement position where a fore-edge of the illumination area coincides with a rear-edge on the shot area just before completing exposure based on a shot map prepared in advance.

In this description, an "inward shot" refers to a shot area where the direction of relative scanning of the illumination area to the substrate is opposite to the outward shot described above. That is, the illumination area is relatively scanned from the circumferential portion of the substrate toward the reference axis (in actual, the illumination area is fixed and the substrate moves, however, it is described as such for the sake of convenience).

With such an inward shot, by selecting the detection points within the effective area of the substrate at the judgement point, even if the shot area subject to exposure is a chipped shot, the most appropriate detection points can be selected to control the rolling of the substrate.

And, in the case of selecting the detection points based on the size of the shot area subject to exposure, for example, when the shot area subject to exposure is other than an inward shot and an outward shot, the selection unit can select the detection points located within an effective area of the substrate at a judgement position where the illumination area is located almost at a center in the first direction of the shot area subject to exposure based on a shot map prepared in advance.

With such a shot area, by selecting the detection points within the effective area of the substrate at the judgement point, even if the shot area subject to exposure is a chipped shot, the most appropriate detection points can be selected to control the rolling of the substrate.

With the first exposure apparatus according to the present invention, the selection unit may select the detection points to confirm detection results of the driving unit within the illumination area when the second type detection point selection criteria is set. In such a case, the selection unit selects the detection points that the driving unit uses for confirmation of control results within the illumination area on the substrate where the illumination light illuminates. Therefore, by using the detection results of the detecting points for confirmation, the control results of the position of the substrate in the optical axis direction and the tilt in the second direction can be accurately confirmed.

With the first exposure apparatus according to the present invention, when the second type detection point selection criteria is set, the substrate driving unit may control one of the position of the substrate in the optical axis direction, and a position of the optical axis direction and the tilt in the second direction. That is, the tilt of substrate in the first direction may not be controlled. In such a case, it becomes possible to precisely adjust the position of the substrate in the optical axis direction, and either the position in the optical axis position or the rolling, which greatly affect defocus; therefore, it becomes possible to prevent the critical dimension variation by a macroscopic observation, which is caused by defocus on exposure. In this case, so long as the position of the substrate in the optical axis direction and the rolling can be adjusted, alternate scanning can be performed on the entire shot area on the substrate, including the circumferential portion, thus allowing extremely high throughput to be maintained.

According to the second aspect of the present invention, there is provided a second exposure apparatus which relatively scans a mask and a substrate with respect to a projection optical system while the mask having a pattern formed is illuminated with an illumination light to transfer the pattern onto at least one shot area on the substrate via the projection optical system, the exposure apparatus comprising: a focus detection system that has detection points which are capable of detecting positional information on the substrate surface in an optical axis direction of the projection optical system; an adjustment system which adjusts a positional relationship between an image plane of the projection optical system and the substrate surface based on detection results of the focus detection system; and a switching system that switches an operation of the detection points of the focus detection system located within an illumination area between controlling the adjustment system and confirming results of the adjustment performed by the adjustment system.

With this apparatus, as necessary, the switching system switches the detection points of the focus detection system located within an illumination area between controlling the adjustment system and confirming the results of control performed by the adjustment system. For example, when the switching system switches the detection points arranged within the illumination area to control the adjustment system, the adjustment system adjusts the positional relationship between the image plane of the projection optical system and the substrate surface. This adjustment is performed in accordance with the positional information on the substrate surface in an optical axis direction of the projection optical system detected at increased points. Thus, focus leveling control is performed which target surface is the averaged substrate surface of the uneven surface of the entire shot area subject to exposure. And, when the switching system switches the detection points from the adjustment system to confirming the results of control, focus leveling control is performed with priority on the tilt of substrate in the second direction which is perpendicular to the first direction. The first direction, is the moving direction of the substrate during relative scanning.

In this case, for example, the switching system can switch the detection points of the focus detection system arranged within an illumination area according to a type of pattern of the mask to be transferred onto the shot area subject to exposure. Or, the switching system can switch the detection points of the focus detection system arranged within an illumination area depending on whether the shot area subject to exposure is located at the circumferential portion of the substrate. In the former case, when the pattern to be exposed on the shot area subject to exposure is a circuit pattern of a system LSI having a CPU and a memory pattern, the detection points arranged in the illumination area can be switched to confirm the results of control. And when the circuit pattern is a memory circuit, the detection points can be switched to control the adjustment system. In the latter case, when the surface of the substrate is moderately even as with the shot areas located in the internal portion of the substrate, the detection points arranged in the illumination area can be switched to control the adjustment system. And when the surface of the substrate is fairly rough as with the shot areas located in the peripheral portion of the substrate, the detection points arranged in the illumination area can be switched to confirm the results of control.

According to the third aspect of the present invention, there is provided a third exposure apparatus which relatively scans a mask and a substrate with respect to a projection optical system while the mask having a pattern formed is illuminated with an illumination light to transfer the pattern onto at least one shot area on the substrate via the projection optical system, the exposure apparatus comprising: a focus detection system that detects positional information on the substrate surface in an optical axis direction of the projection optical system which has detection points in a first row which is located before an illumination area of the illumination light, a second row which is located apart from the detection points in the first row in a moving direction of the substrate being a first direction during the relative scanning, and a third row which is located apart from the detection points in the second row in the first direction; a substrate driving system which drives the substrate in the optical axis direction and a tilt with respect to a surface perpendicular to the optical axis; a relative scanning unit which relatively scans the mask and the substrate with respect to the projection optical system; and a controller which controls the substrate driving system to adjust a positional relationship between an image plane of the projection optical system and the substrate surface based on detection results of the focus detection system, and the controller performs after relative scanning of the mask and the substrate is started by the relative scanning unit to transfer the pattern onto the shot area which is an inward and chipped shot, a first controlled state control which controls a position of the substrate in the optical axis direction by open control of the substrate driving system in accordance with detection results of the detection points in the first row when only the detection points come into an effective area of the substrate, a second controlled state control which controls the position of the substrate in the optical axis direction by closed control of the substrate driving system in accordance with detection results of the detection points only in the second row when the detection points come into the effective area of the substrate while the first controlled state control is performed, and a third controlled state control which controls the position of the substrate in the optical axis direction and a tilt in the first direction by closed control of the substrate driving system in accordance with detection results of the detection points in the first, second, and third row when the detection points in the third row come into the effective area of the substrate while the second controlled state control is performed.

With this apparatus, as soon as relative scanning of the mask and substrate starts with respect to the projection optical system to transfer a pattern onto an inward and chipped shot on the substrate, and the detection points only in the first row come into the effective area of the substrate, the main controller controls the substrate driving system by open control. By this open control, the position of the substrate in the optical axis direction is controlled, and thus the first state control is performed. That is, the substrate driving system is open controlled before the illumination area comes to the effective area of the substrate, therefore, the pre-exposing dynamic focusing of an inward shot can be accelerated. Also, while the substrate driving system is performing the pre-exposing dynamic focusing by open control, in addition to the detection points in the first row, when the detection points in the second row which are apart from the detection points in the first row in the first direction come into the effective area of the substrate, the main controller controls the substrate driving system by closed control based on the detection results of only the detection points in the second row. By this control, the position of the substrate in the optical axis direction is adjusted, thus the second state control is performed. That is, since the pre-exposing dynamic focusing is completed in the first state control, and the substrate driving system is then close-controlled based on the detection results of the detection points only in the second row, the focus can be controlled at high precision. The first direction, in this case, is the substrate moving direction on relative scanning.

Furthermore, while the focus is controlled by closed control, as soon as the detection points in the third row which are apart from the detection points in the second row on the opposite side of the detection points in the first row in the first direction come into the effective area of the substrate, the main controller controls the substrate driving system by closed control in accordance with the detection results of the detection points in the first, second, and third row. By this control, the position of the substrate in the optical axis direction and the tilt in the first direction is closed controlled, thus performing the third controlled state. That is, as soon as pitching control becomes possible, in addition to focus control, leveling (pitching) control in the first direction is performed. Accordingly, with the present invention, on exposing and inward and chipped shot, the position of the substrate in the optical axis direction, or, the tilt in the first direction (pitching) can further be precisely adjusted. Therefore, alternate scanning exposure can be performed on the entire shot area with the degree of contrast deterioration of the optical image due to pitching error suppressed at a minimum.

In this case, the controller may add a tilt in a second direction subject to open control when two of the detection points in the first row come into the effective area of the substrate, the second direction being a direction perpendicular to the first direction. In such a case, in addition to the pre-exposing dynamic focusing, the tilt of the substrate in the second direction (rolling), which is a cause of defocus, can also be brought to a proximate level.

In this case, the controller may change control of the tilt of the substrate in the second direction from open control to closed control in accordance with detection results of two of the detection points in the second row when the detection points come into the effective area of the substrate. In such a case, as soon as the pre-exposing dynamic focusing is completed and the rolling is brought to a proximate level, the position of the substrate in the optical axis direction and rolling can be closed controlled with high precision, thus can positively prevent defocus from occurring.

According to the fourth aspect of the present invention, there is provided a fourth exposure apparatus which relatively scans a mask and a substrate with respect to a projection optical system while the mask having a pattern formed is illuminated with an illumination light to transfer the pattern onto at least one shot area on the substrate via the projection optical system, the exposure apparatus comprising: a focus detection system that detects positional information on the substrate surface in an optical axis direction of the projection optical system which has detection points in a first row which is located before an illumination area of the illumination light, and a second row which is located apart from the detection points in the first row in a moving direction of the substrate being a first direction during the relative scanning; a substrate driving system which drives the substrate in the optical axis direction and a tilt with respect to a surface perpendicular to the optical axis; a relative scanning unit which relatively scans the mask and the substrate with respect to the projection optical system; and a controller which controls the substrate driving system to adjust a positional relationship between an image plane of the projection optical system and the substrate surface based on detection results of the focus detection system, and the controller performs after relative scanning of the mask and the substrate is started by the relative scanning unit to transfer the pattern onto the shot area which is an inward and chipped shot, a first controlled state control which controls the substrate in the optical axis direction and of a tilt in a second direction which is perpendicular to the first direction to at least adjust a position in the optical axis direction by closed control of the substrate driving system in accordance with detection results of the detection points in the first row and the second row, a second controlled state control which performs adjustment of one of the position of the substrate in the optical axis direction and of the tilt in the second direction to at least adjust the position in the optical axis direction by closed control of the substrate driving system in accordance with detection results of the detection points in the second row when the detection points of the first row come off the effective area of the substrate while the first controlled state control is performed, and a third controlled state control which locks the control when the detection points in the second row come off the effective area of the substrate while the second controlled state control is performed.

With this apparatus, as soon as relative scanning of the mask and substrate starts with respect to the projection optical system to transfer a pattern onto an outward and chipped shot on the substrate, the main controller controls the substrate driving system by closed control in accordance with the detection results of the detection points in the first row before the illumination area, the detection points in the second row which are apart from the detection points in the first row in the first direction being the substrate moving direction, and the detection results of other detection points. By this control, the first state control which adjusts at least the position of the substrate in the optical axis direction between the position of the substrate in the optical axis direction and the tilt in the second direction which is perpendicular to the first direction, is performed. That is, at least the focus is controlled, in consideration of the prereading data. Therefore, phase delay of the focus can be suppressed, and at least focus control of the substrate can be performed with high precision.

During such a first state control, when the detection points in the first row come off the effective area of the substrate, the main controller drives the substrate driving system by closed control based on the detection results of the detection points in the second row, within or close to the illumination area. By this control, at least the position of the substrate in the optical axis direction is adjusted, between the position of the substrate in the optical axis direction and the tilt in the second direction. And, while in this second controlled state, when the detection points in the second row come off the effective area of the substrate, follow-up control of the position of the substrate in the optical axis with high precision becomes difficult, therefore, the controller performs the third controlled state. This locks the control so as to allow control based on target values that are constant, or vary in a predetermined manner. Accordingly, with the fourth exposure apparatus of the present invention, on exposing and outward and chipped shot, at least the position of the substrate in the optical axis direction can be controlled with the highest precision possible. Therefore, alternate scanning exposure can be performed on the entire shot area with the deterioration of the optical image due to defocus suppressed to a minimum.

According to the fifth aspect of the present invention, there is provided a fifth exposure apparatus which relatively scans a mask and a substrate with respect to a projection optical system while the mask having a pattern formed is illuminated with an illumination light to transfer the pattern onto at least one shot area on the substrate via the projection optical system, the exposure apparatus comprising: a focus detection system that detects positional information on the substrate surface in an optical axis direction of the projection optical system which has detection points in a first row which is located before an illumination area of the illumination light, a second row which is located in the illumination area, and a third row which is located in the illumination area; a substrate driving system which drives the substrate in the optical axis direction and a tilt with respect to a surface perpendicular to the optical axis; a relative scanning unit which relatively scans the mask and the substrate with respect to the projection optical system; and a controller which controls the substrate driving system to adjust a positional relationship between an image plane of the projection optical system and the substrate surface based on detection results of the focus detection system, and the controller obtains a control error of the substrate driving system during relative scanning of the mask and the substrate by the relative scanning unit in accordance with detection results of the detection points in the first row and the second row at a first point where prereading of a distance between the detection points of the first row and the second row is performed, and the second row and the third row at a second point where an area of the substrate detected at the detection points of the first row comes to the detection points of the second row.

With this apparatus, while the relative scanning unit relatively scans the mask and the substrate, the controller obtains the control error of the substrate driving system. The control error is obtained according to the detection results of: the detection points in the first row located before the illumination area and the second row located within the illumination area at the first point where prereading of a distance between the detection points of the first row and the second row is performed; and the detection points in the second row and the third row at a second point where an area of the substrate detected at the detection points of the first row comes to the detection points of the second row. That is, when the controller secures no control delay in the substrate driving system, the detection results of the first row and second row at the first point serves as the detection results of the substrate driving system after the control has been preformed. If the distance between the detection points of the first and second row and the second and third row is equal, the difference between the detection results of the first and second row at the first point and the detection results of the detection points in the second row and the third row at a second point where an area of the substrate detected at the detection points of the first row comes to the detection points of the second row almost reflects the substrate driving amount from the first point to the second point. Accordingly, if the target value is constant, when the error to the target value at the first point is stored, the control error of the substrate driving system can be precisely obtained by simple calculation. This calculation is based on the detection results of the first and second row at the first point, the detection results of the second and third row at the second point, and the error to the target value at the first point. Therefore, the controller controls the substrate driving system according to the detection results of the focus detection system so that such control errors become zero, and thus the positional relationship between the image surface of the projection optical system and the substrate surface can be adjusted.

In this case, the control error may be obtained by the controller which stores a data of a difference between a target surface obtained by detection results of the detection points in the first, second, and third rows at the first point and the detection results of the first and second row, and compares the stored data with the detection results of the detection points in the second and third rows at the second point.

According to the sixth aspect of the present invention, there is provided a sixth exposure apparatus which relatively scans a mask and a substrate with respect to a projection optical system while the mask having a pattern formed is illuminated with an illumination light to transfer the pattern onto at least one shot area on the substrate via the projection optical system, the exposure apparatus comprising: a focus detection system which can detect positional information on the substrate surface in an optical axis direction of the projection optical system at a plurality of detection points; and a substrate driving unit which in accordance with the positional information of a selected plurality of detection points serving as control purposes among the plurality of detection points drives the substrate in the optical axis direction and in a tilt direction to a surface perpendicular to the optical axis to adjust a positional relationship between the substrate surface within an illumination area and an image plane of the projection optical system, and rotates the substrate which has a rotational axis extending in a first direction as center and passing through the barycenter of a second direction in an arrangement of the selected plurality of detection points serving as control purposes, to control a tilt in the second direction being perpendicular to a first direction being a direction of the relative scanning.

With this apparatus, the substrate driving unit adjusts the positional relationship between the substrate surface within the illumination area and the image plane of the projection optical system by driving the substrate in the optical axis direction and in a tilt direction to a surface perpendicular to the optical axis. This adjustment is performed in accordance with the positional information regarding the substrate surface in the optical axis direction of the projection optical system of a selected plurality of detection points serving as control purposes among the plurality of detection points. Also, the substrate driving unit controls the tilt in the second direction by rotating the substrate which has a rotational axis extending in the first direction as center and passing through the barycenter of the second direction in an arrangement of the selected plurality of detection points serving as control purposes. The first direction in this case, is the relative scanning direction, whereas the second direction is a direction perpendicular to a first direction. Therefore, even in the case detection points with an asymmetrical arrangement are selected, the tilt of the substrate in the second direction can be adjusted without affecting the adjustment of the position of the substrate in the optical axis direction. Accordingly, detection points that can most effectively control the tilt of the substrate in the second direction can be selected for control purposes. Thus, this makes it possible to precisely adjust the position of the substrate surface in the optical axis direction and the rolling, which greatly affect defocus; therefore, it becomes possible to effectively prevent the critical dimension variation by a macroscopic observation, which is caused by defocus on exposure.

In this case, the substrate driving unit can control a position of the substrate in the optical axis direction and the tilt in the second direction so as to prevent interference between the position of the substrate in the optical axis direction and the tilt in the second direction.

With the sixth exposure apparatus according to the present invention, the substrate driving unit can further control a tilt of the substrate in the first direction by making the substrate rotate around a predetermined axis parallel to the second direction.

In this case, the substrate driving unit preferably controls a position of the substrate in the optical axis direction and the tilt in the first direction so as to prevent interference between the position of the substrate in the optical axis direction and the tilt in the first direction.

In this case, the substrate driving unit can set a target value of the position of the substrate in the optical axis direction in consideration of a correction value to remove the interference between the position of the substrate in the optical axis direction and the tilt in the first direction.

According to the seventh aspect of the present invention, there is provided a seventh exposure apparatus which relatively scans a mask and a substrate with respect to a projection optical system while the mask having a pattern formed is illuminated with an illumination light to transfer the pattern onto at least one shot area on the substrate via the projection optical system, the exposure apparatus comprising: a focus detection system which can detect positional information on the substrate surface in an optical axis direction of the projection optical system at a plurality of detection points; and a substrate driving unit which in accordance with the positional information of a selected plurality of detection points among the plurality of detection points drives the substrate in the optical axis direction and in a tilt direction to a surface perpendicular to the optical axis to adjust a positional relationship between the substrate surface within an illumination area and an image plane of the projection optical system, and switches detection points to be used in accordance with progress of control during the relative scanning.

With this apparatus, the substrate driving unit drives the substrate in the optical axis direction and in a tilt direction to a surface perpendicular to the optical axis to adjust a positional relationship between the substrate surface within an illumination area and an image plane of the projection optical system. This adjustment is based on the positional information of a selected plurality of detection points among the plurality of detection points. Also, the substrate driving unit switches the detection points to be used in accordance with progress of control during the relative scanning of the mask and the substrate. So, for example, by switching the detection points to be used so that a more precise focus control or focus leveling control can be performed in accordance with the controlled status, focus control or focus leveling control with high precision can be achieved.

In this case, the plurality of detection points can be respectively arranged within the illumination area illuminated by the illumination light and away from the illumination area in a first direction, the first direction being a direction of relative scanning, and the substrate driving unit can switch detection points to be used from the detection points away from the illumination area which serve control purposes to the detection points arranged within the illumination area which serve confirmation purposes in accordance with progress of control during the relative scanning. In such a case, when an inward shot is subject to scanning exposure, for example, by selecting the detection points away from the illumination area until the pre-exposing dynamic focusing is completed, the pre-exposing dynamic focusing can be performed without any control delay. And after the pre-exposing dynamic focusing is completed, by selecting the detection points arranged within the illumination area which serve confirmation purposes, focus control or focus leveling control can be performed with high precision while confirming the results of control.

Furthermore, in the lithographic process, by performing exposure with the exposure apparatus in the present invention, exposure can be performed with high precision, without any critical dimension variation by a macroscopic observation due to defocus, thus allowing a multiple layer of patterns with high overlay accuracy to be formed on a substrate. Accordingly, with the present invention, from another aspect, there is provided a device manufacturing method that uses the exposure apparatus of the present invention.

BRIEF DESCRIPTION OF THE DRAWINGS

FIGS. 7A to 7C shows an example (first) of column shift of the basic type sensors set at type A;

FIGS. 8A to 8C shows an example (second) of column shift of the basic type sensors set at type A;

FIGS. 9A to 9C shows an example (third) of column shift of the basic type sensors set at set at type A;

FIGS. 10A to 10C shows an example (first) of a column shift of the basic type sensors set at type B;

FIGS. 11A to 11C shows an example (second) of a column shift of the basic type sensors set at type B;

FIGS. 12A to 12C shows an example (third) of a column shift of the basic type sensors set at type B;

FIG. 20 shows the exposure information (including focus sensors selection information) of the entire layout of the shot areas actually exposed on a display screen;

FIG. 35A and FIG. 32B are views to explain the switching of the focus sensors to be used during relative scanning when type B selection criteria is set and the scan is a minus scan;

DESCRIPTION OF THE PREFERRED EMBODIMENTS

First Embodiment

The first embodiment of the present invention will be described below with reference to FIGS. 1 to 19.

Figure 1:
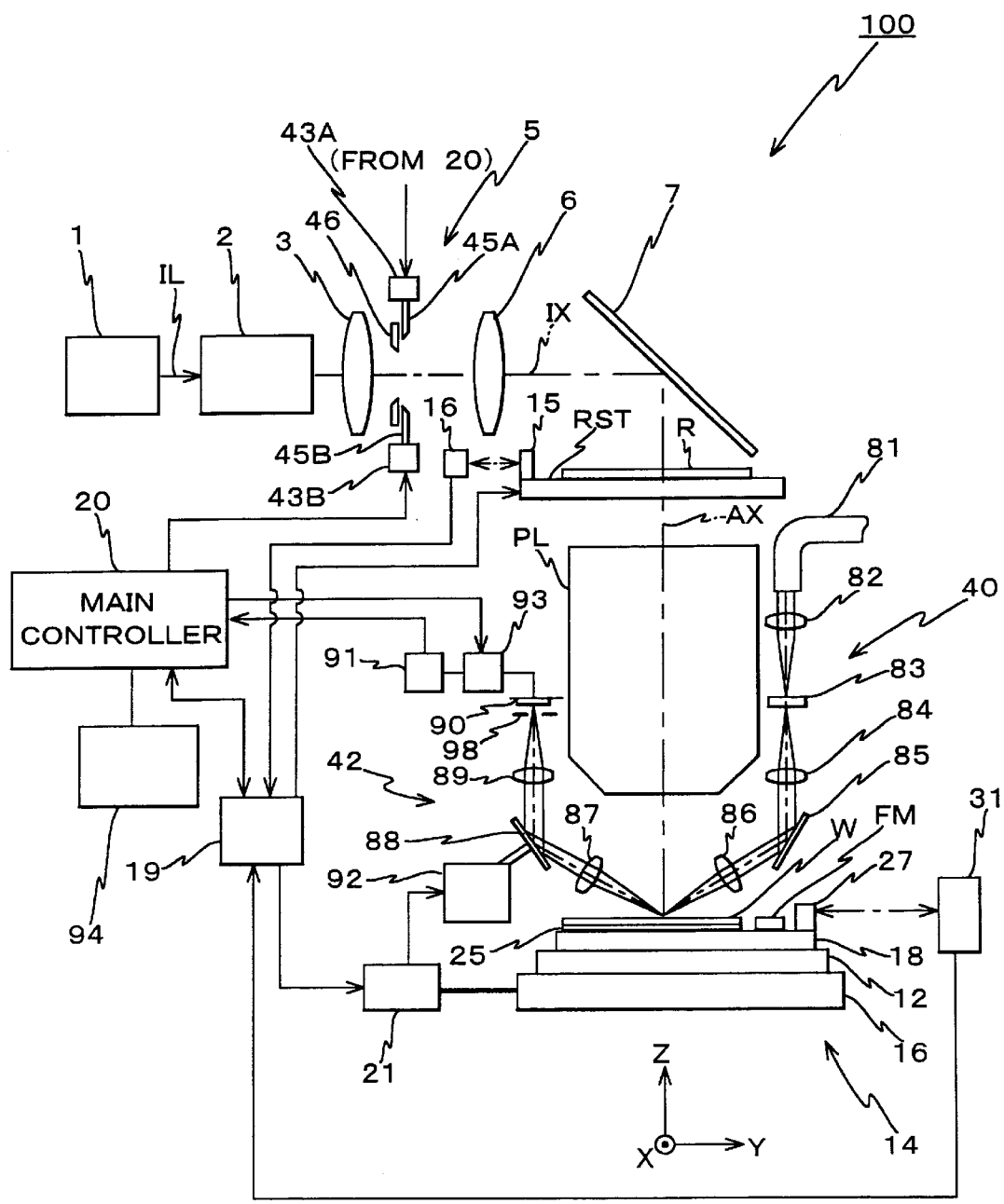
FIG. 1 is a schematic view showing the structure of a scanning exposure apparatus related to the first embodiment.

FIG. 1 shows the schematic arrangement of an exposure apparatus 100 according to the first embodiment. The exposure apparatus 100 is a projection exposure apparatus based on a step-and-scan method.

The exposure apparatus 100 comprises: an illumination system including a light source 1 and an illumination optical system (2, 3, 5–7); a reticle stage RST to hold a reticle R as a mask; a projection optical system PL; an X-Y stage 14 which has a substrate stage 18 holding a wafer W and moves within an X-Y plane; a control system for these components, and the like.

The illumination system includes: an illumination uniforming optical system 2 structured of the light source 1, a collimator lens, a fly-eye lens (none of them shown); a relay lens 3; a reticle blind 5; a relay lens 6 and a deflection mirror 7 (of these components, the illumination optical system is structured of the illumination uniforming optical system 2, the relay lens 3, the relay lens 6 and the deflection mirror 7), and the like.

The respective portions structuring the illumination system will now be described, along with its function. The illumination light IL, generated from the light source 1 as an exposure light, passes through the shutter (not shown in FIGS.), and then is converted to a light flux which has an almost uniform illumination distribution with the illumination uniforming optical system 2. As the illumination light IL, an excimer laser light such as an KrF excimer laser light or an ArF excimer laser light, a metal vapor laser or a harmonic generator of a YAG laser is used. Or, an emission line (g line or i line) in the ultraviolet range which is emitted by an ultra-high pressure mercury lamp, can also be used.

The light flux emitted horizontally from the illumination uniforming optical system 2, then proceeds to the reticle blind 5 via the relay lens 3. The reticle blind 5 has two movable blades 45A and 45B, that form a movable blind (hereinafter, the movable blind will be referred to as "movable blind 45A, 45B" as appropriate). It also has a fixed blind 46, which is arranged in the vicinity of the movable blind 45A and 45B, and has a fixed opening shape. The movable blind 45A and 45B are arranged on a surface conjugate with the pattern surface of the reticle R. The fixed blind 46, is a field stop which has, for example, a rectangular opening enclosed by four knife edges, and the width in the elongated direction is determined by the movable blind 45A and 45B. This allows the width of the slit-shaped illumination area IAR (refer to FIG. 2) which illuminates the reticle R, to be set at a desirable width. A movable blind driving mechanism 43A and 43B drives the movable blind 45A and 45B, in the direction that opens or closes the blinds. The operation of the movable blind driving mechanism 43A and 43B is controlled by a main controller 20, based on a masking information stored in a file in a memory (not shown in FIGS.) which is referred to as a processing program.

The light flux, having passed through the reticle blind 5, then passes through the relay lens 6, and reaches the deflection mirror 7. The light flux is deflected vertically downward at this point, and proceeds to irradiate the illumination area IAR of the reticle R where the circuit patterns and the like are formed.

On the reticle stage RST, the reticle R is fixed on the stage, for example, by vacuum chucking. The reticle stage RST is structured so that it can be finely driven two dimensionally (in the X direction and the Y direction which is perpendicular to the X direction, and in the rotational direction around the Z axis which is perpendicular to the XY plane) within a plane perpendicular to the optical axis IX (coinciding with the optical axis AX of the projection optical system, which will be described later) of the illumination optical system, so as to position the reticle R.

And the reticle stage RST is driven on a reticle base (not shown in FIGS.) by a reticle driving portion which is structured of a linear motor and the like, and can be scanned in a predetermined scanning direction (in this case, the Y direction) at a designated scanning velocity. The reticle stage RST has a movement stroke, which allows at least the entire surface of the reticle R to cross the optical axis IX of the illumination optical system.

On the reticle stage RST, a movable mirror 15 which reflects the laser beam from a reticle laser interferometer (hereinafter referred to as a "reticle interferometer") 16 is fixed. The position of the reticle stage RST within the surface that the stage moves, is detected at all times with the reticle interferometer 16, by for example, a resolution of around 0.5 to 1 nm. In actual, however, on the reticle stage RST, a movable mirror which has a reflecting surface perpendicular to the scanning direction (Y direction) and a movable mirror which has a reflecting surface perpendicular to the non-scanning direction (X direction) are arranged. And the reticle interferometer 16 is actually arranged on one axis in the scanning direction and on two axes in the non-scanning direction. However, in FIG. 1, these are representatively shown as movable mirror 15 and reticle interferometer 16.

The positional information of the reticle stage RST from the reticle interferometer 16 is sent to the main controller 20 via a stage control system 19. The reticle stage RST is then driven by the stage control system 19 through the reticle driving portion (omitted in FIGS.), according to instructions from the main controller 20 based on the positional information of the reticle stage RST.

The initial position of the reticle stage RST is determined so that the reticle R is accurately positioned at a predetermined reference position by a reticle alignment system (not shown in FIGS.). Therefore, the position of the reticle R can be measured with a sufficiently high accuracy, only by measuring the position of the movable mirror 15 with the reticle interferometer 16.

The projection optical system PL is arranged below the reticle stage RST as in FIG. 1. The optical axis AX (which coincides with the optical axis IX of the illumination optical system) of the projection optical system, is referred to as the Z direction. The projection optical system, in this embodiment, is a double telecentric reduction optical system, and a refraction optical system having a plurality of lens elements is employed. The projection magnification of the projection optical system is, for example, ¼, ⅕ or ⅙. So, when the illumination area IAR of the reticle R is illuminated by the illumination light IL from the illumination optical system, the illumination light IL forms a reduced image (a partially inverted image) of the circuit pattern of the illumination area IAR on the reticle R via the projection optical system onto the wafer W surface which is coated with a photoresist.

The XY stage 14 has an Y stage 16 that reciprocally moves on the base (not shown in FIGS.) in the Y direction (the horizontal direction in FIG. 1), which is the scanning direction. It also has an X stage 12 that reciprocally moves on the Y stage 16 in the X direction (perpendicular to the surface of FIG. 1) which is perpendicular to the Y direction, and a substrate table 18 which is arranged on the X stage 12. And on the substrate table 18, a wafer holder 25 is mounted, and the wafer W as a substrate is fixed on the wafer holder 24 by vacuum chucking.

The substrate table 18 is attached on the X stage 12 positioned in the XY direction, and is tiltable and movable in the Z axis direction. The substrate table 18 is supported at three supporting points of three axes (not shown in FIGS.). These three axes are driven independently in the Z axis direction, so as to control the wafer W held on the substrate holder 18 to set the surface position (the position in the Z axis direction and the tilt with respect to the XY plane) of the wafer w at a desired state. The driving amount of the three axes is respectively detected with encoders (not shown in FIGS.), and the detection results of the encoders are sent to the main controller 20.

On the substrate table 18, a movable mirror 27 to reflect the laser beam from a wafer laser interferometer (hereinafter referred to as a "wafer interferometer") 31 is fixed. And the position of the substrate table 18 within the XY plane is detected at all times at, for example, a resolution of around 0.5 to 1 nm by the wafer interferometer 31 that is externally arranged.

In actual, however, on the substrate table 18, a movable mirror which has a reflecting surface perpendicular to the scanning direction being the Y direction and a movable mirror which has a reflecting surface perpendicular to the non-scanning direction being the X direction are arranged. And the wafer interferometer 31 is actually arranged on one axis in the scanning direction and on two axes in the non-scanning direction. However, in FIG. 1, these are representatively shown as movable mirror 27 and reticle interferometer 31. The positional information of the substrate table 18 (or velocity information) is sent to the main controller 20 via the stage control system 19. And the stage control system 19 controls the Y stage 16 and X stage 12 in accordance with instructions from the main controller 20 based on the positional information (or velocity information) via a wafer driving unit 21 (the wafer driving unit 21 includes all the driving systems, of the X stage 12 and Y stage 16, and of the substrate table 18).

Also, on the substrate table 18, a reference mark plate FM having various types of reference marks formed is fixed. These reference marks are used for base line measurement, which measures the distance between the detection center of the alignment detection system using the off-axis method (not shown in FIGS.) and the optical axis of the projection optical system.

Figure 2:
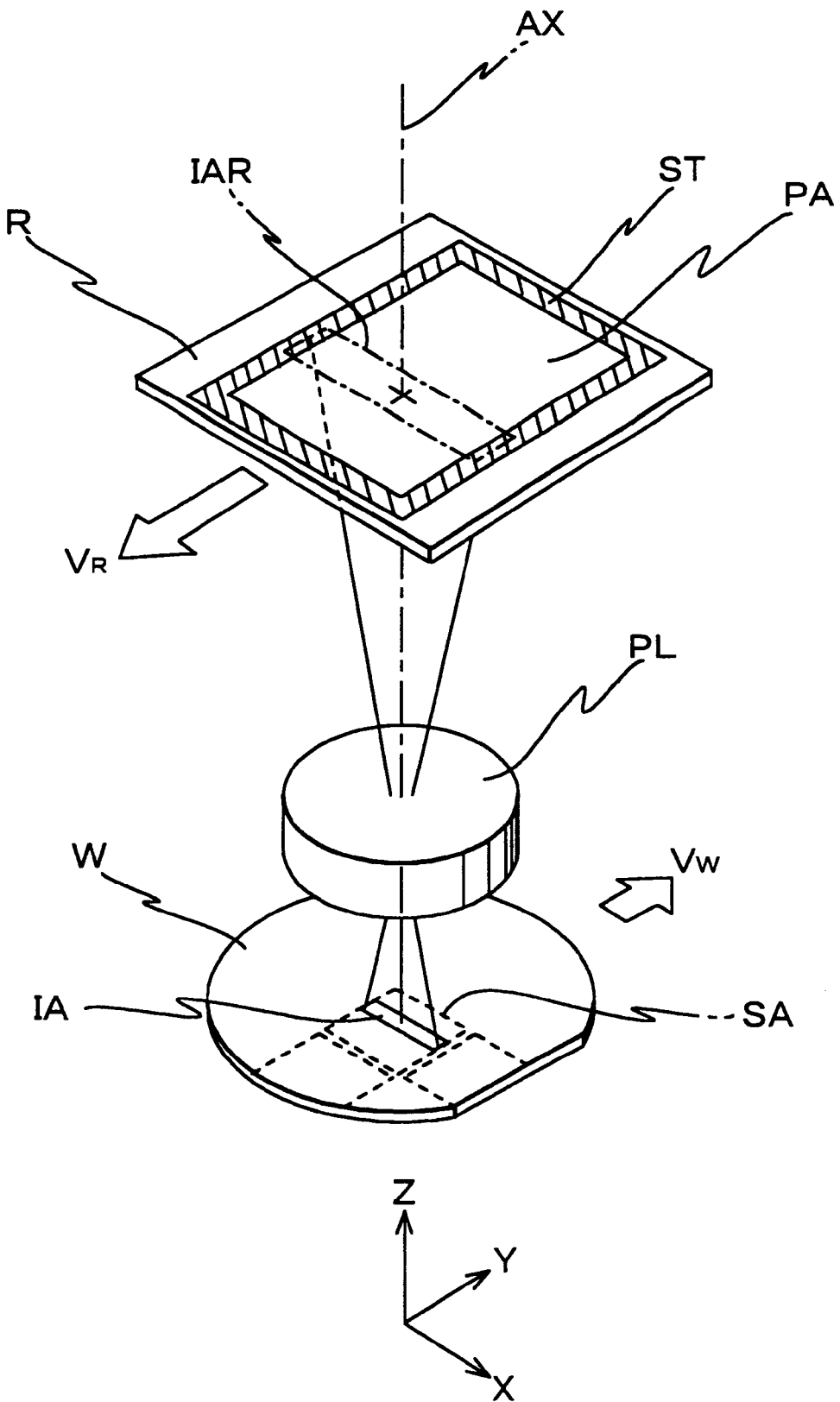
FIG. 2 is a view to explain the principle of scanning exposure of the apparatus in FIG. 1.

With the exposure apparatus 100 in this embodiment, as shown in FIG. 2, the reticle R is illuminated with the illumination area IAR that has a rectangular (slit-like) shape which longitudinal direction is perpendicular to the scanning direction (Y direction) of the reticle R. The reticle R is scanned in the −Y direction (or the +Y direction) at a velocity VR on exposure. The illumination area IAR (which center almost matches the optical axis AX) is projected on the wafer W via the projection optical system PL and on the wafer W, a slit-shaped projection area conjugate with the illumination area IAR is formed on the reticle R. That is, an illumination area (hereinafter referred to as an exposure area to distinguish it from the illumination area IAR) IA is formed on the substrate. The wafer W has an inverted image forming relationship with the reticle R. Accordingly, the wafer W is scanned in the +Y direction (or the −Y direction) that is the opposite direction of the velocity $V_R$, synchronously with the reticle R at a velocity $V_w$, which allows the entire surface of the shot area SA to be exposed. The velocity ratio $V_w/V_R$ during exposure accurately corresponds to the reduction magnification of the projection optical system, and the pattern in the pattern area PA on the reticle R is accurately reduced and transferred onto the shot area SA on the wafer W. The width of the illumination area IAR in the longitudinal direction is set to be wider than the pattern area PA on the reticle R, and narrower than the maximum width of the shielding area AT, and by scanning operation the entire surface of the pattern area PA is illuminated. That is, in this embodiment, while illuminating the reticle R with the illumination light IL, the reticle R and the wafer W is relatively scanned with respect to the projection optical system PL. And as a consequence, the pattern formed on the reticle R is transferred onto each shot area on the wafer W via the projection optical system PL.

With the exposure apparatus 100, when scanning exposure is performed, the main controller 20 performs alignment of the reticle R and the wafer W via the stage control system 19 and wafer driving unit 21 based on the detection signals of the alignment detection system (not shown in FIGS.). Also, based on the detection signals of the multiple focal position detection system which will later be described, the main controller 20 drives and controls the substrate table 18 in the Z axis direction and in the inclined direction via the stage control system 19 and the wafer driving unit 21, to adjust the surface position of the substrate table 18 (setting the merging surface). By this control, the pattern surface of the reticle R and the surface of the wafer W is made conjugate with respect to the projection optical system PL, and the image forming surface of the projection optical system PL is made to coincide with the surface of the wafer W (the wafer surface falls within the range of the depth of focus of the best image plane of the projection optical system PL).

With the exposure apparatus 100 in this embodiment, by repeatedly performing scanning exposure to transfer a reticle pattern onto a shot area on the wafer W and stepping operation to move to the starting position of the next shot area, exposure based on the step and scan method is performed. Thus, the reticle pattern is sequentially transferred onto all the shot areas on the wafer W.

Furthermore, in this embodiment, a multiple focal position detection system is employed which is one of a focus detection system (focal point detection system) based on an oblique incident light method. This system is used to detect the position of the area within the exposure area IA on the surface of the wafer W and the adjacent area in the Z direction (the optical axis AX direction). The multiple focal position detection system, as shown in FIG. 1, is structured of: an optical fiber bundle 81; a condenser lens 82; a pattern forming plate 83; a lens 84; an irradiation optical system 40 consisting of a mirror 85 and an irradiation objective lens 86; a condenser objective lens 87; a rotational direction vibration plate 88; an image forming lens 89; a light receiving optical system 42 consisting of a light receiving slit plate 98 and a light receiving unit 90 having many photosensors.

The respective portions structuring the multiple focal position detection system (40, 42) and its function will now be described. An illumination light, which has a different wavelength compared to the exposure light and to which wafer W coated with photoresist has a low sensibility, is guided through the optical fiber bundle 81 from an illumination light source (not shown in FIGS.). The illumination light emitted from the optical fiber bundle 81 proceeds through the condenser lens 82 and illuminates the pattern forming plate 83.

On the pattern forming plate 83, 45 slit-shaped aperture patterns are formed in the shape of a matrix having 5 rows and 9 columns. The illumination light which passes through each aperture pattern on the pattern forming plate 83 (an image light flux of the aperture pattern), passes through the lens 84, the mirror 85 and the irradiation objective lens 86. The illumination light is then projected on the exposure area on the wafer W forming a 5 by 9, that is, a total of 45 slit-shaped aperture pattern images of the pattern forming plate 83 on the exposure area on the wafer W. In actual, the light flux of the aperture pattern image from the irradiation optical system 40 is irradiated onto the surface of the wafer W (or onto the surface of the reference mark plate FM) from a direction tilted by a predetermined angle α with respect to the optical axis AX within a plane having an angle of 45° degrees to the YZ and XZ planes.

Figure 3:
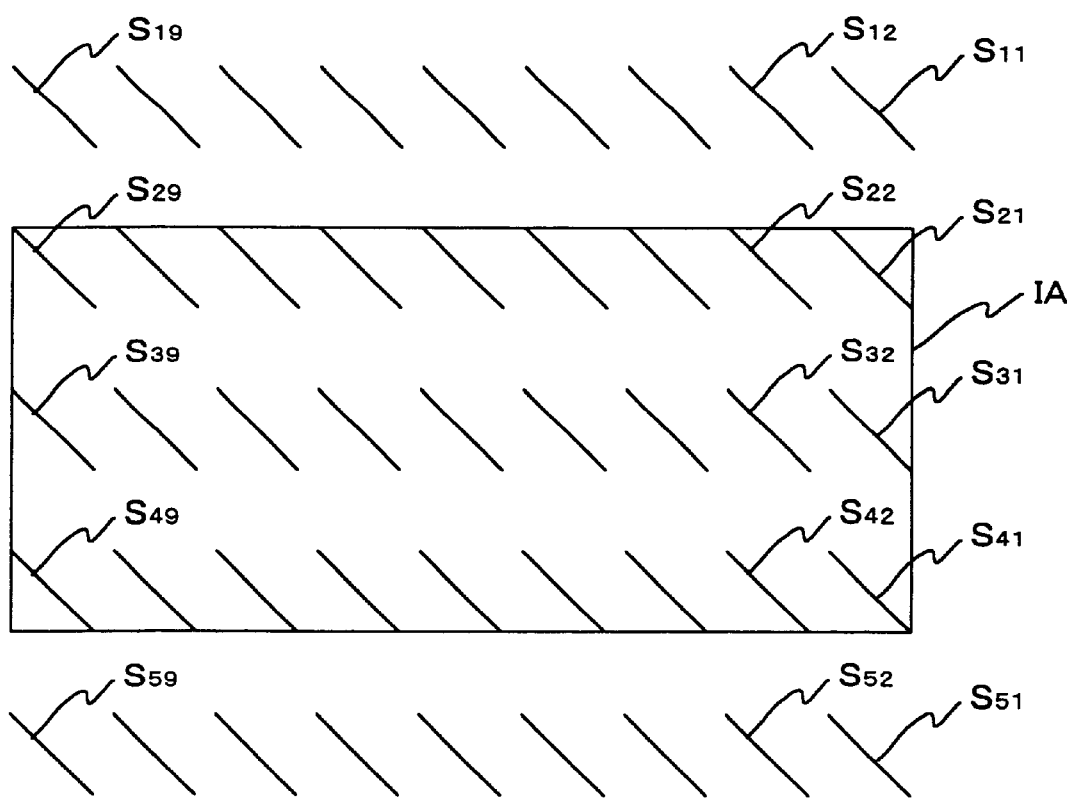
FIG. 3 is a view showing a positional relationship between the arrangement of the slit images (focus sensors) which are the respective detection points of the multiple focal position detection system related to the first embodiment in FIG. 1 and the exposure area.

Therefore, close to the rectangular shaped exposure area IA on a predetermined area AS (for example, AS: 25 mm ×around 10 mm) on the surface of the wafer W, as shown in FIG. 3, aperture pattern images in the shape of slits (hereinafter referred to as "slit images" as appropriate) are formed. These slit images $S_{11}$–$S_{59}$ are in the shape of a 5 row 9 column matrix, and a 5 by 9, that is, a total of 45 slit images are formed tilted by an angle of 45° degrees with respect to the X axis and Y axis. And they are arranged with, for example, a 2.9 mm interval in the X direction and a 4 mm interval in the Y direction. The reflected light flux on the wafer W of the light flux of these slit images $S_{11}$–$S_{59}$ proceed in the direction symmetrical to the light flux from the irradiation optical system 40 tilted at a predetermined angle α with respect to the optical axis AX. It then passes through the condenser objective lens 87, the rotational direction vibration plate 88 and the image forming lens, and then is re-imaged on the light receiving slit plate 98 which is arranged just before the light receiving unit 90.

More particularly, on the light receiving unit 90, 45 photosensors (hereinafter referred to as photosensors $D_{11}$–$D_{59}$) which correspond to the slit images $S_{11}$–$S_{59}$ have an arrangement of a 5 row 9 column matrix. And on the light receiving slit plate 98 arranged in front of the light receiving unit 90 (the lower area in FIG. 1), slits facing the respective photosensers are formed, and on these slits, the slit images $S_{11}$–$S_{59}$ are respectively re-imaged, as shown in FIG. 3.

The main controller 20 incorporates an oscillator which send driving signals to the main controller 20. The main controller 20 provides a predetermined vibration to the rotational direction vibration plate 88 via the vibrating unit 92, being driven by the driving signals from the oscillator. When the vibration is provided, on the light receiving slit plate 98 the positions of the respective images re-imaged vibrate in a predetermined direction (in a direction perpendicular to the longitudinal direction of each slit on the light receiving slit plate 98). By this operation, the detection signals of the respective photosensors $D_{11}$–$D_{59}$ are synchronously detected with the signals of the rotational vibration frequency, by a signal processing unit 91 via a selection unit 93. And a multiple of focus signals obtained by synchronous detection of the signal processing unit 91 is supplied to the main controller 20. As for the selection unit 93 and the signal processing unit 91, they will be described later on. Also, a plane-parallel plate can be arranged in between the image forming lens 89 and the light receiving slit plate 98. The plane-parallel plate shifts the relationship between the slits on the light receiving slit plate 98 and the center of vibration of the reflected slit image off the wafer W in the direction perpendicular to the longitudinal direction of the respective slits on the light receiving slit plate 98.

As is obvious from the description above, in this embodiment, the respective slit images $S_{11}$–$S_{59}$, which are detection points on the wafer W, each correspond to the respective photosensors $D_{11}$–$D_{59}$ of the light receiving unit 90. The Z axis positional information (focus information) of the surface of the wafer W at each slit image position can therefore be obtained according to the focus signal which is the output of each photosensor D. So, for the sake of convenience, the slit images $S_{11}$–$S_{59}$ is hereinafter described as focus sensors, unless further reference is necessary.

The selection unit 93, has a structure including a microprocessor in this embodiment, and (photodiodes; in this embodiment) $D_{11}$, $D_{12}$, . . . $D_{59}$ to which a reverse bias is applied are connected to the selection unit 93 via a switched circuit (not shown in FIGS.). The signal processing unit 91 is also connected to the selection unit 93, via n output lines. In the following description, the number of output lines will be exemplified as n=9.

With the selection unit 93, in accordance with various criteria described as follows, any photosensors from $D_{11}$, $D_{12}$, . . . $D_{59}$ can be connected to a maximum of 9 output lines via a switched circuit. This closes the photoelectric conversion circuit of the photosensor including a portion of the output line, and an output signal of the photosensor (photocurrent corresponding to the intensity of light received by the photosensor D) is sent to the signal processing unit 91 via a preferred output line among the 9 output lines. That is, the selection unit 93 chooses a maximum of 9 photosensors out of 45. This, substantially is to choose a maximum of 9 focus sensors out of 45 focus sensors, in other words to choose the detection points to be used for focus leveling control of the wafer W and for confirming the controlled results.

The signal processing unit 91 comprises 9 signal processing circuits respectively connected to the nine output lines, and output circuits connected to the signal processing circuits. Each signal processing circuit contains a phase synchronous detecting circuit (PSD), and an alternating signal having the same phase as of the driving signal from the OSC. is sent to the PSD. And in each signal processing circuit, synchronous rectification (synchronous detection) of the signals from each output line is performed with the phase of the alternating signal as a reference to generate a focal position detection signal (focus signal) FS. The focal position detection signal FS corresponds to the Z axis direction position (focus position) at the position of each slit images $S_{11}$–$S_{59}$. And the focus signal FS generated from the signal processing circuit is digitally converted by the output circuit, and then sent to the main controller 20 as serial data.

Each focus signal FS is a so-called S-curve signal, and when the center of the slits of the light receiving slit plate 98 coincide with the center of vibration of the reflected slit image off the wafer W, the signal becomes null. When the wafer moves upward from the state, the signal moves to a positive level, and when the wafer moves downward, the signal becomes a negative level. Accordingly, when no offset is applied to the respective focus signals, the main controller 20 detects the height position of the wafer W (the position in the optical axis direction) where the respective focus signals are at a null level as each focusing point.

With the selection unit 93, a first type (hereinafter referred to as "type A") focus sensor selection criteria to control the tilt of the wafer W, and a second type (hereinafter referred to as "type B") focus sensor selection criteria can be set. With the type A focus sensor selection criteria, the tilt is controlled in the Y axis direction (a first direction) where the wafer W moves during the relative scanning, and in the X axis direction (a second direction) which is perpendicular to the Y axis direction. And with the type B focus sensor selection criteria, it has the priority on controlling the tilt in the X direction (rolling). The selection unit 93, according to the selection criteria set, chooses a maximum of 9 focus sensors out of 45 focus sensors used to control or confirm the results of control, as will be described later on.

The main controller 20 performs the setting of the focus sensor selection criteria (type A or type B) as described below. Alternatively, an operator can set the focus sensor selection criteria (type A or type B) via the input/output device 94 for each shot area on the wafer W, and the setting information can be sent from the main controller 20 to the selection unit 93.

The input/output device 94 in this embodiment comprises a keyboard, pointing devices such as a mouse, and CRT or LCD display monitors.

Next, the selection of focus sensors by the selection unit 93 is described, which is performed after the setting of the focus sensor selection criteria (type A or type B).

Basic type sensor selection

The basic type sensor selection is basically performed by automatic judgement in accordance with the data on shot size, which is sent from the main controller 20 to the selection unit 93. It is performed when the shot area subject to exposure is a full shot located within the wafer W.

The definition of the term "full shot" in this description has been referred to previously. To further describe this according to this embodiment, a full shot is a shot area that includes a first position where the edge on the exposure area IA coincides with the edge on the shot area directly after starting exposure. It also includes a second position where the edge on the exposure area IA coincides with the edge on the shot area. And in between these positions, all the basic type focus sensors selected as will be later described, based on the type A focus sensor selection criteria, are within the effective area of the wafer W.

In this case, the selection unit 93 judges whether the shot area subject to exposure (hereinafter referred to as "exposing shot area" as appropriate) is an outward shot area, an inward shot area, or is neither of the two. This judgement is based on a shot map (a map determining the exposure sequence of each shot area on the wafer W, including details such as the center coordinates of the shot, shot size, relationship between the shot area and the edge of the wafer, scanning direction (+/−)) set in advance and stored in the RAM of the main controller 20.

And when the exposing shot area is an outward shot area, the first position is to be the judgement position. In the case the exposure area IA is positioned at the first position, the focus sensors within the effective area of the wafer W are selected as will be described. And when the exposing shot area is an inward shot area, the selection unit 93 determines the second position as the judgement position. In the case the exposure are IA is positioned at this judgement position, the focus sensors within the effective area of the wafer W are selected as will be described. Also, when the exposing shot area is neither outward or inward, then when the exposure area IA is located almost at the center of the exposing shot area, the focus sensors within the effective area of the wafer W are selected as will be described.

The reason why the judgement position of the exposing shot areas are determined as described above, will be briefly described next.

Figure 4A:
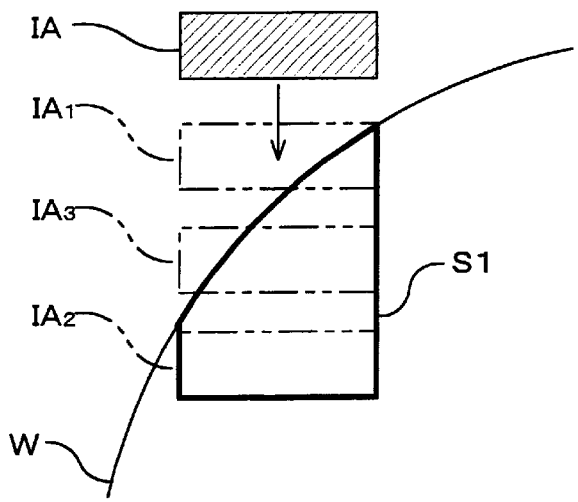
FIG. 4A, FIG. 4B, and FIG. 4C are views to explain the grounds of determining the judgement position which is the base of the focus sensor selection when exposing an inward shot, outward shot, and shots other than these shots.

For example, with the inward shot S1 shown in FIG. 4A, when the exposure area IA is positioned at the second position, the width of the exposure area IA and the effective area of the wafer W overlapping in the non-scanning direction can be set at a maximum (the width in the scanning direction is fixed). This is obvious, when comparing the cases when the exposure area IA is positioned at the first position having the reference $IA_1$, at the second position having the reference $IA_2$, and at the third position having the reference $IA_3$, in FIG. 4A. Accordingly, with the inward shot, by determining the second position as the judgement position even if the shot is a chipped shot area as with the shot area S1, the focus sensors within the effective area of the wafer W are selected when the exposure area IA is positioned at the judgement position. Thus, the most effective focus sensors to control the tilt of the wafer W in the non-scanning direction (rolling) can be selected.

Figure 4B:
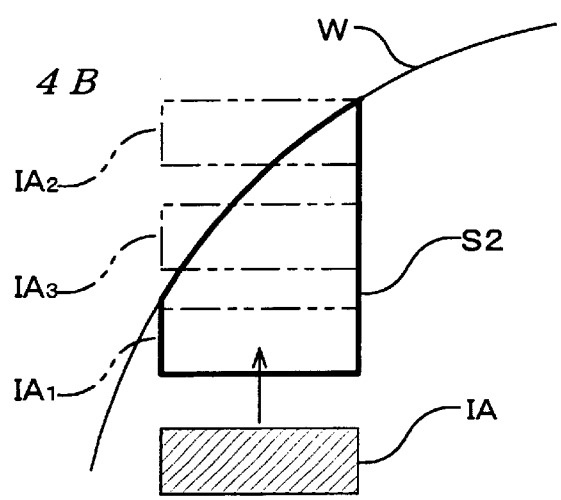

Also, with the outward shot S2 shown in FIG. 4B, when the exposure area IA is positioned at the first position, the width of the exposure area IA and the effective area of the wafer W overlapping in the non-scanning direction can be set at a maximum (the width in the scanning direction is fixed). This is obvious, when comparing the cases when the exposure area IA is positioned at the first position having the reference $IA_1$, at the second position having the reference $IA_2$, and at the third position having the reference $IA_3$, in FIG. 4B. Accordingly, with the outward shot, by determining the first position as the judgement position even if the shot is a chipped shot area as with the shot area S2, the focus sensors within the effective area of the wafer W are selected when the exposure area IA is positioned at the judgement position. Thus, the most effective focus sensors to control the tilt of the wafer W in the non-scanning direction (rolling) can be selected.

Figure 4C:
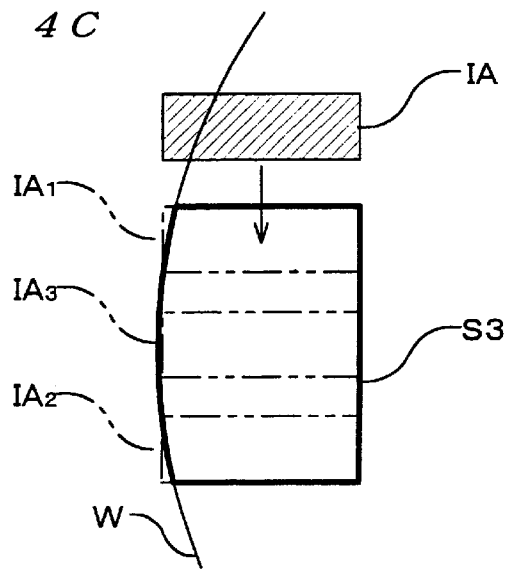

Furthermore, with the shot S3 shown in FIG. 4C, which is neither an outer shot or an inner shot, when the exposure area IA is positioned at the third position, the width of the exposure area IA and the effective area of the wafer W overlapping in the non-scanning direction can be set at a maximum (the width in the scanning direction is fixed). This is obvious, when comparing the cases when the exposure area IA is positioned at the first position having the reference $IA_1$, at the second position having the reference $IA_2$, and at the third position having the reference $IA_3$, in FIG. 4C. Accordingly, with these shots, by determining the third position as the judgement position, that is, the judgement position being when the exposure area IA is positioned almost at the center of the exposing shot area, the focus sensors within the effective area of the wafer W are selected when the exposure area IA is positioned at the judgement position. Thus, the most effective focus sensors to control the tilt of the wafer W in the non-scanning direction (rolling) can be selected.

Following is an example of the basic type sensor selection when performing exposure on a shot area having the size of 25 mm in the X direction.

Figure 5A:
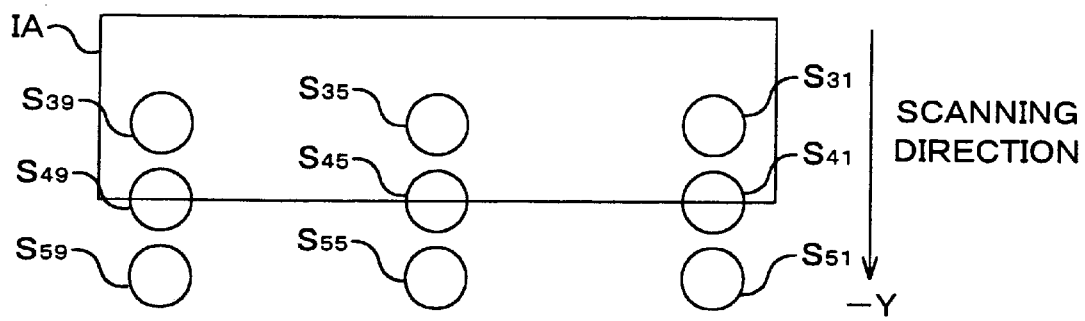
FIG. 5A and FIG. 5B shows the basic type sensors selection in the first embodiment when type A of the selection criteria is set.
Figure 5B:
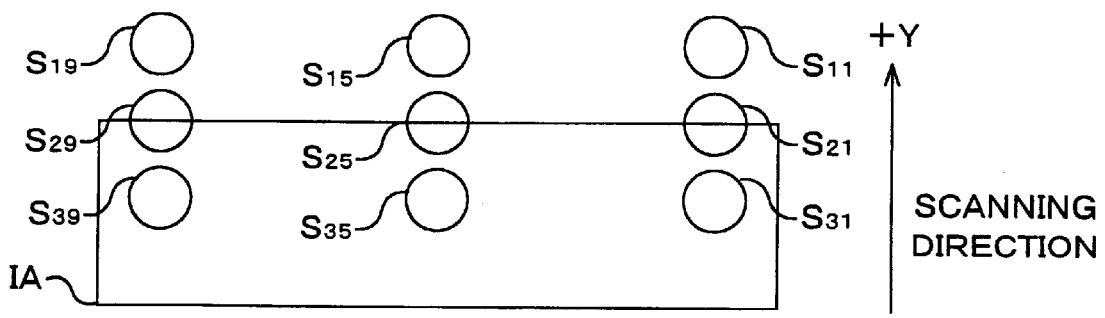

First, the focus sensor selection criteria is set at type A, and the exposure area IA and the group of focus sensors are relatively scanned in the −Y direction with respect to the wafer W. That is, when the wafer is scanned in the +Y direction which is a plus scan, the selection unit 93 selects a total of 9 focus sensors as shown in FIG. 5A: $S_{51}$, $S_{55}$ and $S_{59}$, located in front of the exposure area IA; and $S_{41}$, $S_{45}$, $S_{49}$, $S_{31}$, $S_{35}$ and $S_{39}$, located in the exposure area IA. Also, when the focus sensor selection criteria is set at type A, and the exposure area IA and the group of focus sensors are relatively scanned in the +Y direction with respect to the wafer W, that is, the wafer is scanned in the −Y direction which is a minus scan, the selection unit selects a total of 9 focus sensors as shown in FIG. 5B: $S_{11}$, $S_{15}$ and $S_{19}$, located in front of the exposure area IA; and $S_{21}$, $S_{25}$, $S_{29}$, $S_{31}$, $S_{35}$ and $S_{39}$, located in the exposure area IA.

In these cases, as can be seen from FIG. 5A and FIG. 5B, three sets of focus sensors are selected as focus sensors on both edges. These sensors fit within the range of the width in the X direction of the shot, and the interval between the sensors is at a maximum. Among the focus sensors selected, the focus sensors in the first row are used for prereading control, and focus sensors in the second and the third rows are used for follow-up control. Consequently, when the focus sensor selection criteria are set at type A, focus sensors capable of controlling position and posture in directions of three degrees of freedom are selected. In other words, focus sensors which can control the position of the wafer W with respect to the optical axis direction (Z axis direction) of the projection optical system PL, the tilt in the X axis direction (rolling) and the tilt in the Y axis direction (pitching) are selected.

Figure 6A:
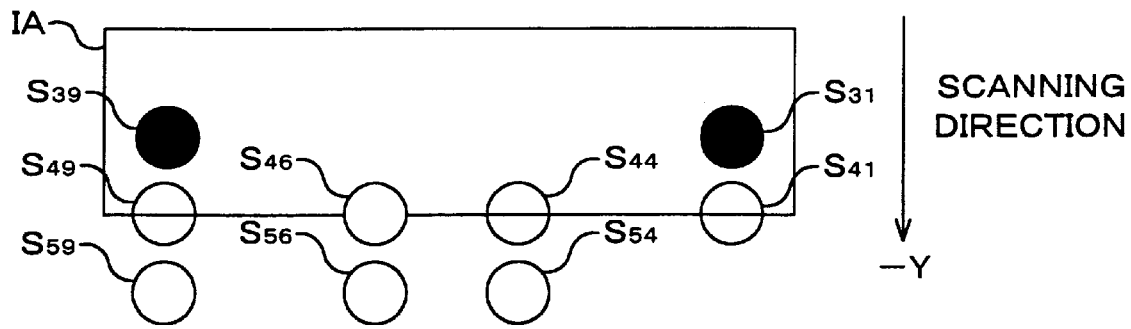
FIG. 6A and FIG. 6B shows the basic type sensors selection in the first embodiment when type B of the selection criteria is set.

On the other hand, when the focus sensor selection criteria is set at type B, in the case of plus scan, the selection unit 93 chooses a total of 9 focus sensors as shown in FIG. 6A: $S_{54}$, $S_{56}$ and $S_{59}$ (or $S_{51}$), located in front of the exposure area IA; and $S_{41}$, $S_{44}$, $S_{46}$, $S_{49}$, $S_{31}$ and $S_{39}$, located in the exposure area IA. The selection of the focus sensor $S_{59}$ or $S_{51}$, depends on the position of the shot area with respect to the central axis of the wafer W in the non-scanning direction (the X axis direction). The sensor to be used is determined by whether the shot area is positioned in the +X direction to the central axis, or in the −X direction.

Figure 6B:
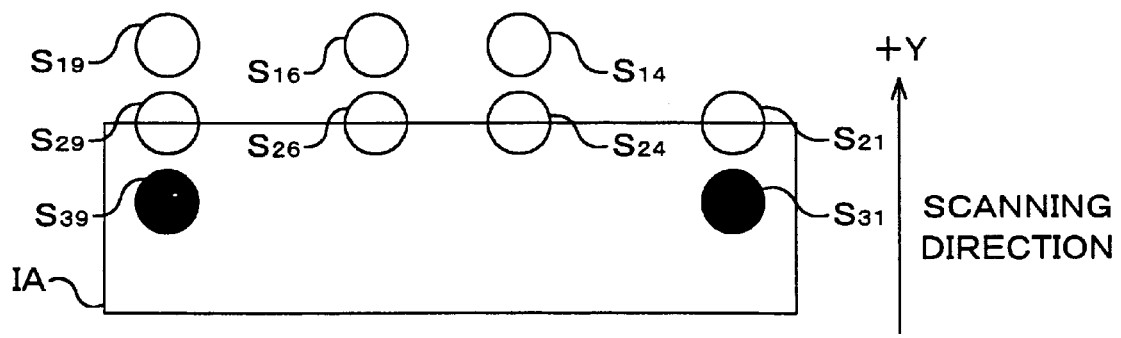

Also, in the case of minus scanning, the selection unit 93 chooses a total of 9 focus sensors as shown in FIG. 6B: $S_{14}$, $S_{16}$ and $S_{19}$ (or $S_{11}$), located in front of the exposure area IA; and $S_{21}$, $S_{24}$, $S_{26}$, $S_{29}$, $S_{31}$ and $S_{39}$, located in the exposure area IA. Likewise, in this case, the selection of the focus sensor $S_{19}$ or $S_{11}$, depends on the position of the shot area with respect to the central axis of the wafer W in the non-scanning direction (the X axis direction). The sensor to be used is determined by whether the shot area is positioned in the +X direction to the central axis, or in the −X direction.

The focus sensors in the first and second row of FIGS. 6A and 6B indicated by white circles (◯) are used for controlling, whereas the focus sensors in the third rows are used for confirming the controlled results. In the case the focus sensor selection criteria is set at type B, focus sensors capable of controlling position and posture in directions of two degrees of freedom are selected. In short, the sensors can control the position of the wafer W with respect to the optical axis direction (Z axis direction) of the projection optical system PL and the tilt in the X axis direction (rolling). Furthermore, as can be noted from FIGS. 6A and 6B as well as the description above, the focus sensors in the first row are sequentially arranged and radially extend from the inner portion of the wafer. They are aligned in the same column as of the focus sensors in the second row, and a maximum of three sensors can be selected.

In addition to the basic type sensor selection performed by automatic judgement in accordance with the shot size as described above, the operator or a user may manually select the desired basic type sensor via the input/output device 94. However, in this case, it is preferable for the apparatus to indicate an error message, when a selection is made where the performance of the apparatus is not sufficient.

Following is a description of the setting of the selection criteria of the basic type sensor performed by the main controller 20. As is obvious from the earlier descriptions, in this embodiment, based on the setting of the basic type sensor by the main controller 20, the selection unit 93 can switch the focus sensors from operating as the adjustment system (focus leveling control system) which controls the position of the wafer W in the Z direction and the tilt with respect to the XY plane, to confirming the controlled results. This switching can be performed on specific focus sensors arranged in the exposure area IA such as $S_{31}$ and $S_{39}$. That is, in this embodiment, the main controller 20 and the selection unit 93 structure a switching system.

For example, the switching system switches the specific sensors arranged in the exposure area IA to control the adjustment system. In other words, the selection unit 93 selects the basic type sensor, type A, based on the setting of the selection criteria of the basic type sensor set by the main controller 20 to type A. In this case, the adjustment system adjusts the positional relationship between the image surface of the projection optical system PL and the surface of the wafer in accordance with the positional information of the wafer surface with respect to the optical axis direction (the Z axis direction) of the projection optical system PL by the increased number of focus sensors. Thus, focus leveling control is performed, with the target surface to average the unevenness of the surface of the wafer W in the entire shot area subject to exposure. And, when the switching system switches the specific focus sensors arranged in the exposure area IA so that the controlled results of focus leveling can be confirmed, that is, the selection unit 93 selects the basic type sensor, type B, based on the setting of the selection criteria of the basic type sensor set by the main controller 20 to type B, focus leveling control is performed with priority on the tilt of the wafer in the non-scanning direction.

In this case, the main controller 20 can switch the operation of the focus sensor in accordance with, for example, the type of reticle pattern to be transferred onto the shot area subject to exposure. That is, the main controller 20 can set the selection criteria of the basic type sensor. For instance, if the pattern to be transferred onto the shot area subject to exposure is a LSI circuit pattern containing a CPU and a memory, the type B selection criteria is set, whereas if the circuit pattern is a memory pattern, then the type A selection criteria can be set.

The main controller 20 can also switch the operation of the focus sensor, or set the selection criteria of the basic type sensor based on whether the shot area subject to exposure is located in the circumferential portion on the wafer W. For example, for the shot areas located in the inner portion of the wafer W where the roughness (unevenness) of the surface is moderately level, the selection criteria of the basic sensors can be set to type A. On the other hand, for the shot areas in the circumferential portion where the roughness is considerably uneven, the selection criteria can be set to type B.

Next, the automatic shift of columns in the sensor arrangement (hereinafter referred to as "column shift") is described. The selection unit 93 performs the column shift, when shot areas to be exposed are chipped shots, that is, when exposure is performed on shot areas other than the full shot areas. As is obvious from the definition of full shot and chipped shot described above, in this embodiment a chipped shot area is a shot area lacking a portion to be exposed of the shot area. However, it also includes a shot area with the shot width in the non-scanning direction narrower than 25 mm, having a small rectangular shot area with a part of the focus sensors coming off the shot area.

When such chipped shots are to be exposed, the selection unit 93 performs the column shift based on the shot map and in accordance with the selection criteria of the focus sensor set (type A or type B).

Following is an example describing the details of column shift in the case of plus scan.

When the selection criteria for focus sensors is set to type A and the exposing shot area is a full shot, the selection unit 93 selects the basic sensors as shown in FIG. 7A. In the case where the exposing shot area is a chipped shot, depending on the lacking portion of the shot, column shift is performed as shown in FIGS. 7B, 7C, 8A, 8B, 8C, 9A, 9B, and 9C. And by this column shift, a maximum of 9 sensors is selected within the effective area of the wafer W at the respective judgement position.

As shown in the FIGS., when the selection criteria is set to type A, the selection unit 93 shifts the selected focus sensors arranged in the outer column (the left side column) to the inner column so that the maximum width in the X direction (non-scanning direction) is secured at the judgement position. When it is possible to select three columns of the focus sensors covering a chipped shot area, the middle column is the column in the center of the inner column and the shifted outer column (in the case the column number on both sides are even, the middle column is to be the column located on the outer column side). However, in the case the distance between the middle column and the inner column does not exceed the threshold value to detect the rolling with sufficient accuracy, the middle column can be set to so that the distance is secured. The shift, at a minimum, can be performed up to the first column, as shown in FIG. 9C.

When the selection criteria for focus sensors is set to type B and the exposing shot area is a full shot located in the −X side of the center of the non-scanning direction of the wafer W, the selection unit 93 selects the basic sensors as shown in FIG. 10A. In the case where the exposing shot area is a chipped shot, depending on the lacking portion of the shot, column shift is performed as shown in FIGS. 10B, 10C, 11A, 11B, 11C, 12A, 12B, and 12C. And by this column shift, a maximum of 9 sensors is selected within the effective area of the wafer W at the respective judgement position.

As is apparent from the FIGS., when the selection criteria is set to type B, the selection unit 93 shifts only the selected focus sensors arranged in the outer column (the left side column) to the inner column in accordance with the lacking portion of the shot. The focus sensor in the fourth column and sixth column are fixed, as long as they are located in the effective area of the wafer W. The shift, at a minimum, can be performed up to the first column, as shown in FIG. 12C.

Next, the focus leveling control which is performed when relatively scanning the reticle R and wafer W with respect to the projection optical system PL to transfer the reticle pattern onto each shot area, is described.

First, the case where the exposing shot area is a full shot is described. On exposing the full shot area, the main controller 20 sends instructions to the stage control system 19 to relatively scan the reticle R and wafer W along the Y axis direction with respect to the projection optical system PL via the reticle stage RST and the Y stage 16 (and the substrate table 18). Immediately before the respective stages reach the target scanning velocity or immediately after they move into a synchronously isokinetic state, the main controller 20 drives and controls the Z direction and tilt direction of the substrate table 18 via the stage control system 19 and wafer driving unit 21 based on all the detection values of the focus sensors selected by the selection unit 93. The surface position of the substrate table 18 is thus adjusted (focus leveling control) and the fore-edge positioning (positioning the edge on the exposure area IA so that it coincides with the edge on the shot area) is performed. And in the following scanning exposure, when type A is selected in the basic sensor selection by the selection unit 93, Z control and leveling control (rolling control and pitching control) are performed by encoder closed loop control (described later), based on all the detection values of the selected focus sensors. Meanwhile, when type B is selected in the basic sensor selection, Z control and leveling control (rolling control and pitching control) are performed in accordance with the detection values of the selected focus sensors in the second column during scanning exposure.

The control system to drive and control the substrate table 18 in this embodiment will be described next.

Figure 13A:
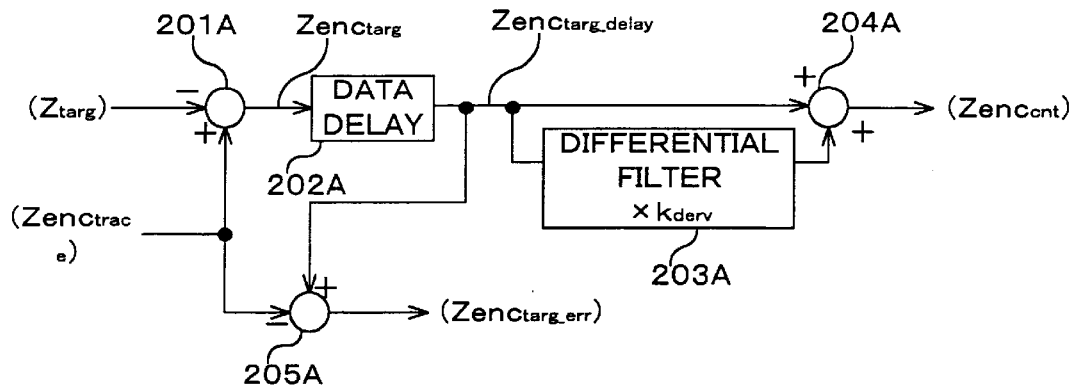
FIGS. 13A to 13C are block diagrams showing the function of each control system, to drive the substrate table in the Z direction, to control rolling (tilt in the non-scanning direction), and to control pitching (tilt in the scanning direction)
Figure 13B:
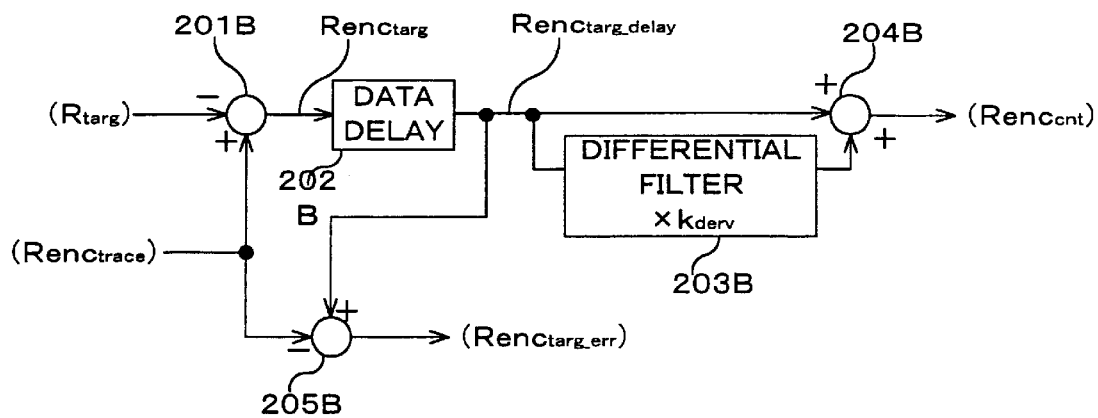
Figure 13C:
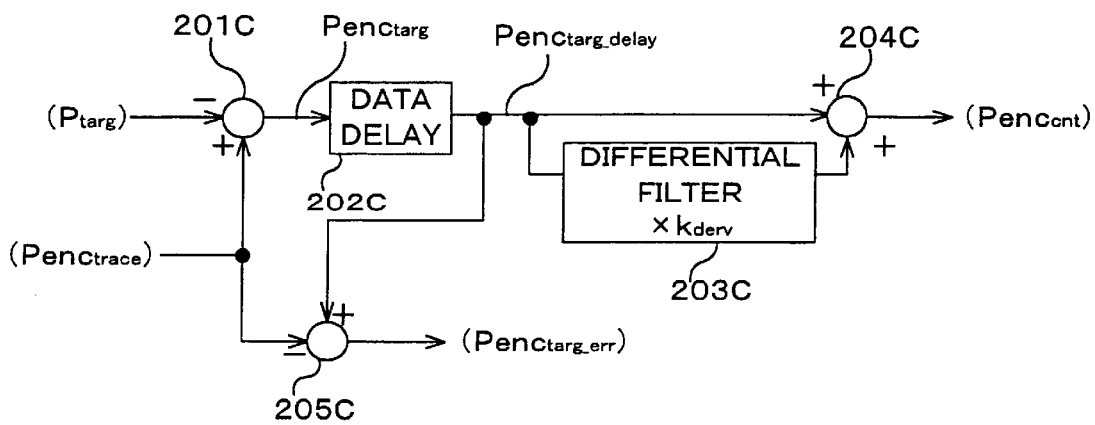

FIGS. 13A, 13B, and 13C, are block diagrams to respectively show the function of: the control system for Z driving; the control system for rolling (tilt in the non-scanning direction; and the control system for pitching (tilt in the scanning direction), of the substrate table 18. These control systems are actually operated by a software program installed in the main controller 20; however, for the sake of convenience each function block will be described as hardware.

The control system in FIG. 13A calculates the Z encoder target value $Zenc_{targ}$ with the subtracter 201A. The encoder target value $Zenc_{targ}$ is the deviation between the Z axis direction position error $Z_{targ}$ of the substrate table 18 (wafer W) obtained from the detection results of the multiple focal position detection system (40, 42) and the encoder output value $Zenc_{trace}$. The control system uses the Z encoder target value $Zenc_{targ}$ as the operation signal, and outputs the table encoder Z target value filter output $Zenc_{cnt}$ as the controlled variable (instruction values to the driving system).

More particularly, in this case the Z axis direction position error $Z_{targ}$ of the substrate table 18 can be expressed in the following equation, with the focus sensor $S_{ij}$ detection results as $Z_{ij}$:

$$Z_{targ}=(Z_{targ}1+Z_{targ}2+Z_{targ}3)/3-Pt_{cmp}$$

$Pt_{Cmp}$, and $Z_{targ}1$, $Z_{targ}2$, $Z_{targ}3$ are as follows.

$Pt_{cmp}$:(current value of encoder Ty—tilt of moving surface)×4 mm $Z_{targ}1$: among the values ($Z_{51}$, $Z_{41}$, $Z_{31}$), the average of the values used for control $Z_{targ}2$: among the values ($Z_{55}$, $Z_{45}$, $Z_{35}$), the average of the values used for control $Z_{targ}3$: among the values ($Z_{59}$, $Z_{49}$, $Z_{39}$), the average of the values used for control In this embodiment, the current value of encoder Ty, that is, the current value of the pitching amount obtained by the encoder output provided on driving system of the substrate table 18 is null (the origin) when the substrate table is parallel with the image surface of the projection optical system. Also the tilt of the moving surface, that is, the tilt of the Y stage 16 moving surface, is null (the origin) when the moving surface is parallel with the image surface of the projection optical system. And $Pt_{cmp}$ is the correction value; so as to keep the Z position control of the substrate table 18 from interfering with the pitching control.

In this case, as for $Z_{targ}1$ to $Z_{targ}3$, when the focus sensors of the first to third row (hereinafter suitably referred to as "sensors") can be used, the sensors form a column which detection values are to be averaged. If they cannot be used, then the detection value of the sensor in the second row is to be used.

For example, when plus scanning is performed, the first column is $Z_{targ}1=(Z_{51}+Z_{41}+Z_{31})/3$, or $Z_{targ}1=Z_{41}$.

With the control system in FIG. 13A, the subtracter 201A calculates the Z encoder target value $Zenc_{targ}$ which is the deviation of the $Z_{targ}$ and encoder output value (trace value) $Zenc_{trace}$ by using the following equation:

$$Zenc_{targ}=Zenc_{trace}-Z_{targ}$$

And when the Z encoder target value $Zenc_{targ}$ enters the DATA delay circuit 202A, it is delayed for a predetermined delay time ($d_{delay}$), and is output as the delay value $Zenc_{targ\_delay}$ of the Z encoder target value. The Z encoder target value $Zenc_{targ}$ is delayed for a predetermined delay time ($d_{delay}$) by the DATA delay circuit 202A in order for the software to correct the difference between the delay in control and the prereading distance. The amount for correction can be set at an optimum value, for example, by experiment (including simulation).

The $Zenc_{targ\_delay}$ is input to the differential filter 203A as well as to the adder 204A. The differential filter 203A multiplies the difference of the current input value and the value input predetermined time t earlier $k_{derv}$ times, and outputs the result. The predetermined time t, is expressed as 2–8 (mm)/150 (mm/sec).

The sum of the output of the differential filter 203A, in short, the difference value of the current input value ($Zenc_{targ\_delay}$) and the value input predetermined time t earlier ($Zenc_{targ\_delay}$) multiplied by $k_{derv}$ times, and the $Zenc_{targ\_delay}$, are calculated in the adder 204A. And the output of the adder 204A, which is the table encoder Z target value filter output $Zenc_{cnt}$ is provided to the driving system as an instruction value. That is, with the control system in FIG. 13A, the table encoder Z target value filter output $Zenc_{cnt}$ is to be the instruction value for the driving system. And the instruction value is obtained by performing target value filtering by the differential filter 203A to the delay value $Zenc_{targ\_delay}$ of the Z encoder target value $Zenc_{targ}$.

The Z encoder control error $Zenc_{targ\_err}$ is expressed as follows:

$$Zenc_{targ\_err} = Zenc_{targ\_delay} - Zenc_{trace}$$

The subtracter 205A calculates the Z encoder control error $Zenc_{targ\_err}$, and it is used to monitor the controllability of the encoder servo system so as to keep it at an optimum level.

And, with the control system in FIG. 13B calculates the R encoder target value $Renc_{targ}$ with the subtracter 201B. The encoder target value $Renc_{targ}$ is the deviation between the rolling amount error $R_{targ}$ of the substrate table 18 (wafer W) obtained from the detection results of the multiple focal position detection system and the encoder output value $Renc_{trace}$. The control system uses the R encoder target value $Renc_{targ}$ as the operation signal, and outputs the table encoder R target value filter output $Renc_{cnt}$ as the controlled variable (instruction values to the driving system).

More particularly, the rolling amount error $R_{targ}$ of the substrate table 18 can be expressed in this case, for example, as the following equation under the conditions of type A sensor selection, full shot area, and plus scan:

$$R_{targ} = (Z_{51} + Z_{41} + Z_{31})/3 - (Z_{59} + Z_{49} + Z_{39})/3$$

With the control system in FIG. 13B, the R encoder target value $Renc_{targ}$ which is the deviation of the $R_{targ}$ described above and the encoder output value (trace value) $Renc_{trace}$ is calculated with the subtracter 201B by using the following equation:

$$Renc_{targ} = Renc_{trace} - R_{targ}$$

And when the R encoder target value $Renc_{targ}$ enters the DATA delay circuit 202B, it is delayed for a predetermined delay time ($d_{delay}$), and is output as the delay value $Renc_{targ\_delay}$ of the R encoder target value. The R encoder target value $Renc_{targ}$ is delayed for a predetermined delay time ($d_{delay}$) by the DATA delay circuit 202B in order for the software to correct the difference between the delay in control and the prereading distance. The amount for correction can be of an optimum value, for example, obtained by experiment (including simulation).

The $Renc_{targ\_delay}$ is input to the differential filter 203B as well as to the adder 204B. The differential filter 203B multiplies the difference of the current input value and the value input predetermined time t (described above) earlier $k_{derv}$ times, and outputs the result.

The sum of the output of the differential filter 203B, in short, the difference value of the current input value ($Renc_{targ\_delay}$) and the value input predetermined time t earlier ($Renc_{targ\_delay}$) multiplied by $k_{derv}$ times, and the $Renc_{targ\_delay}$, are calculated in the adder 204B. And the output of the adder 204B, which is the table encoder R target value filter output $Renc_{cnt}$ is provided to the driving system as an instruction value. That is, with the control system in FIG. 13B, the table encoder R target value filter output $Renc_{cnt}$ is to be the instruction value for the driving system. And the instruction value is obtained by performing target value filtering by the differential filter 203B to the delay value $Renc_{targ\_delay}$ of the R encoder target value $Renc_{targ}$.

The R encoder control error $Renc_{targ\_err}$ is expressed as follows:

$$Renc_{targ\_err} = Renc_{targ\_delay} - Renc_{trace}$$

The subtracter 205B calculates the R encoder control error $Renc_{targ\_eer}$, and it is used to monitor the controllability of the encoder servo system so as to keep it at an optimum level.

The control system in FIG. 13C calculates the P encoder target value $Penc_{targ}$ with the subtracter 201C. The encoder target value $Penc_{targ}$ is the deviation between the pitching amount error $P_{targ}$ of the substrate table 18 (wafer W) obtained from the detection results of the multiple focal position detection system (40, 42) and the encoder output value $Penc_{trace}$. The control system uses the P encoder target value $Penc_{targ}$ as the operation signal, and outputs the table encoder P target value filter output $Penc_{cnt}$ as the controlled variable (instruction values to the driving system).

More particularly, the pitching amount error $P_{targ}$ of the substrate table 18 can be expressed in this case, for example, as the following equation under the conditions of type A sensor selection, full shot area, and plus scan:

$$P_{targ} = (Z_{51} + Z_{55} + Z_{59})/3 - (Z_{31} + Z_{35} + Z_{39})/3$$

With the control system in FIG. 13C, the P encoder target value $Penc_{targ}$ which is the deviation of the $P_{targ}$ described above and the encoder output value (trace value) $Penc_{trace}$ is calculated with the subtracter 201C by using the following equation:

$$Penc_{targ} = Penc_{trace} - P_{targ}$$

And when the P encoder target value $Penc_{targ}$ enters the DATA delay circuit 202C, it is delayed for a predetermined delay time ($d_{delay}$), and is output as the delay value $Penc_{targ\_delay}$ of the P encoder target value. The P encoder target value $Penc_{targ}$ is delayed for a predetermined delay time ($d_{delay}$) by the DATA delay circuit 202C in order for the software to correct the difference between the delay in control and the prereading distance. The amount for correction can be of an optimum value, for example, obtained by experiment (including simulation).

The $Penc_{targ\_delay}$ is input to the differential filter 203C as well as to the adder 204C. The differential filter 203C multiplies the difference of the current input value and the value input predetermined time t (described above) earlier $k_{derv}$ times, and outputs the result.

The sum of the output of the differential filter 203C, in short, the difference value of the current input value ($Penc_{targ\_delay}$) and the value input predetermined time t earlier ($Penc_{targ\_delay}$) multiplied by $k_{derv}$ times, and the $Penc_{targ\_delay}$, are calculated in the adder 204C. And the output of the adder 204C, which is the table encoder P target value filter output $Penc_{cnt}$ is provided to the driving system as an instruction value. That is, with the control system in FIG. 13C, the table encoder P target value filter output $Penc_{cnt}$ is to be the instruction value for the driving system. And the instruction value is obtained by performing target value filtering by the differential filter 203C to the delay value $Penc_{targ\_delay}$ of the P encoder target value $Penc_{targ}$.

The P encoder control error $Penc_{targ\_err}$ is expressed as follows:

$$Penc_{targ\_err} = Penc_{targ\_delay} - Penc_{trace}$$

The subtracter 205C calculates the P encoder control error $Penc_{targ\_err}$, and it is used to monitor the controllability of the encoder servo system so as to keep it at an optimum level.

Next, the case where the exposing shot area is an inward shot, a chipped shot, and the basic sensor selection is type A, is described with reference to FIGS. 14A to 16C. In these FIGS., the white circles (○) indicate selected sensors that are not used for control, and the black circles (●) indicate the selected sensors being used for control. Also, the reference EE shows the outer rim of the effective area of the wafer W. In actual, the exposure area IA and the group of selected focus sensors are fixed and the wafer W is the one moving, however, for the sake of convenience, the exposure area IA and the group of selected focus sensors are hereinafter described to be moving instead of the wafer.

Figure 14A:
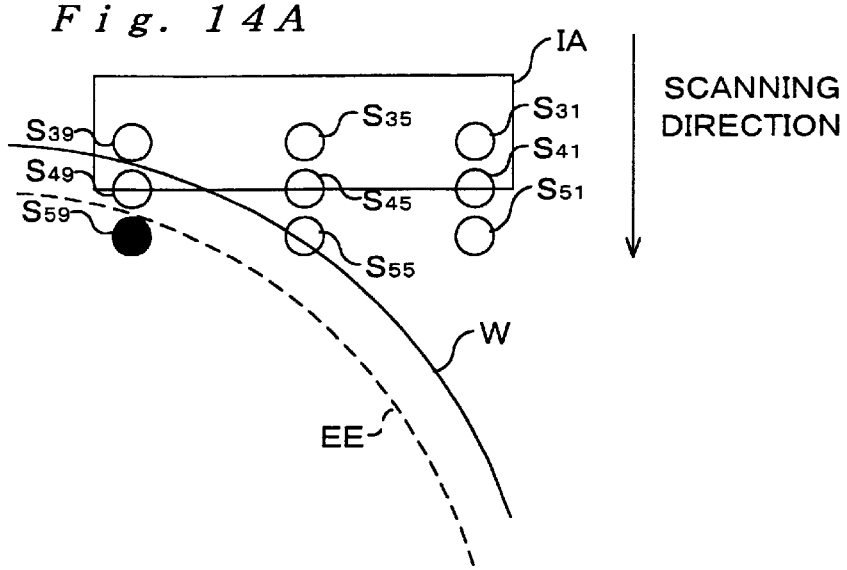
FIGS. 14A to 14C are views to explain the flow of the first stage of focus leveling control on an inward shot in the first embodiment.

① Similarly in this case, the reticle R and the wafer W are relatively scanned along the Y axis direction. After a predetermined time has elapsed since starting the relative scanning, as shown in FIG. 14A, the focus sensor $S_{59}$ which is located in the first row in the first column on the left hand side enters the effective area of the wafer W. The main controller 20 then drives the substrate table 18 in the Z axis direction, by open control (the first controlled state), via the stage control system 19 and the wafer driving unit 21. This control is performed based on the Z position information of the surface of the wafer W (information on the distance between the surface of the wafer W and the image surface of the projection optical system PL (hereinafter appropriately referred to as (the detection result of the focus sensor)), which are based on the focus signals FS corresponding to the focus sensor $S_{59}$. With this open control, a target value is calculated based on the detection result of the focus sensor $S_{59}$ and the output value of an encoder (not shown in FIGS., hereinafter suitably referred to as a "driving system encoder") which detects the respective driving amounts of the three axes supporting the substrate table 18. The target value is held, and the substrate table 18 is driven in the Z direction by the encoder servo until the output value of the driving system encoder reaches the target value. Accordingly, the Z driving control of the substrate table 18 is not an open control in a strict sense, however, since it is different from the closed control (encoder closed loop control) based on the detection results of the multiple focal position detection system (40, 42) which directly detects the Z position information of the wafer surface, and does not successively update the target value the term open control is used. In the following description, as well, the term "open control" is used for encoder-servo control, which is performed holding the target value as appropriate (in this description the term open control is used as a general idea including the encoder-servo control described above).

Figure 14B:
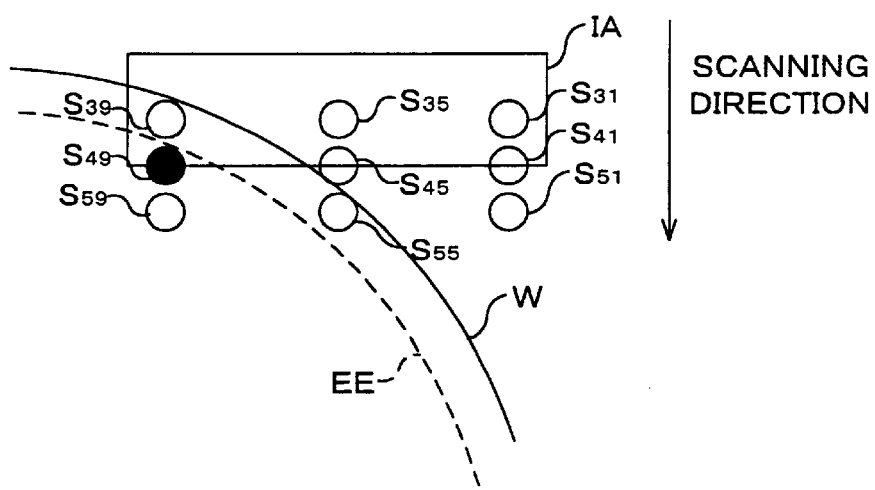

② As the exposure area IA and the group of selected sensors proceed from the state shown in FIG. 14A in the scanning direction, the focus sensor $S_{49}$ which is located in the second row in the first column on the left hand side enters the effective area of the wafer W as shown in FIG. 14B. The main controller 20 then drives the substrate table 18 in the Z axis direction, by encoder closed loop control (the second controlled state) to correct the defocus amount which is obtained based on the Z position information of the surface of the wafer W. The Z position information is the detection result of the focus sensor $S_{49}$.

In other words, the main controller 20 successively calculates the driving system encoder target value based on the detection result (error) of the multiple focal position detection system (40, 42) at the detection point and the output value of the driving system encoder. It then inputs the driving system encoder target value into the substrate driving system after delaying it for a predetermined period of time. The substrate driving system, with respect to the target value performs closed loop control with the driving system encoder, and controls the Z position of the wafer W by successively changing the target value.

Figure 14C:
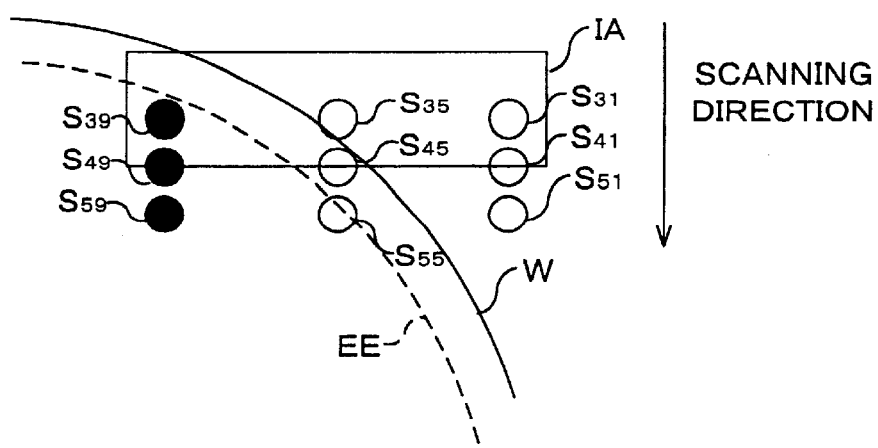

③ As the exposure area IA and the group of selected sensors further proceed from the state shown in FIG. 14B in the scanning direction, all the selected sensors $S_{59}$, $S_{49}$, and $S_{39}$ located in the first column on the left hand side enter the effective area of the wafer W as shown in FIG. 14C. The main controller 20 then performs encoder closed loop control (the third controlled state) to correct the defocus and pitching error and controls the position of the substrate table 18 in the Z axis direction and the tilt in the scanning direction. The control is performed, based on the detection results of the respective focus sensors $S_{59}$, $S_{49}$, and $S_{39}$.

That is, the main controller 20 successively calculates the driving system encoder target value based on the detection result (error) of the multiple focal position detection system (40, 42) at the detection point and the output value of the driving system encoder. It then inputs the driving system encoder target value into the substrate driving system after delaying it for a predetermined period of time. The substrate driving system, with respect to the target value performs closed loop control with the driving system encoder, and controls the Z position of the wafer W and the tilt in the scanning direction (pitching) by successively changing the target value.

Figure 15A:
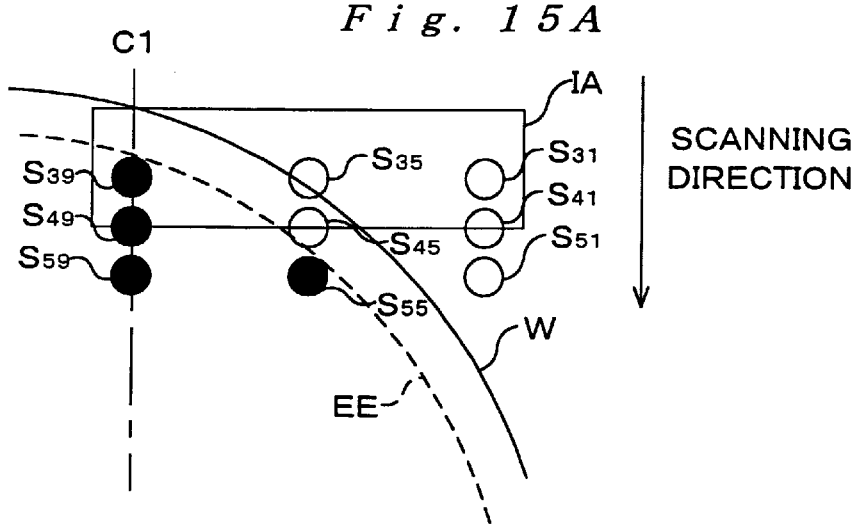
FIGS. 15A to 15C are views to explain the flow of the second stage of focus leveling control on an inward shot in the first embodiment.

④ When the exposure area IA and the group of selected sensors further proceed from the state shown in FIG. 14C in the scanning direction, the focus sensor $S_{55}$ that is located in the first row in the second column enters the effective area of the wafer W as shown in FIG. 15A. The main controller 20, then performs closed control of the position of the substrate table 18 in the Z axis direction and the tilt in the scanning direction (pitching) based on the detection results of the focus sensors $S_{59}$, $S_{49}$, and $S_{39}$. Also, the detection result of the focus sensor $S_{55}$ is held, and based on the averaged value of the detection result $Z_{55}$ of the focus sensor $S_{55}$ and the detection results $Z_{59}$, $Z_{49}$, and $Z_{39}$ of the focus sensors $S_{59}$, $S_{49}$, and $S_{39}$, the target value to correct the tilt of the wafer W in the non-scanning direction (rolling) is obtained. And based on this target value, the rolling control of the substrate table 18 is performed by open control. In this case, the center of the rolling control is the axis C1 shown in FIG. 15A. The detection result $Z_{55}$ obtained when the focus sensor $S_{55}$ enters the effective area and the encoder rolling target value obtained by the output of the encoder is held, and controlled until the focus sensor $S_{55}$ enters the effective area. However, as for the Z target value, the encoder target value is successively updated by the averaged value of the detection results $Z_{59}$, $Z_{49}$, and $Z_{39}$ of the focus sensors $S_{59}$, $S_{49}$, and $S_{39}$ and by the encoder output value, and then input to the substrate driving system after a predetermined time delay, and is controlled by encoder-servo control.

Figure 15B:
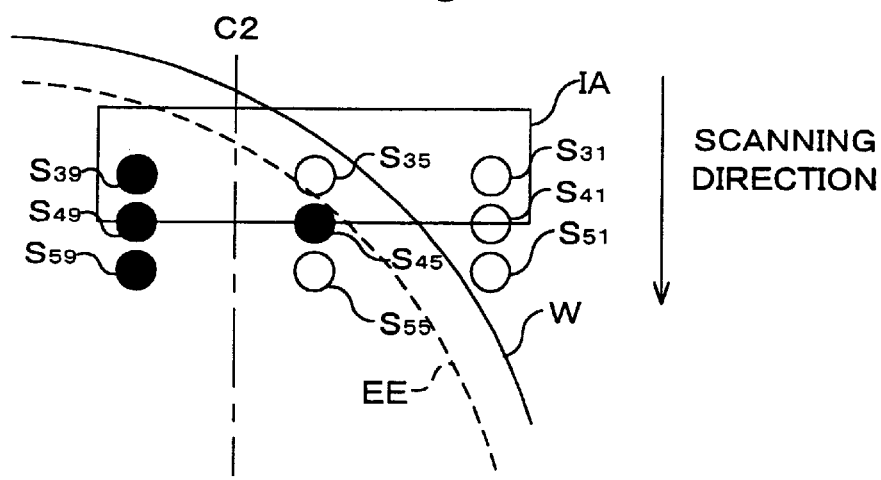

⑤ When the exposure area IA and the group of selected sensors further proceed from the state shown in FIG. 15A in the scanning direction, the focus sensor $S_{45}$ that is located in the second row in the second column enters the effective area of the wafer W as shown in FIG. 15B, and the detection result of the focus sensor $S_{45}$ is used to calculate the encoder target value. The Z error, is the averaged value of the Z detection results in the respective columns. That is, $\{(Z_{59}+Z_{49}+Z_{39})/3+Z_{45}\}/2$. The encoder value is calculated so that the error of Z becomes zero, and encoder-servo control is performed on the substrate table 18 by delaying the input of the encoder target value for a predetermined period of time. The main controller 20 controls the tilt of the substrate table 18 in the non-scanning direction (rolling), while performing encoder closed loop control on the substrate table 18 to control the Z axis position and the tilt in the scanning direction (pitching). The rolling error, in this case, can be obtained in the following equation;

$$\{(Z_{59}+Z_{49}+Z_{39})/3-Z_{45}\}$$

and the encoder value is calculated so that the error of Z becomes zero, and encoder-servo control is performed on the substrate table 18 by delaying the input of the encoder target value for a predetermined period of time. The center of the rolling control is the axis C2 shown in FIG. 15B.

Figure 15C:
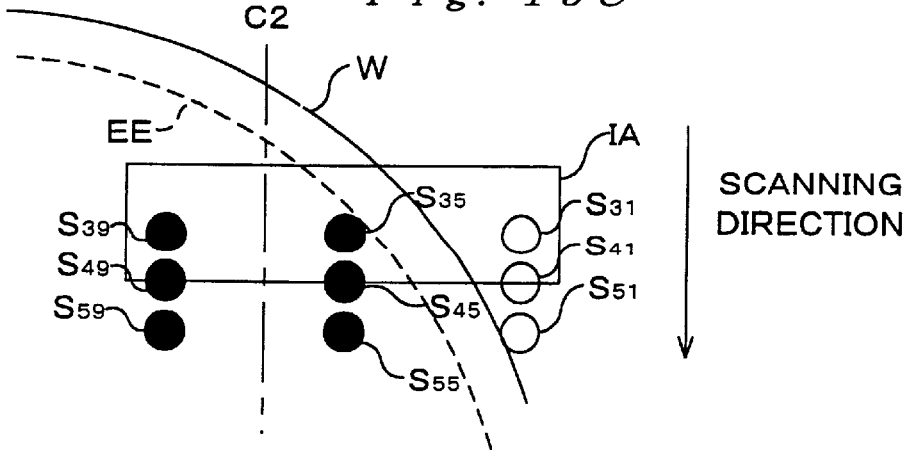

⑥ As the exposure area IA and the group of selected sensors further proceed from the state shown in FIG. 15B in the scanning direction, all the selected focus sensors located in the first and second column enter the effective area of the wafer W as shown in FIG. 15C. The main controller 20 then calculates the Z error based on the detection results $Z_{59}$, $Z_{49}$, $Z_{39}$, $Z_{55}$, $Z_{45}$, and $Z_{35}$ of the focus sensors $S_{59}$, $S_{49}$, $S_{39}$, $S_{55}$, $S_{45}$, and $S_{35}$. The Z error is the averaged value of the Z detection results in the respective columns. That is;

$$\{(Z_{59}+Z_{49}+Z_{39})/3+(Z_{55}+Z_{45}+Z_{35})/3\}/2.$$

The encoder value is calculated so that the error of Z becomes zero, and encoder-servo control is performed on the substrate table 18 by delaying the input of the encoder target value for a predetermined period of time. The rolling error is calculated by;

$$\{(Z_{59}+Z_{49}+Z_{39})/3-(Z_{55}+Z_{45}+Z_{35})/3\}$$

and the pitching error;

$$\{(Z_{59}+Z_{55})/2-(Z_{39}+Z_{35})/2\}$$

The encoder values are calculated so that these errors become zero, and encoder-servo control is performed on the substrate table 18 by delaying the input of the encoder target value for a predetermined period of time. And the main controller 20 performs encoder closed control of the position of the substrate table 18 in the Z axis direction, the tilt in the scanning direction (pitching), and the tilt in the non-scanning direction (rolling).

Such control is expressed as the following equation when Z error, rolling error, and pitching error are respectively $Z_{targ}$, $R_{targ}$, and $P_{targ}$:

$$Z_{targ}=(Z_{59}+Z_{49}+Z_{39}+Z_{55}+Z_{45}+Z_{35})/6Pt_{cmp}$$

$$R_{targ}=(Z_{55}+Z_{45}+Z_{35})/3-(Z_{59}+Z_{49}+Z_{39})/3$$

$$P_{targ}=(Z_{55}+Z_{59})/2-(Z_{35}+Z_{39})/2$$

The encoder values are calculated so that these errors become zero, and encoder-servo control is performed on the substrate table 18 by delaying the input of the encoder target value for a predetermined period of time. The center of the rolling control is the axis C2 shown in FIG. 15C.

Figure 16A:
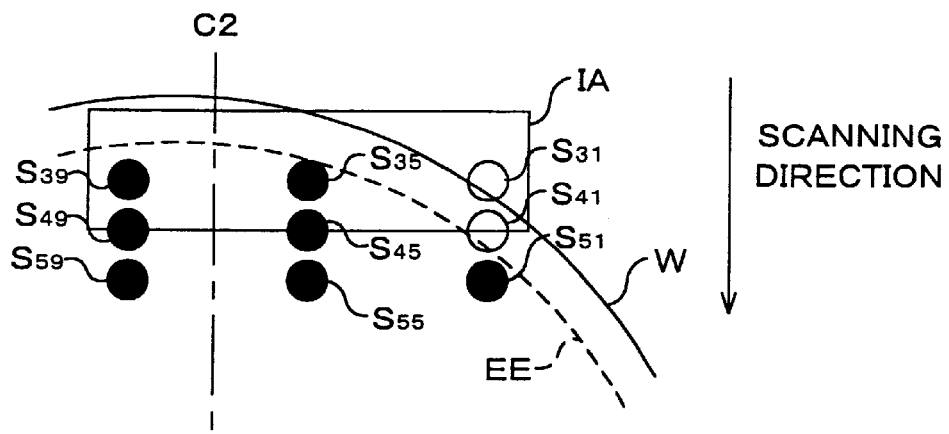
FIGS. 16A to 16C are views to explain the flow of the third stage of focus leveling control on an inward shot in the first embodiment.

⑦ When the exposure area IA and the group of selected sensors further proceed from the state shown in FIG. 15C in the scanning direction, the focus sensor $S_{51}$ that is located in the first row in the third column from the left enters the effective area of the wafer W as shown in FIG. 16A. Then the Z error is calculated based on the detection results $Z_{59}$, $Z_{49}$, $Z_{39}$, $Z_{55}$, $Z_{45}$, and $Z_{35}$ of the focus sensors $S_{59}$, $S_{49}$, $S_{39}$, $S_{55}$, $S_{45}$, and $S_{35}$. The Z error is the averaged value of the Z detection results in the respective columns. That is;

$$\{(Z_{59}+Z_{49}+Z_{39})/3+(Z_{55}+Z_{45}+Z_{35})/3\}/2.$$

The encoder values are calculated so that these errors become zero, and by delaying the input of the encoder target value for a predetermined period of time, encoder-servo control is performed on the substrate table 18. As for rolling control, the error is calculated as;

$$\{(Z_{59}+Z_{49}+Z_{39})/3-(Z_{55}+Z_{45}+Z_{35})/3\}/2-Z_{51}$$

and the encoder value to make the error null is held, and the rolling is driven by open control with axis C2 as the center. The update of the encoder target value in the rolling direction is performed when the focus sensor $S_{45}$ enters the effective area. The main controller performs the rolling control as described above, while continuing the encoder closed loop control of the substrate table 18 to control the Z axis position and the tilt in the scanning direction (pitching). That is, the focus sensor $S_{51}$ is no t used, for calculating the Z error and pitching error.

⑧ As the exposure area IA and the group of selected sensors further proceed from the state shown in FIG. 15A in the scanning direction, the focus sensor $S_{41}$ that is located in the second row in the third column from the left enters the effective area of the wafer W as shown in FIG. 15B. While the main controller 20 continues the closed control of the substrate table 18 to control the Z axis position and the tilt in the scanning direction (pitching), it also changes the rolling control of the substrate table 18 to a closed control based on the difference between the detection results $Z_{41}$ and $Z_{49}$ of the focus sensors $S_{41}$ and $S_{49}$ in the second row. In this case, when the Z error, rolling error, and pitching error is respectively $Z_{targ}$, $R_{targ}$ and $P_{targ}$, then:

$$Z_{targ}=\{(Z_{59}+Z_{49}+Z_{39})/3+(Z_{55}+Z_{45}+Z_{35})/3+Z_{41}\}/3-Pt_{cmp}$$

$$R_{targ}=Z_{41}-(Z_{59}+Z_{49}+Z_{39})/3$$

$$P_{targ}=(Z_{55}+Z_{59})/2-(Z_{35}+Z_{39})/2$$

The encoder values are calculated so that these errors become zero, and encoder-servo control is performed on the substrate table 18 by delaying the input of the encoder target value for a predetermined period of time.

Figure 16B:
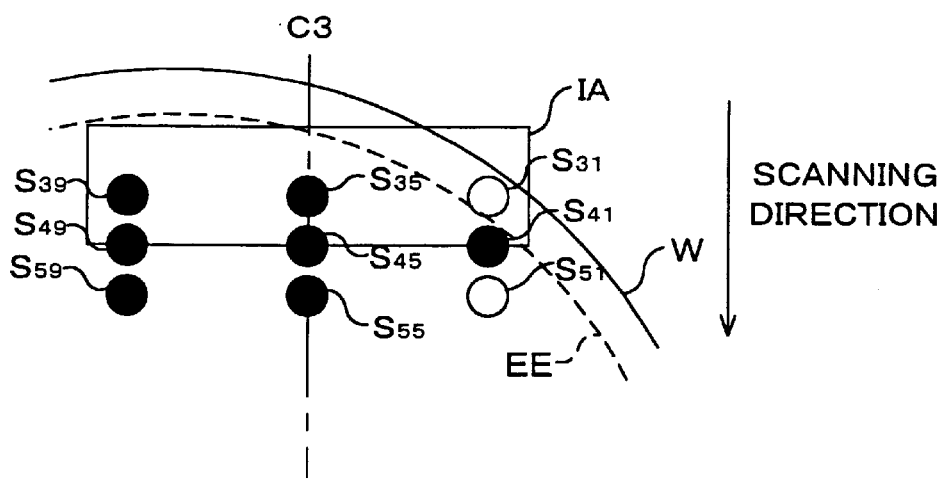
Figure 16C:
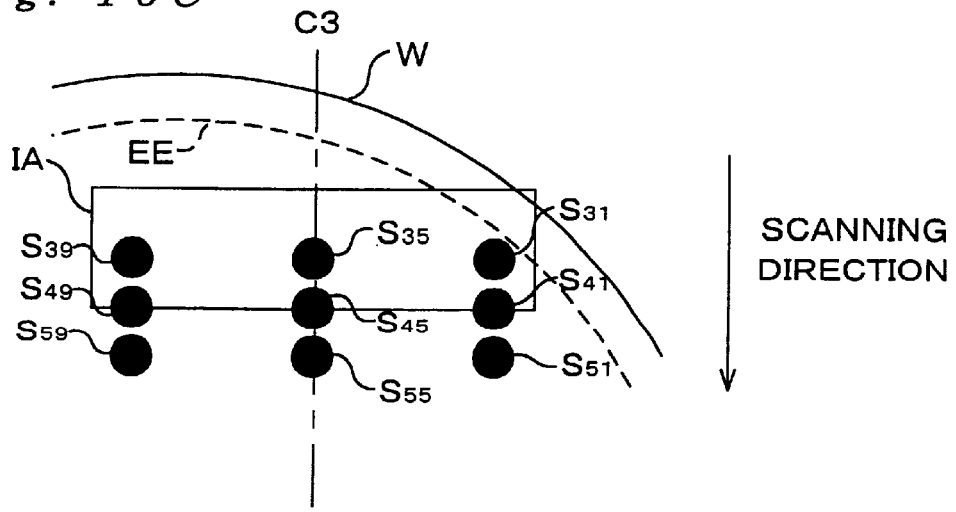

⑨ As the exposure area IA and the group of selected sensors further proceed from the state shown in FIG. 16B in the scanning direction, all the selected focus sensors enter the effective area of the wafer W as shown in FIG. 16C. The main controller 20 then controls the position of the substrate table 18 in the Z axis direction, the tilt in the scanning direction (pitching), and the tilt in the non-scanning direction (rolling) by the encoder servo closed loop control. This control is performed based on the detection results $Z_{51}$, $Z_{41}$, $Z_{31}$, $Z_{55}$, $Z_{45}$, $Z_{35}$, $Z_{59}$, $Z_{49}$, and $Z_{39}$ of the focus sensors $S_{51}$, $S_{41}$, $S_{31}$, $S_{55}$, $S_{45}$, $S_{35}$, $S_{59}$, $S_{49}$, and $S_{39}$.

Such control is performed with the errors:

$$Z_{targ}=(Z_{59}+Z_{49}+Z_{39}+Z_{55}+Z_{45}+Z_{35}+Z_{51}+Z_{41}+Z+Z_{31})/9-Pt_{cmp}$$

$$R_{targ}=(Z_{51}+Z_{41}+Z_{31})/3-(Z_{59}+Z_{49}+Z_{39})/3$$

$$P_{targ}=(Z_{51}+Z_{55}+Z_{59})/3-(Z_{31}+Z_{35}+Z_{39})/3$$

The encoder values are successively calculated so that these errors become zero, and encoder-servo control is performed on the substrate table 18 by delaying the input of the encoder target value for a predetermined period of time. In this case, the center of the rolling control is the axis C3 shown in FIG. 16C.

The description above is of the case when the selected sensors are arranged at an equivalent interval, therefore, if the interval is not equivalent, the error calculation method differs.

In consideration of the interval of the selected sensors not being equivalent, the substrate table 18 is driven so that the rotational center of rolling and the rotation angle is calculated by a linear least squares method at all times, and the rolling does not interfere with the Z position. When the image surface subject to fitting by the least squares method is expressed as equation (1) as follows, the rolling tilt m and the intercept b is expressed as in equation (2) and (3). The number of columns selected in the X direction is indicated as n. The maximum number of columns is 3, $Z_{targ}1$, $Z_{targ}2$, and $Z_{targ}3$ when the basic sensor selection is type A, and 4 columns, when type B is selected for the basic sensors.

The equation (4) below, is an equation to calculate the barycenter $x_{com}$ in the rolling direction, and equation (5) is a Z target value (error) $Z_{aim}$ at the barycenter.

$$z=mx+b \quad (1)$$

$$m=n\Sigma(xz)\ (\Sigma x)\ (\Sigma y)/\{n(\Sigma(x^2))-(\Sigma x)^2\} \quad (2)$$

$$b=\{\Sigma z\Sigma x^2-\Sigma x\Sigma xz\}/\{n(\Sigma(x^2))-(\Sigma x)^2\} \quad (3)$$

$$X_{com}=(\Sigma x)/n \quad (4)$$

$$Z_{aim}=x_{com}\cdot m+b \quad (5)$$

The Z target value (error) at the barycenter is to be $Z_{aim}$ as described above, the driving point of rolling to is the barycenter $x_{com}$, and the rolling target value (error) is to be m. The encoder target value is calculated so that the errors become zero, and the encoder-servo control is performed to nearly comply with the target value.

In this embodiment, as is described, the main controller 20 controls the rolling of the wafer W by rotating the substrate table 18 (wafer W) via the wafer driving unit 21. The rotational axis as the center, passes through the barycenter of the X direction, extending in the Y axis direction. Therefore, even if focus sensors having an asymmetrical arrangement are selected, the adjustment of the Z position is not affected and is possible to perform rolling adjustment of the wafer W. Accordingly, it becomes possible to select focus sensors that can most effectively adjust the rolling, as sensors used for controlling. With this selection, the Z position of the surface of the wafer W and the rolling which greatly affects defocus can be precisely adjusted.

As described above, the main controller 20 performs the focus leveling control of an inward shot that is a chipped shot. And by this control, the positional relationship between the image forming surface of the projection optical system PL and the surface of the wafer W within the exposure area IA is adjusted. This control is characterized on the following points: that the detection result of the focus sensor in first row second column or the first row third column is held from when the sensor first come within the effective area of the wafer W until the focus sensor arranged in the second row of the same column comes into the effective area, and the detection result is then used to control the rolling of the wafer W by open control (that is, servo control with the encoder, the target values fixed as described earlier); and that when the focus sensor arranged in the second row comes into the effective area of the wafer W, the rolling control of the wafer W is switched to the encoder closed loop control which performs control based on only the detection result of the focus sensor arranged in the second row, until the focus sensor arranged in the third row of the same column comes into the effective area of the wafer W.

Also, the control is characterized on the point when using the detection result of a focus sensor in the first row of a certain column for encoder closed loop control, it is averaged with the detection results of the second and third row in the same column upon usage.

Also, in this embodiment, the pitching control of the wafer W is performed independent of the rolling control.

As described, the relative scanning of the reticle R and wafer W is started with respect to the projection optical system PL to transfer the pattern of the reticle onto the inward shot that is a chipped shot area by the stage control system 19. And when the focus sensor $S_{59}$ positioned in the first row just before the exposure area IA enters the effective area of the wafer W, the main controller 20 calculates the encoder target value, based on the detection results of the focus sensor $S_{59}$. It then holds the value, and controls the Z axis direction of the surface of the wafer W by encoder-servo control (open control) of the wafer driving unit 21 and substrate table 18, thus performing control of the first controlled state. That is, since the wafer driving unit 21 is open controlled (the target value held, and encoder-servo control performed) prior to the exposure area IA coming into the effective area of the wafer W, the pre-exposing dynamic focusing can be expedited when exposing an inward shot. And while performing the pre-exposing dynamic focusing on an inward shot open controlled as described above, in addition to the focus sensor $S_{59}$, when the focus sensor $S_{49}$ positioned in the second row and is located in the exposure area IA enters the effective area of the wafer W, the main controller 20 successively calculates the encoder target value, solely based on the detection result of the focus sensor $S_{49}$. The target value is input into the driving system of the substrate table 18 after being delayed for a predetermined period of time, and the wafer driving unit 21 is subject to encoder closed control to adjust the position of the wafer W in the Z axis direction. Thus, control of the second controlled state is performed. That is, when the focus sensor $S_{49}$ positioned in the second row, which is the sensor in the first row within the exposure area IA, enters the effective area of the wafer W, the pre-exposing dynamic focusing is completed, and focus control is performed based on the detection result of the focus sensor $S_{49}$ by encoder closed control. The focus, therefore, can be controlled with high accuracy. Furthermore, when the focus sensor in the third row $S_{39}$ arranged on the opposite side of the focus sensor $S_{59}$ in the Y direction with respect to the focus sensor $S_{49}$, comes within the effective area of the wafer W when focus is controlled while performing encoder closed control, the main controller 20 performs control of the third controlled state. This control is performed based on detection results of the detection points in the first, second, and third rows, and the position of the wafer W in the Z axis direction and the tilt in the scanning direction is controlled by encoder closed control of the wafer driving unit 21. That is, when pitching control becomes possible, from that point in addition to focus control, leveling (pitching) control in the scanning direction is performed by encoder closed control. Accordingly, in this embodiment, on exposing an inward shot which is a chipped shot, the wafer position in the Z axis direction, and in addition the tilt (pitching) in the scanning direction can be adjusted with high accuracy. Therefore, other than when an extremely particular shot arrangement is employed, an alternate scanning can be performed to expose the entire wafer with at least Z control performed, and lack of uniformity caused by defocus can be efficiently suppressed, thus possible to maintain a substantially high throughput.

In addition, as described in ④, the main controller 20 calculates the encoder target value for rolling as soon as the two detection points $S_{59}$ and $S_{55}$ in the first row enter the effective area on the wafer W, and holds the target value for a predetermined period of time, then swiftly performs the preparatory adjustment for rolling. As described, the tilt of the wafer W in the non-scanning direction to is added to the subject of open control. That is, the target value is held and added to the encoder-servo control described above, therefore, in addition to the pre-exposing dynamic focusing the tilt of the wafer W in the non-scanning direction (rolling) which is the cause of defocus can be set at a proximate level to the target value. Accordingly, as for focus and rolling, control delay on exposing an inward shot area can be prevented.

Also, the main controller 20 switches the control of the tilt of the wafer W in the non-scanning direction from the open control (encoder-servo control holding the target value) to the encoder closed control which sequentially updates the target value. The switching is performed, a predetermined period of time after the two detection points $S_{49}$ and $S_{45}$ in the second row enter the effective area on the wafer W. The focus and rolling control of the wafer W, therefore, can be performed at high accuracy in a state where the control delay is eliminated at the timing when the pre-exposing dynamic focusing has been completed.

In the case the shot area to be exposed is located on the edges in the scanning direction (referred to as the 12 o'clock and 6 o'clock direction) and is an inward shot area which is a chipped shot, the main controller 20 goes through the following process. After the reticle R and the wafer W start relative scanning, based on the detection result of the focus sensor in the first row, at least the position of the substrate table 18 in the Z direction is adjusted (the first controlled state) by open control (servo control based on encoder output which is performed by holding the encoder target value for a predetermined period of time). During the first controlled state, as soon as the focus sensor in the second row enters the effective area on the wafer W, the encoder target value is sequentially calculated by using only its detection result, and sequentially updates the encoder target value. Thus, encoder closed control (the second controlled state) is performed on at least the position of the substrate table 18 in the Z direction. And, during the second controlled state, when the focus sensor in the third row enters the effective area on the wafer W, the position of the wafer W in the Z direction and pitching is controlled by encoder closed control (the third controlled state) based on the detection results of all focus sensors in the first to third row.

Figure 17A:
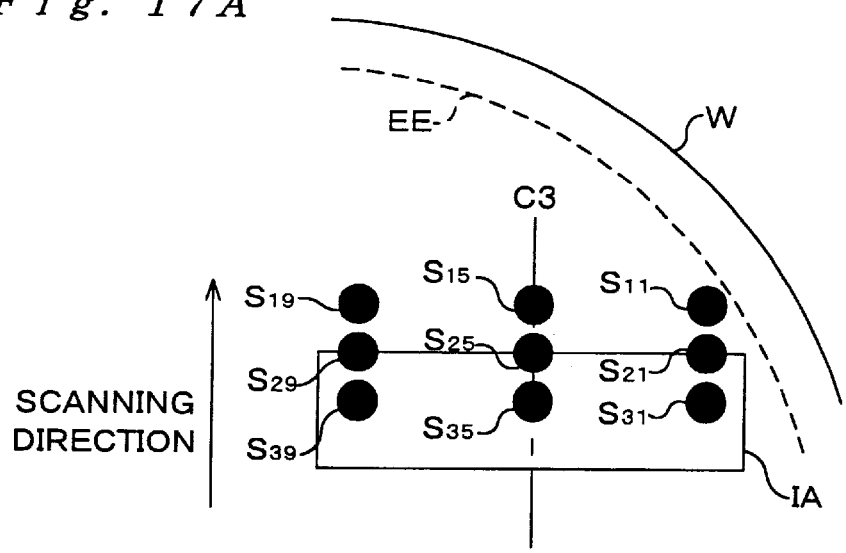
FIGS. 17A to 17C are views to explain the flow of the first stage of focus leveling control on an outward shot in the first embodiment.

Next, the case where the exposing shot area is an outward shot, a chipped shot, and the basic sensor selection is type A, is described with reference to FIGS. 17A to 19C. In these FIGS., the white circles (○) indicate selected sensors that are not used for control, and the black circles (●) indicate the selected sensors being used for control. Also, the reference EE shows the outer rim of the effective area of the wafer W.

a. In this case, likewise, the reticle R and the wafer W are relatively scanned in the Y axis direction. The selected focus sensors are all within the effective area of the wafer W from the start of scanning as shown in FIG. 17A. Therefore, the main controller 20 performs closed control of the position of the substrate table 18 in the Z direction, the tilt in the scanning direction (pitching), and the tilt in the non-scanning direction (rolling). The control is based on the detection results $Z_{11}$, $Z_{21}$, $Z_{31}$, $Z_{15}$, $Z_{25}$, $Z_{35}$, $Z_{19}$, $Z_{29}$, and $Z_{39}$ of the focus sensors $S_{11}$, $S_{21}$, $S_{31}$, $S_{15}$, $S_{25}$, $S_{35}$, $S_{19}$, $S_{29}$, and $S_{39}$. The error calculation in this control is as follows:

$$Z_{targ}=(Z_{19}+Z_{29}+Z_{39}+Z_{15}+Z_{25}+Z_{35}+Z_{11}+Z_{21}+Z_{31})/9-Pt_{cmp}$$

$$R_{targ}=(Z_{11}+Z_{21}+Z_{31})/3-(Z_{19}+Z_{29}+Z_{39})/3$$

$$P_{targ}=(Z_{11}+Z_{15}+Z_{19})/3-(Z_{31}+Z_{35}+Z_{39})/3$$

Figure 17B:
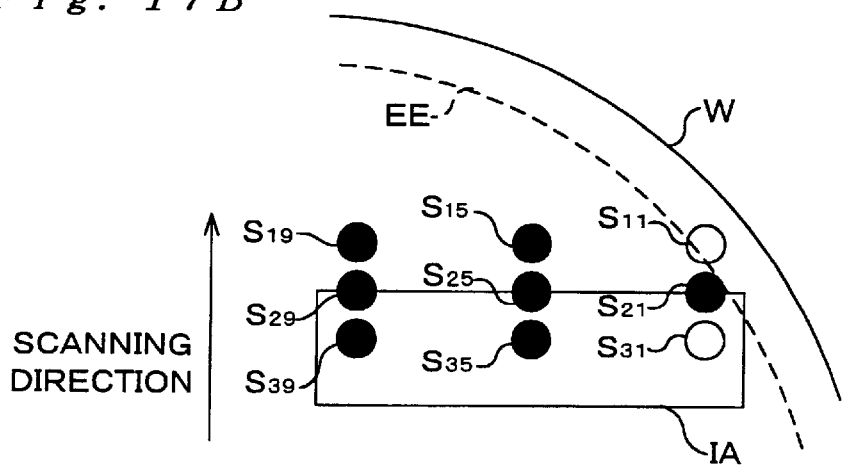

In this case, the center axis of the rolling control is the axis C3 shown in FIG. 17A.

b. As the exposure area IA and the group of selected sensors further proceed from the state shown in FIG. 17A in the scanning direction, the focus sensor $S_{11}$ that is located in the first row in the first column from the right comes off the effective area of the wafer W as shown in FIG. 17B. The main controller 20, then, performs encoder closed control of the position of the substrate table 18 in the Z direction, the tilt in the scanning direction (pitching), and the tilt in the non-scanning direction (rolling). This control is based, on the detection results of the focus sensors $S_{15}$, $S_{25}$, $S_{35}$, $S_{19}$, $S_{29}$, $S_{39}$ located in the second and third columns from the right and also the focus sensor $S_{21}$ in the second row of the first column in the right.

Figure 17C:
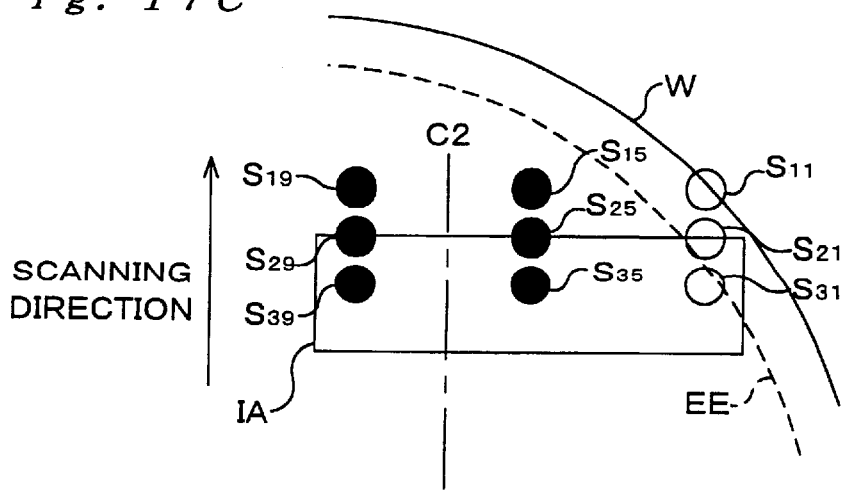

The errors, Z error, rolling error, and pitching error, respectively as $Z_{targ}$, $R_{targ}$, $P_{targ}$, can be expressed as:

$$Z_{targ}=\{(Z_{19}+Z_{29}+Z_{39})/3+(Z_{15}+Z_{25}+Z_{35})/3+Z_{21}\}/3-Pt_{cmp}$$

$$R_{targ}=Z_{21}-(Z_{19}+Z_{29}+Z_{39})/3$$

$$P_{targ}=(Z_{15}+Z_{19})/2-(Z_{35}+Z_{39})/2$$

and the encoder value is calculated so that the errors becomes zero, and encoder-servo control is performed on the substrate table 18 by delaying the input of the encoder target value to the driving system of the substrate table 18 for a predetermined period of time.

c. As the exposure area IA and the group of selected sensors further proceed from the state shown in FIG. 17B in the scanning direction, the focus sensor $S_{21}$ that is located in the second row in the first column from the right comes off the effective area of the wafer W as shown in FIG. 17C. The main controller 20, then, performs encoder closed control of the position of the substrate table 18 in the Z direction, the tilt in the scanning direction (pitching), and the tilt in the non-scanning direction (rolling). This control is based, on the detection results $Z_{19}$, $Z_{29}$, $Z_{39}$, $Z_{15}$, $Z_{25}$, and $Z_{35}$ of the focus sensors $S_{19}$, $S_{29}$, $S_{39}$, $S_{15}$, $S_{25}$, and $S_{35}$ located in the second and third columns from the right. The control errors in this control are as follows:

$$Z_{targ}=(Z_{19}+Z_{29}+Z_{39}+Z_{15}+Z_{25}+Z_{35})/6-Pt_{cmp}$$

$$R_{targ}=(Z_{15}+Z_{25}+Z_{35})/3-(Z_{19}+Z_{29}+Z_{39})/3$$

$$P_{targ}=(Z_{15}+Z_{19})/2-(Z_{35}+Z_{39})/2$$

Figure 18A:
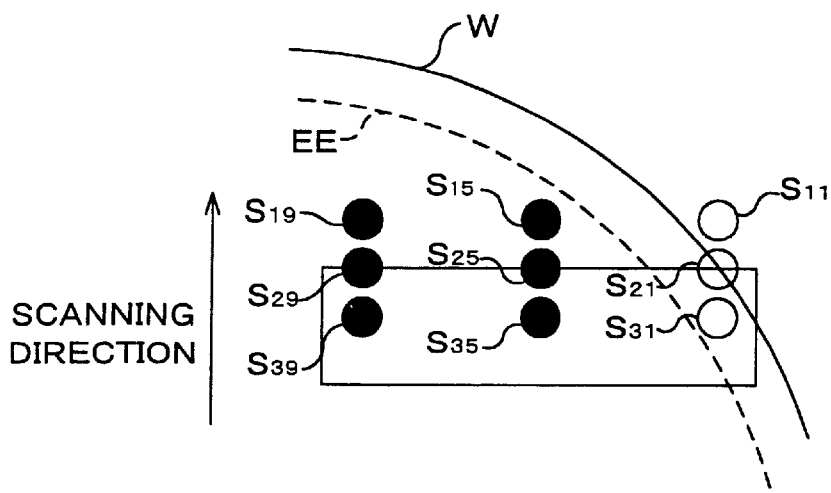
FIGS. 18A to 18C are views to explain the flow of the second stage of focus leveling control on an outward shot in the first embodiment.
Figure 18B:
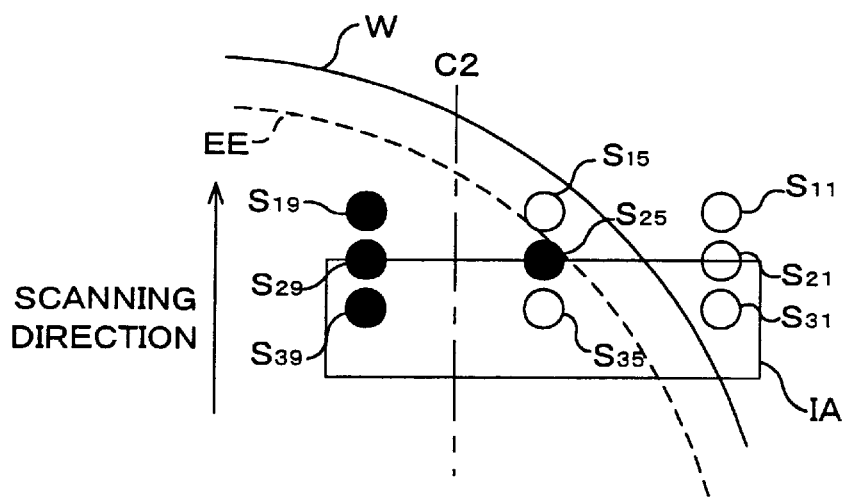
Figure 18C:
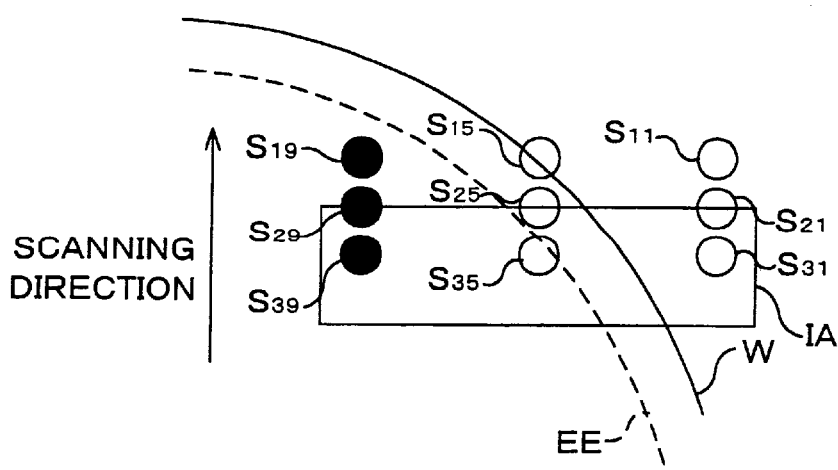
Figure 19A:
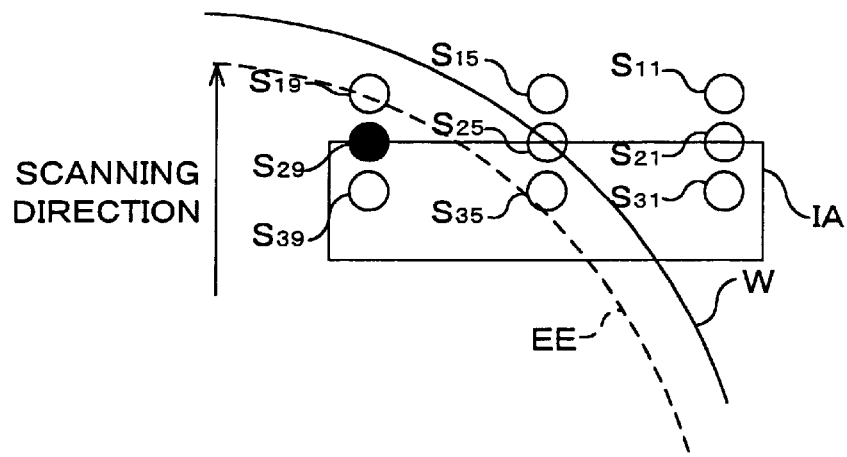
FIGS. 19A to 19C are views to explain the flow of the third stage of focus leveling control on an outward shot in the first embodiment.
Figure 19B:
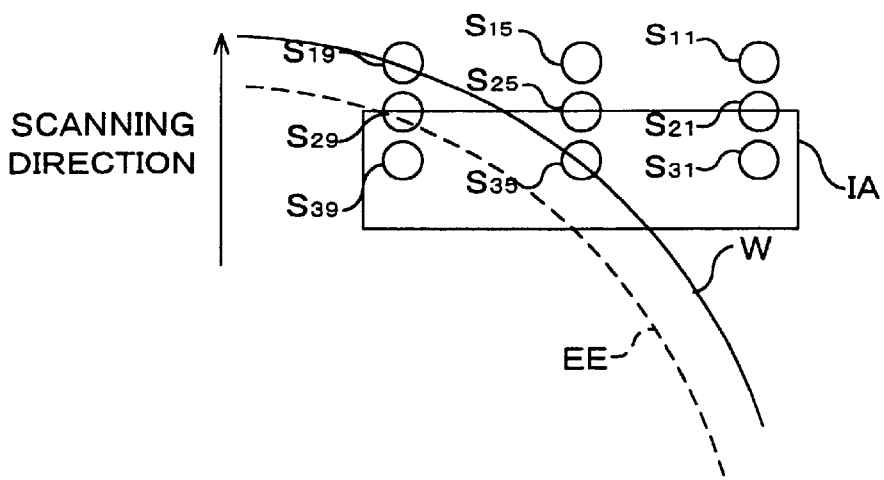
Figure 19C:
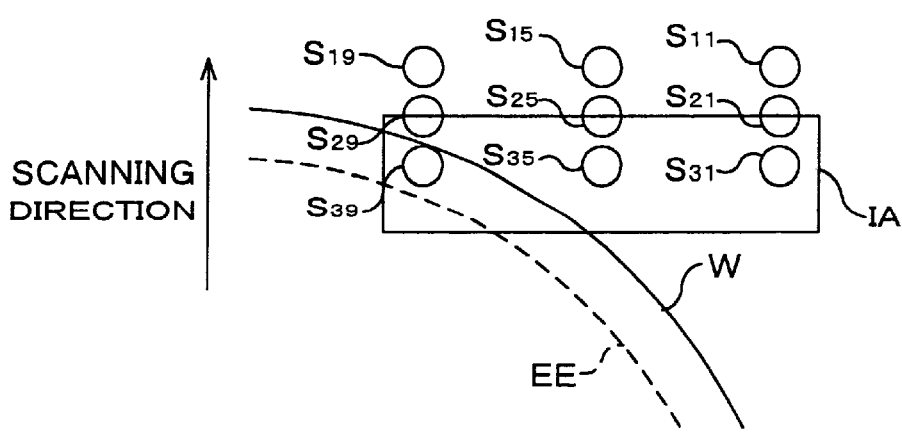

In this case, the center axis of the rolling control is the axis C2 shown in FIG. 17C.

d. When the exposure area IA and the group of selected sensors further proceed from the state shown in FIG. 17C in the scanning direction, all the focus sensors located in the first column from the right come off the effective area of the wafer W as shown in FIG. 18A. At this point, since all the focus sensors located in the second and third column from the right are still within the effective area of the wafer W, the main controller 20 continues the encoder closed control of the position and posture of the substrate table 18, as described above in paragraph c.

e. As the exposure area IA and the group of selected sensors further proceed from the state shown in FIG. 18A in the scanning direction, the focus sensor $S_{15}$ that is located in the first row in the second column comes off the effective area of the wafer W as shown in FIG. 18B. The main controller 20, then performs encoder closed control of the position of the substrate table 18 in the Z direction, the tilt in the scanning direction (pitching) based on the focus sensors in the third column from the right. Also, the tilt of the substrate table 18 in the non-scanning direction (rolling) is controlled, based on the detection results $Z_{29}$ and $Z_{25}$ of the focus sensors $S_{29}$ and $S_{25}$. In this case, the center axis of the rolling control is the axis C2 shown in FIG. 18B.

f. As the exposure area IA and the group of selected sensors further proceed from the state shown in FIG. 18B in the scanning direction, the focus sensor $S_{25}$ that is located in the second row in the second column comes off the effective area of the wafer W as shown in FIG. 18C. The main controller 20 then performs encoder closed control (the first controlled state) of the position of the substrate table 18 in the Z direction, the tilt in the scanning direction (pitching) based on the detection results of the focus sensors $S_{19}$, $S_{29}$, and $S_{39}$. The encoder holds the angle of rolling at the latest value described in paragraph e.

g. As the exposure area IA and the group of selected sensors further proceed from the state shown in FIG. 18C in the scanning direction, the focus sensor $S_1$ that is located in the first row in the third column from the right comes off the effective area of the wafer W as shown in FIG. 19A. The main controller 20, then performs closed control (the second controlled state) of the position of the substrate table 18 in the Z direction, to correct the defocus based on the detection result of the focus sensor $S_{29}$. At this point, the encoder holds the angle of pitching at the latest value described in paragraph f.

h. When the exposure area IA and the group of selected sensors further proceed from the state shown in FIG. 19A in the scanning direction, the focus sensors in the second row comes off the effective area of the wafer W as shown in FIG. 19B. At this point, the main controller 20 locks the control (the third controlled state). That is, the position of the substrate table 18 in the optical axis direction is servo controlled based on the output of the encoder by fixing the target value of the encoder control at a constant value, or, by smoothly changing the control target value after the locking in an estimated value curve, for example, according to a device topography curve to control level differences.

i. Accordingly, even if the exposure area IA and the group of selected sensors further proceed from the state shown in FIG. 19B in the scanning direction, and all the focus sensors come off the effective area of the wafer W as shown in FIG. 19C, the main controller 20 keeps the state described in paragraph h. That is, the main controller 20 maintains the locked state of control.

When an outward shot which is a chipped shot and located on both edges of the shot areas in the 12 o'clock and 6 o'clock direction is exposed, until the focus sensors in the first row come off the effective area of the wafer W, the main controller 20 similarly performs focus leveling control as with the case in paragraph a, by using all nine focus sensors (the first controlled state). During this controlled state, when the focus sensors of the first row come off the effective area of the wafer W, closed control is performed on at least the position of the substrate table 18 in the Z direction (the second controlled state) based on the detection results of the focus sensors only in the second row. And, during the second controlled state, if the focus sensors in the second row come off the effective area of the wafer W, then the control switches to a locked state (the third controlled state).

In the case type B is selected in the basic sensor selection, similar to when type A is selected, the Z leveling control (focus leveling control of the wafer W) of the substrate table 18 is performed. On selection of type B in the basic sensor selection, the number of columns of the selected detection points is numerous and the rolling control can have multiple steps, therefore the rolling control can be performed with high precision. Also, there is the merit of being able to use the detection points in the illumination area for confirmation purposes.

Next, the calculation method of the following error of the focus leveling control (error check method) by the main controller 20 is described, exemplifying the case when the exposing shot area is a full shot, based on plus scanning.

First, the case where type A is selected in the basic sensor selection is described with reference to FIG. 5A.

The encoder control target value of the position of the substrate table 18 (wafer W) in the Z axis direction, in this case, is calculated so that the error $Z_{targ}$ is null. The Z axis direction position error $Z_{targ}$ of the substrate table 18 can be expressed, with the focus sensor $S_{ij}$ and detection results $Z_{ij}$, as:

$$Z_{targ}=(Z_{51}+Z_{55}+Z_{59}+Z_{41}+Z_{45}+Z_{49}+Z_{31}+Z_{35}+Z_{39})/9$$

In short, the averaged value of all the selected focus sensors is the control target value.

In this embodiment, two confirmation data, Z confirmation data 1 (hereinafter referred to as "$Z_{check}1$") and Z confirmation data 2 (hereinafter referred to as "$Z_{check}2$") are used for confirmation of the Z position control. These are expressed as follows:

$$Z_{check}1=(Z_{51}+Z_{55}+Z_{59}+Z_{41}+Z_{45}+Z_{49})/6-Pt_{cmp}1$$

$$Z_{check}2=(Z_{41}+Z_{45}+Z_{49}+Z_{31}+Z_{35}+Z_{39})/6-Pt_{cmp}2$$

And:

$Pt_{cmp}1$: (current value of encoder Ty–tilt of moving surface)×6 mm $Pt_{cmp}2$: (current value of encoder Ty–tilt of moving surface)×2 mm The values $Pt_{cmp}1$ and $Pt_{cmp}2$ are correction values so that the Z position control of the substrate table 18 does not interfere with the pitching control.

And, the main controller 20 calculates the Z following error $Z_{error}$ based on the following equation:

$$Z_{error}=Z_{check}2-\{(Z_{check}1)'-(Z_{targ})'\}$$

($Z_{check}1$)' in this case, is the delayed value of ($Z_{check}1$) for a predetermined period of time, to be more specific, delayed for 4 mm/scanning speed (for example, 150 mm/sec). Likewise, ($Z_{targ}$)' is the value of the error $Z_{targ}$ delayed for a predetermined period of time.

That is, the main controller 20 holds the $Z_{check}1$ for a predetermined period of time (for example, 0.027 sec). The $Z_{check}1$ is the averaged value of the detection results of the focus sensor in the first row located just before the exposure area IA and the focus sensor in the second row within the exposure area IA. The difference of the $Z_{check}1$ which is held for a predetermined period and the $Z_{targ}$ which is equally held for the same period, in other words, the deviation of the Z position to the target value a predetermined period earlier is subtracted from the $Z_{check}2$. With the $Z_{check}2$, the scanning has proceeded 4 mm, and the area on the wafer W detected earlier by the focus sensors in the first and second row is detected with the focus sensors located in the second and third row within the exposure area IA, the detection results being averaged. And the difference between the $Z_{check}1$ and the $Z_{check}2$ is calculated, as the Z following error Z.

Similarly, the encoder control target value of the rolling of the substrate table 18 (wafer W) in this case is calculated so as to make the rolling error $R_{targ}$ null. The rolling error $R_{targ}$ of the substrate table 18 can be expressed, with the focus sensor $S_{ij}$ and detection results $Z_{ij}$, as:

$$R_{targ}=(Z_{51}+Z_{41}+Z_{31})/3-(Z_{59}+Z_{49}+Z_{39})/3$$

In this embodiment, two confirmation data, R confirmation data 1 (hereinafter referred to as "$R_{check}1$") and R confirmation data 2 (hereinafter referred to as "$R_{check}2$") are used for confirmation of the rolling control. These are expressed as follows:

$$R_{check}1=(Z_{51}+Z_{41})/2-(Z_{59}+Z_{49})/2$$

$$R_{check}2=(Z_{41}+Z_{31})/2-(Z_{49}+Z_{39})/2$$

And, the main controller 20 calculates the R following error $R_{error}$ based on the following equation:

$$R_{error}=R_{check}2-\{(R_{check}1)'-(R_{targ})'\}$$

($R_{check}1$)' in this case, is the delayed value of ($R_{check}1$) for the predetermined period of time described earlier. Likewise, ($R_{targ}$)' is the value of the rolling error $R_{targ}$ delayed for the predetermined period of time.

That is, the main controller 20 holds the $R_{check}1$ for a predetermined period of time. The $R_{check}1$, is the tilt of the wafer W in the non-scanning direction (rolling amount) calculated from the detection results of the focus sensor in the first row located just before the exposure area IA and the focus sensor in the second row within the exposure area IA. The difference of the $R_{check}1$ held which is for a predetermined period and the $R_{targ}$ which is equally held for the same period, in other words, the deviation of the rolling amount to the target value a predetermined period earlier, is subtracted from the $R_{check}2$. With the $R_{check}2$, the scanning has proceeded 4 mm, and the area on the wafer W detected earlier by the focus sensors in the first and second row is detected with the focus sensors located in the second and third row within the exposure area IA. The detection results are used to obtain the rolling amount value of the wafer W. And the difference between the $R_{check}1$ and the $R_{check}2$ is calculated, as the following error for rolling.

Likewise, in this case, the encoder control target value of the pitching of the substrate table 18 (wafer W) is calculated so as to make the pitching error $P_{targ}$ null. The pitching error $P_{targ}$ of the substrate table 18 can be expressed, with the focus sensor $S_{ij}$ and detection results $Z_{ij}$, as:

$$P_{targ}=(Z_{51}+Z_{55}+Z_{59})/3-(Z_{31}+Z_{35}+Z_{39})/3$$

In this embodiment, two confirmation data, P confirmation data 1 (hereinafter referred to as "$P_{check}1$") and P confirmation data 2 (hereinafter referred to as "$P_{check}2$") are used for confirmation of the pitching control. These are expressed as follows:

$$P_{check}1=(Z_{51}+Z_{55}+Z_{59})/3-(Z_{41}+Z_{45}+Z_{49})/3$$

$$P_{check}2=(Z_{41}+Z_{45}+Z_{49})/3-(Z_{31}+Z_{35}+Z_{39})/3$$

And, the main controller 20 calculates the P following error $P_{error}$ based on the following equation:

$$P_{error}=P_{check}2-\{(P_{check}1)'-(P_{targ})'\}$$

($P_{check}1$)' in this case, is the delayed value of ($P_{check}1$) for the predetermined period of time described earlier. Likewise, ($P_{targ}$)' is the value of the pitching error $P_{targ}$ delayed for the predetermined period of time.

That is, the main controller 20 holds the $P_{check}1$ for a predetermined period of time. The $R_{check}1$, is the tilt of the wafer W in the scanning direction (pitching amount) calculated from the detection results of the focus sensor in the first row located just before the exposure area IA and the focus sensor in the second row within the exposure area IA. The difference of the $P_{check}1$ which is held for a predetermined period and the $P_{targ}$ which is equally held for the same period, in other words, the deviation of the pitching amount to the target value a predetermined period earlier, is subtracted from the $P_{check}2$. With the $P_{check}2$, the scanning has proceeded 4 mm, and the area on the wafer W detected earlier by the focus sensors in the first and second row is detected with the focus sensors located in the second and third row within the exposure area IA. The detection results are used to obtain the pitching amount value of the wafer W. And the difference between the $P_{check}1$ and the $P_{check}2$ is calculated, as the following error for pitching.

In this manner, when type A is selected on the basic sensor selection, the main controller 20 calculates the following error of the wafer W position in the Z axis direction (focus), tilt in the non-scanning direction (rolling), and tilt in the scanning direction (pitching). This calculation is based on the difference between the error to the target value predicted 4 mm in advance and the real time data that is obtained from the detection results of the focus sensors located in the illumination area.

As is described above, when the reticle R and the wafer W are relatively scanned with respect to the projection optical system PL by the stage control system 19 to transfer the pattern onto the shot area on the wafer W, the main controller 20 obtains the following errors of the wafer W position in the Z axis direction, tilt in the scanning direction, and tilt in the non-scanning direction based on the detection results at the first point and the second point. The first point, is when the detection results are predicted in advance, by a distance between the focus sensors located in the first row just before the exposure area IA and the focus sensors in the second row within the exposure area IA. And the second point, is when the focus sensors in the second row proceed to the area on the wafer W previously detected by the focus sensors in the first row and is detected by the focus sensors in the second and third row.

That is, if the wafer driving unit 21 is controlled by the main controller 20 without delay, the detection result of the focus sensors in the first and second row at the first point is also the detection result of the controlled wafer driving unit 21 at the first point. In this embodiment, the intervals between the respective rows of focus sensors are equally spaced at 4 mm. Therefore, the difference between the detection results of the focus sensors in the first and second row at the first point and the detection results of the focus sensors in the second and third row at the second point, is almost equivalent to the driving amount of the wafer from the first point to the second point. Accordingly, since the target value is constant as previously described, by storing the error to the target value at the first position the following errors for the position of the wafer W in the Z axis direction driven by the wafer driving unit 21, the tilt in the scanning direction, and the tilt in the non-scanning direction can be obtained accurately by simple calculation. This calculation is performed, according to the detection result of the focus sensors in the first and second row at the first point, the detection result of the focus sensors in the second and third row at the second detection point, and the error to the target value at the first position. As a consequence, the main controller controls the wafer driving unit 21 so that such following errors are null based on the detection results of the multiple focal position detection system (40, 42). Thus, the positional relationship of the image surface of the projection optical system PL and the surface of the wafer can be adjusted.

Next, the case where type B is selected in the basic sensor selection is described with reference to FIG. 6A.

The encoder control target value of the position of the substrate table 18 (wafer W) in the Z axis direction, in this case, is calculated so that the error $Z_{targ}$ is null. When the focus sensor is $S_{ij}$ and detection results $Z_{ij}$, it can be expressed as:

$$Z_{targ}=(Z_{41}+Z_{44}+Z_{46}+Z_{49})/4-PT_{cmp}$$

That is, the encoder control target value is calculated so that the averaged value of the selected focus sensors in the second row becomes zero.

In this case, $Z_{check}1$ and $Z_{check}2$ are as follows:

$$Z_{check}1=(Z_{41}+Z_{49})/2-Pt_{cmp}1$$

$$Z_{check}2=(Z_{31}+Z_{39})/2-Pt_{cmp}2$$

And:

$Pt_{cmp}1$: (current value of encoder Ty–tilt of moving surface)×6 mm $Pt_{cmp}2$: (current value of encoder Ty–tilt of moving surface)×2 mm And the main controller calculates the Z following error $Z_{error}$, similarly described above, based on the following equation:

$$Z_{error}=Z_{check}2-\{(Z_{check}1)'-(Z_{targ})'\}$$

That is, the main controller 20 holds the $Z_{check}1$ for a predetermined period of time. The $Z_{check}1$ is the averaged value of the detection results of the focus sensors in the second row on both sides within the exposure area IA. The difference of the $Z_{check}1$ which is held for a predetermined period and the $Z_{targ}$ which is equally held for the same period, in other words, the deviation of the Z position to the target value a predetermined period earlier is subtracted from the $Z_{check}2$. With the $Z_{check}2$, the scanning has proceeded 4 mm, and the area on the wafer W detected earlier by the focus sensors on both sides of the second row is detected with the focus sensors located in the third row of the same column, the detection results being averaged. And the difference between the $Z_{check}1$ and the $Z_{check}2$ is calculated, as the following error for Z.

Similarly, the encoder control target value of the rolling amount of the substrate table 18 (wafer W), in this case, is calculated so that the rolling error $R_{targ}$ becomes zero. The rolling error is calculated by calculating the barycenter of the sensors used by a linear least squares approximation, and then calculating the weighting factor of each sensors based on the approximation. When the focus sensor is $S_{ij}$ and detection results $Z_{ij}$, it can be expressed as:

$$R_{targ}=(Z_{44}+Z_{41}\times 4)/5-(Z_{46}+Z_{49}\times 4)/5$$

In this case, $R_{check}1$ and $R_{check}2$ are as follows:

$$R_{check}1=Z_{41}-Z_{49}$$

$$R_{check}2=Z_{31}-Z_{39}$$

And the main controller calculates the following error for rolling $R_{error}$, similarly as described earlier, based on the following equation:

$$R_{error}=R_{check}2-\{(R_{check}1)'-(R_{targ})'\}$$

That is, the main controller 20 holds the $R_{check}1$ for a predetermined period of time. The $R_{check}1$ is the detection results of the focus sensors in the second row on both sides within the exposure area IA on the tilt of the wafer W in the non-scanning direction (rolling amount). The difference of the $R_{check}1$ which is held for a predetermined period and the $R_{targ}$ which is equally held for the same period, in other words, the deviation of the rolling amount to the target value a predetermined period earlier is subtracted from the $R_{check}2$. With the $R_{check}2$, the scanning has proceeded 4 mm, and the area on the wafer W detected earlier by the focus sensors on both sides of the second row is detected with the focus sensors located in the third row of the same column, the detection results being the rolling amount of the wafer W. And the difference between the $R_{check}1$ and the $R_{check}2$ is calculated, as the following error for rolling.

Likewise, the encoder control target value of the pitching amount of the substrate table 18 (wafer W), in this case, is calculated so that the pitching error $P_{targ}$ becomes zero. The pitching error $P_{targ}$ is calculated by the following equation, the focus sensor being $S_{ij}$ and the detection result $Z_{ij}$:

$$P_{targ}=(Z_{54}+Z_{56}+Z_{59})/3-(Z_{44}+Z_{46}+Z_{49})/3$$

In this case, $P_{check}1$ and $P_{check}2$ are as follows:

$$P_{check}1=Z_{59}-Z_{49}$$

$$P_{check}2=Z_{49}-Z_{39}$$

And the main controller calculates the following error for pitching $P_{error}$, similarly as described earlier, based on the following equation:

$$P_{error}=P_{check}2-\{(P_{check}1)'-(P_{targ})'\}$$

That is, the main controller 20 holds the $P_{check}1$ for a predetermined period of time. The $P_{check}1$ is the detection results of the focus sensors in the first row on one side just before the exposure area IA and in the second row in the same column in the exposure area IA on the tilt of the wafer W in the scanning direction (pitching amount). The difference of the $P_{check}1$ which is held for a predetermined period and the $P_{targ}$ which is equally held for the same period, in other words, the deviation of the pitching amount to the target value a predetermined period earlier is subtracted from the $P_{check}2$. With the $P_{check}2$, the scanning has proceeded 4 mm, and the area on the wafer W detected earlier by the focus sensors on the first and second row of the same column is similarly detected with the focus sensors located in the second and third row of the same column, the detection results being the pitching amount of the wafer W. And the difference between the $P_{check}1$ and the $P_{check}2$ is calculated, as the following error for pitching.

In this manner, when type B is selected on the basic sensor selection, the main controller 20 calculates the following error of the wafer W position in the Z axis direction (focus), tilt in the non-scanning direction (rolling), and tilt in the scanning direction (pitching). This calculation is based on the difference between the error to the target value predicted 4 mm in advance and the real time data that is obtained from the detection results of the focus sensors located in the illumination area.

In addition, the main controller 20 comprises the function of tracing the detection results of the selected focus sensors for each exposing shot areas with the selection unit 93. In this case, the trace can be stored of a state in which the offset applied to the photosensor D (image surface related, such as difference due to plus scan and minus scan) corresponding to each focus sensor S is subtracted from the detection result of each focus sensor serving as control results (0 is the optimum).

As can be seen from the description so far, in this embodiment, the substrate driving system is structured of the substrate table 18 and the wafer driving unit 21. And this substrate driving system, the stage control system 19, and the main controller 20 structures the substrate driving unit and adjustment system. Also, the Y stage 16, the substrate table 18, the wafer driving unit 21, the reticle stage RST, and the stage control system 19 structure the relative scanning unit.

Figure 20:
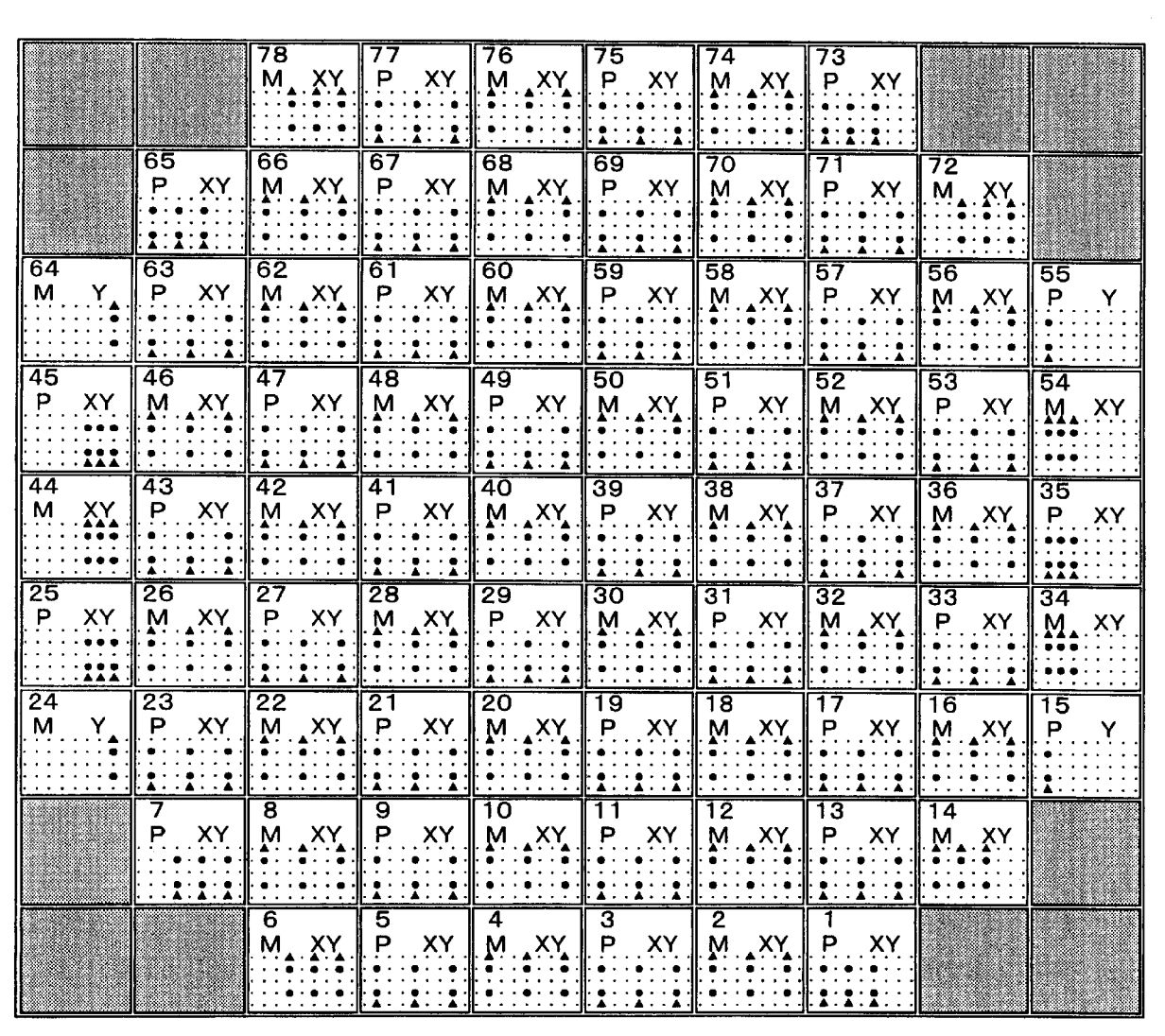

In addition, with the exposure apparatus 100 in this embodiment, as shown in FIG. 20, the exposure information on all the shot areas after exposure (including the selection information of focus sensors) is actually performed, is shown at once, on a display unit which structures the input/output device 94. Following is a brief description of what is displayed on screen, with reference to FIG. 20.

The number in each divided area (shot area) from 1 to 78, indicate the sequence of exposure, and the letters "P" or "M" under each number shows whether the shot area is subject to plus scan or minus scan. Also, the letter "X" or "XY" on the right hand side shows the state of leveling operation. That is, "X" indicates that only rolling is controlled in the shot area, and "XY" indicates the case where both rolling and pitching are controlled. And, the marks ● and ▲, on the lower half of the shot areas, show the position of the selected focus sensors. The ● represent the following sensors, whereas the ▲ represent either the prereading sensors or monitoring sensors.

It can be seen, from FIG. 20 that the interval between the selected sensors on both sides in the X direction covers almost all of the shot area in the X direction, and that XY leveling is also performed within the inward shot areas.

The display shown in FIG. 20 is an example, therefore the information shown is not limited to this, and various information on exposure can be shown of each shot area. For example, other than the leveling operation information, information on focus operation state (ON/OFF), scanning speed, and averaged amount of exposure and the like can be displayed. And the operator can select the items to be displayed via input devices such as keyboards.

With this embodiment, it is devised as is described above in various ways so that the area subject to leveling (at least rolling) is enlarged, whether it be around the center or on the circumferential portion of the wafer W, or whether it be plus scan or minus scan. This allows an optimum level of focus control and rolling control, thus can prevent a defocused state beyond the permissive level, which results in preventing the critical dimension (CD) variation by a macroscopic observation. To compensate for the phase delay of the substrate table 18, which is not a high response system, and also to accelerate the pre-exposing dynamic focusing on inward shot areas, focus and rolling control are performed by open control based on the detection result of the focus sensors in the first row. This open control is performed, with the surface calculated by the detection results of the focus sensors in the first row just before the exposure area IA and the focus sensors located within the exposure area IA as the target surface. Thus, in almost all cases, the reticle stage RST and the substrate stage can be alternately scanned on exposure from one side of the scanning direction to the other and then back, which is the most effective way to perform alternate scanning. Accordingly, the CD variation by a macroscopic observation can be prevented, in addition to the improvement in throughput. And, by preventing the CD variation by a macroscopic observation, a decrease in the resolution of the circuit pattern can be prevented, thus the decrease in the yield of the products manufactured (semiconductor devices) can be prevented, or even improve the yield.

Furthermore, on exposing an inward shot, when the unevenness of the surface of the shot area excludes the permissive value (for example, around 0.2–0.3[$\mu$m], 0.75 [$\mu$m] at the worst) and the pre-exposing dynamic focusing cannot be performed in time, the exposure for the shot area can be skipped by stopping the illumination of the light source, or closing the shutter of the illumination system so that the exposure light is not irradiated onto the substrate. And, as the recovery process, the shot area can be exposed by outward scanning. Besides this recovery process, alternatively, the exposure slit can first be moved to the center of the shot area, and static focusing is performed at that position. When the AF sensor is arranged outside the effective area, it is to be shifted so that it comes within the effective area. And, based on the measured values of static focusing, the inward scanning is repeated and exposure performed.

In the case of switching to an outward shot in the recovery process, when exposing the next shot area, the reticle stage RST and substrate table 18 need to be restored once, in order to resume the original exposure sequence and scanning direction.

Also, as is obvious with the description above, prereading by 4 mm is a standard in this embodiment. In the case where 4 mm is short for correction, it can be kept at the current level, however, when scanning is at a low speed and prereading by 4 mm is far too excessive for correction, following procedures can be taken.

That is, the main controller 20 calculates the target value delay time ($d_{delay}$), and when this value is positive, the control target value is delayed for $d_{delay}$. However, delaying only the height of the wafer surface Z at the prereading position by 4 mm for $d_{delay}$ causes the Z change around $d_{delay}$ to be an error. Therefore, when detecting the wafer at the prereading position by 4 mm, simultaneously, the encoder target value of the substrate table is to be calculated according to the encoder value of the table driving system and stored in memory. This allows the substrate table 18 to be driven by encoder servo after being delayed for $d_{delay}$.

Second Embodiment

The exposure apparatus related to the second embodiment of the present invention will be described below with reference to FIGS. 21 to 30. Structures and components identical or equivalent to those described in the first embodiment are designated with the same reference numerals, and the description thereabout is briefly made or is entirely omitted.

The structural arrangement of the exposure apparatus related to the second embodiment is identical to that of the exposure apparatus 100 which is described in the first embodiment, apart from the following different points: the number and the arrangement of the slit images being the detection points of the multiple focal position detection system (40, 42); the structure of the pattern forming plate 83, a light receiving slit plate 98, and a light receiving unit 90; and the number of channels n of the signal processing unit 91. And corresponding to these differences, operations such as the selection method of the detection points, function of control systems in focus leveling may differ from the exposure apparatus 100. The description below, of the exposure apparatus related to the second embodiment, is based on these differences in order to omit repetition as much as possible.

Figure 21:
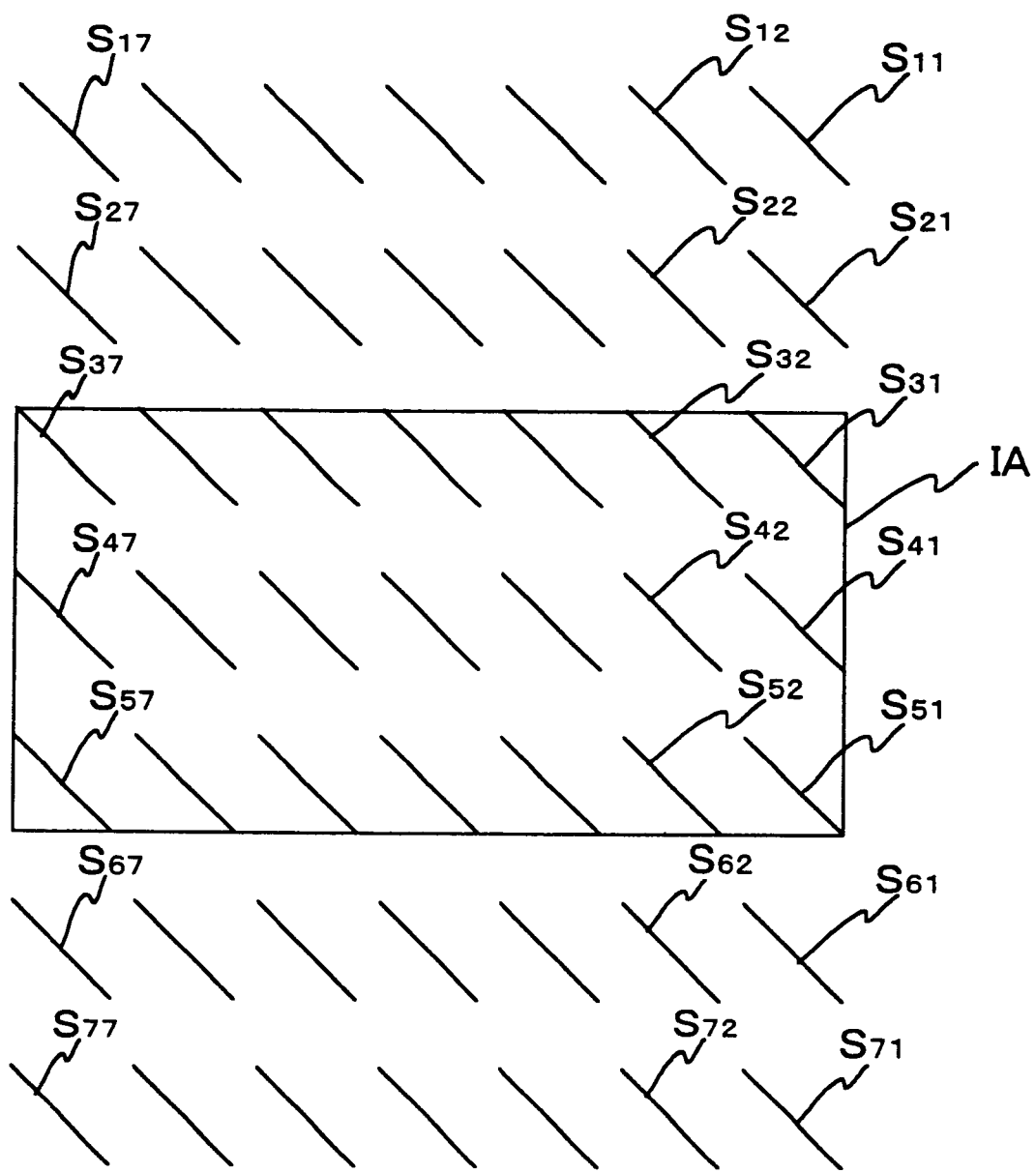
FIG. 21 is a view showing a positional relationship between the arrangement of the slit images (focus sensors) which are the respective detection points of the multiple focal position detection system related to the second embodiment and the exposure area.

On the pattern forming plate 83 (refer to FIG. 1) related to the second embodiment, 49 slit-shaped aperture patterns are formed in the shape of a matrix having 7 rows and 7 columns (not shown in FIG. 1). For this reason, in the second embodiment, close to the rectangular shaped exposure area IA on a predetermined area AS (for example, AS: 25 mm×around 10 mm) on the surface of the wafer W, as shown in FIG. 21, aperture pattern images in the shape of slits (slit images) are formed. These slit images $S_{11}$–$S_{77}$ are in the shape of a 7 row 7 column matrix, and a 7 by 7, that is, a total of 49 slit images are formed tilted by an angle of 45° degrees with respect to the X axis and Y axis. And they are arranged with, for example, a 3.3 mm interval in the X direction and a 4 mm interval in the Y direction.

On the light receiving unit 90 (refer to FIG. 1) related to the second embodiment, 49 photosensors (hereinafter referred to as photosensors $D_{11}$–$D_{77}$) which correspond to the slit images $S_{11}$–$S_{77}$ have an arrangement of a 7 row 7 column matrix. And on the light receiving slit plate 98 arranged in front of the light receiving unit 90, slits facing the respective photosensors are formed, and on these slits, the slit images $S_{11}$–$S_{77}$ are respectively re-imaged, as shown in FIG. 21. On this light receiving slit plate 98, the positions of the respective images re-imaged vibrate in a predetermined direction. And similar to the description earlier, by this operation, the detection signals of the respective photosensors $D_{11}$–$D_{77}$ are synchronously detected with the signals of the rotational vibration frequency, by a signal processing unit 91 via a selection unit 93. And a multiple of focus signals obtained by synchronous detection of the signal processing unit 91 is supplied to the main controller 20.

According to the description above, also with the second embodiment, the respective slit images $S_{11}$–$S_{77}$, which are detection points on the wafer W, each correspond to the respective photosensors $D_{11}$–$D_{77}$ of the light receiving unit 90. The Z axis positional information (focus information) of the surface of the wafer W at each slit image position can therefore be obtained according to the focus signal which is the output of each photosensor D. Therefore, in this embodiment, likewise for the sake of convenience, the slit images $S_{11}$–$S_{77}$ is hereinafter described as focus sensors, unless further reference is necessary.

The selection unit 93 related to the second embodiment (refer to FIG. 1) has the signal processing unit 91 connected, via for example, twelve output lines.

With the selection unit 93, in accordance with various criteria described as follows, any photosensors from $D_{11}$, $D_{12}$, . . . $D_{77}$ can be connected to a maximum of 12 output lines via a switched circuit. By this connection, an output signal of the photosensor (photocurrent corresponding to the intensity of light received by the photosensor D) is sent to the signal processing unit 91 via a preferred output line among the 12 output lines. That is, the selection unit 93 chooses a maximum of 12 photosensors out of 49. This, substantially is to choose a maximum of 12 focus sensors out of 49 focus sensors, in other words to choose the detection points to be used for focus leveling control of the wafer W and for confirming the controlled results.

In the second embodiment, similarly, with the selection unit 93, the first type (hereinafter referred to as "type A") focus sensor selection criteria to control the tilt of the wafer W, and the second type (hereinafter referred to as "type B") focus sensor selection criteria can be set. With type A, the tilt is controlled in the Y axis direction (a first direction) where the wafer W moves during the relative scanning, and in the X axis direction (a second direction) which is perpendicular to the Y axis direction. That is, pitching and rolling is controlled. And with type B, it has the priority on controlling the tilt in the X direction (rolling). The selection unit 93, according to the selection criteria set, chooses a maximum of 12 focus sensors out of 49 focus sensors used to control or confirm the results of control, as will be described later on.

The main controller 20 performs the setting of the focus sensor selection criteria (type A or type B) as described below. Alternatively, an operator can set the focus sensor selection criteria (type A or type B) via the input/output device 94 for each shot area on the wafer W, and the setting information can be sent from the main controller 20 to the selection unit 93.

Next, the selection of focus sensors by the selection unit 93 is described, which is performed after type A or type B is set of the focus sensor selection criteria.

Basic type sensor selection

The basic type sensor selection is basically performed by automatic judgement in accordance with the data on shot size, which is sent from the main controller 20 to the selection unit 93. It is performed when the shot area subject to exposure is a full shot located within the wafer W.

In the case of automatic judgement, the selection unit 93 judges whether the exposing shot area is an outward shot area, an inward shot area, or is neither of the two. This judgement is based on a shot map set in advance and stored in the RAM of the main controller 20.

And when the exposing shot area is an outward shot area, the first position, previously described, is to be the judgement position. In the case the exposure area IA is positioned at the first position, the focus sensors within the effective area of the wafer W are selected as will be described. And when the exposing shot area is an inward shot area, the selection unit 93 determines the second position as the judgement position. In the case the exposure are IA is positioned at this judgement position, the focus sensors within the effective area of the wafer W are selected as will be described. Also, when the exposing shot area is neither outward or inward, then when the exposure area IA is located almost at the center of the exposing shot area, the focus sensors within the effective area of the wafer W are selected as will be described.

Following is an example of the basic type sensor selection when performing exposure on a shot area having the size of 25 mm in the X direction.

Figure 22A:
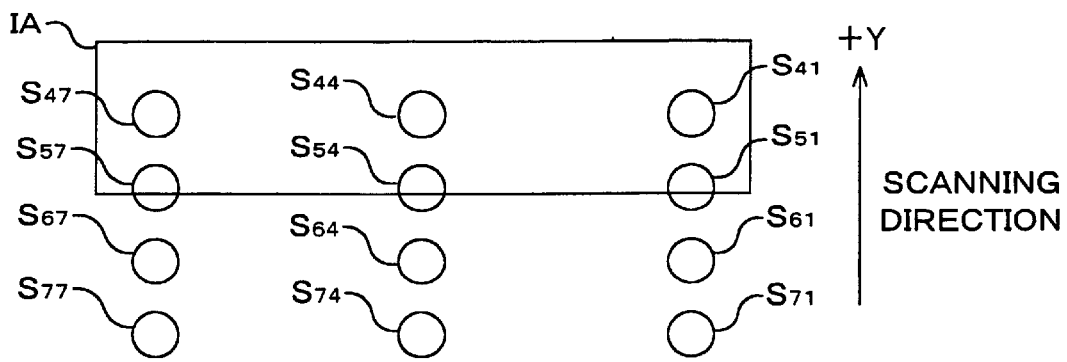
FIG. 22A and FIG. 22B shows the basic type sensors selection in the second embodiment when type A of the selection criteria is set.

First, the focus sensor selection criteria is set at type A, and the exposure area IA and the group of focus sensors are relatively scanned in the −Y direction with respect to the wafer W. That is, when the wafer is scanned in the +Y direction which is a plus scan, the selection unit 93 selects a total of 12 focus sensors as shown in FIG. 22A: $S_{71}$, $S_{74}$ and $S_{77}$, located in front of the exposure area IA in the first row; $S_{61}$, $S_{64}$ and $S_{67}$, located in front of the exposure area IA in the second row; $S_{51}$, $S_{54}$ and $S_{57}$, located within the exposure area IA in the first row (third row in general); and $S_{41}$, $S_{44}$ and $S_{47}$, located within the exposure area IA in the second row (fourth row in general).

Figure 22B:
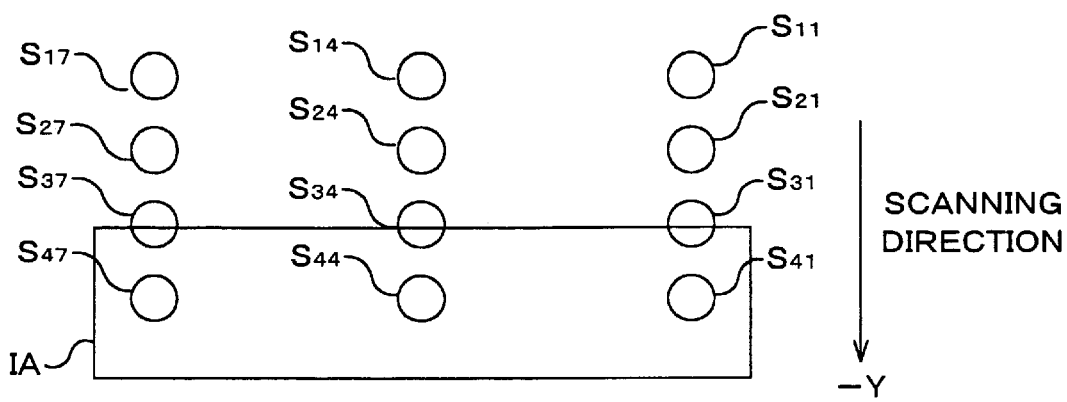

Also, when the focus sensor selection criteria is set at type A, and the exposure area IA and the group of focus sensors are relatively scanned in the +Y direction with respect to the wafer W, that is, the wafer is scanned in the −Y direction which is a minus scan, the selection unit selects a total of 12 focus sensors as shown in FIG. 22B: $S_{11}$, $S_{14}$ and $S_{17}$, located in front of the exposure area IA in the first row; $S_{21}$, $S_{24}$ and $S_{27}$, located in front of the exposure area IA in the second row; $S_{31}$, $S_{34}$ and $S_{37}$, located within the exposure area IA in the first row (third row in general); and $S_{41}$, $S_{44}$ and $S_{47}$, located within the exposure area IA in the second row (fourth row in general).

In these cases, as can be seen from FIG. 22A and FIG. 22B, four sets of focus sensors are selected as focus sensors on both edges. These sensors fit within the range of the width in the X direction of the shot, and the interval between the sensors is at a maximum. Among the focus sensors selected, the focus sensors in the first row are used solely for pre-exposing dynamic focusing (to hold the target value) when exposing an inward shot. The focus sensors in the second row are used for prereading control, and focus sensors in the third and fourth rows are used for follow-up control. Accordingly, when type A is selected in the focus sensor selection criteria, focus sensors capable of controlling position and posture in directions of three degrees of freedom are selected. In other words, focus sensors prereading by 4 mm and which can control the position of the wafer W with respect to the optical axis direction (Z axis direction) of the projection optical system PL, the tilt in the X axis direction (rolling) and the tilt in the Y axis direction (pitching) are selected.

Alternatively, when the same focus sensors are selected as of the type A selection criteria as described above, the sensors in the first row can be used solely for prereading control, the second and third row can be used for follow-up control, and the fourth row for monitoring control errors. In this case, consequently, prereading is 8 mm, and the position of the wafer W with respect to the optical axis direction (Z axis direction) of the projection optical system PL, the tilt in the X axis direction (rolling) and the tilt in the Y axis direction (pitching) can be controlled. That is, focus sensors capable of controlling position and posture in directions of three degrees of freedom are selected. In this case, the focus sensors in the first row is used not only for pre-exposing dynamic focusing (to hold the target value) when exposing an inward shot, but is also used for controlling the successive update of the target value.

Figure 23A:
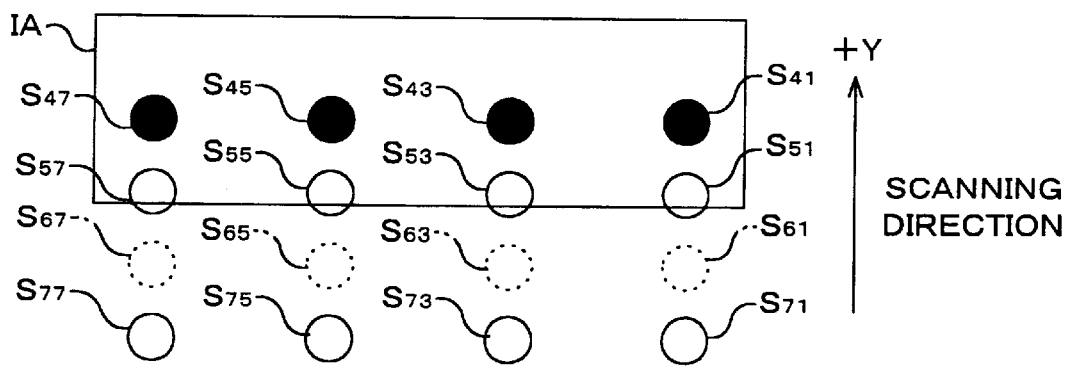
FIG. 23A and FIG. 23B shows the basic type sensors selection in the second embodiment when type B of the selection criteria is set.

On the other hand, when the focus sensor selection criteria is set at type B, in the case of plus scan, the selection unit 93 chooses a total of 12 focus sensors as shown in FIG. 23A: $S_{71}$, $S_{73}$, $S_{75}$, and $S_{77}$ being the first row located before the exposure area IA; $S_{51}$, $S_{53}$, $S_{55}$, and $S_{57}$ being the first row located in the exposure area IA (the third row in general); and $S_{41}$, $S_{43}$, $S_{45}$, and $S_{47}$ being the second row located in the exposure area IA (the fourth row in general).

Figure 23B:
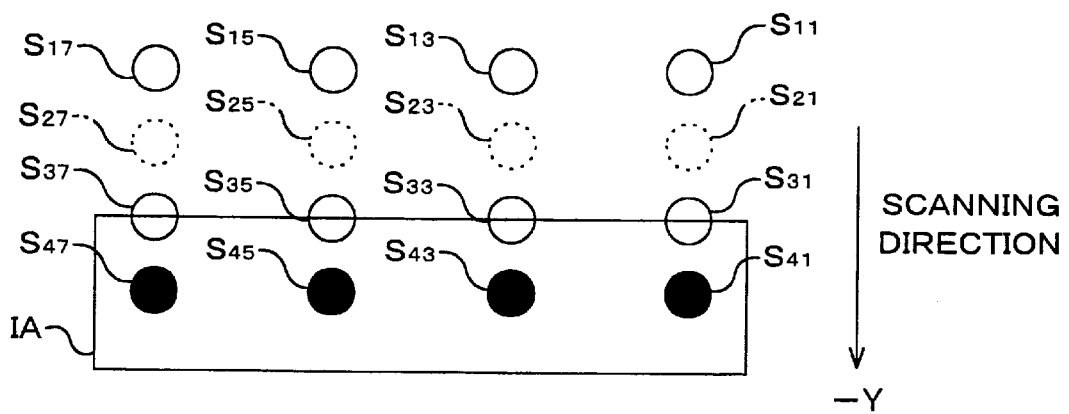

Also, in the case of minus scanning, the selection unit 93 chooses a total of 12 focus sensors as shown in FIG. 23B: $S_{11}$, $S_{13}$, $S_{15}$, and $S_{17}$ being the first row located before the exposure area IA; $S_{31}$, $S_{33}$, $S_{35}$, and $S_{37}$ being the first row located in the exposure area IA (the third row in general); and $S_{41}$, $S_{43}$, $S_{45}$, and $S_{47}$ being the second row located in the exposure area IA (the fourth row in general).

The focus sensors in the first and third rows of FIGS. 23A and 23B indicated by white circles (○) are used for controlling, whereas the focus sensors in the fourth row are used for confirming the controlled results. Also, as can be seen from FIG. 23A and FIG. 23B, three sets of focus sensors are selected as focus sensors on both edges of the shot area. These sensors fit within the range of the width in the X direction, and the interval between the sensors is at a maximum. In this case, the focus sensors in the first row are used solely for pre-exposing dynamic focusing (holding the target value) when exposing an inward shot. The focus sensors in the third row are used for follow-up control, and the third row is the reference row for prereading. Consequently, when the focus sensor selection criteria are set at type B, focus sensors capable of controlling position and posture in directions of two degrees of freedom are selected. That is, the 4 mm prereading can be controlled, as well as the position of the wafer W with respect to the optical axis direction (Z axis direction) of the projection optical system PL, the tilt in the X axis direction (rolling).

Figure 24A:
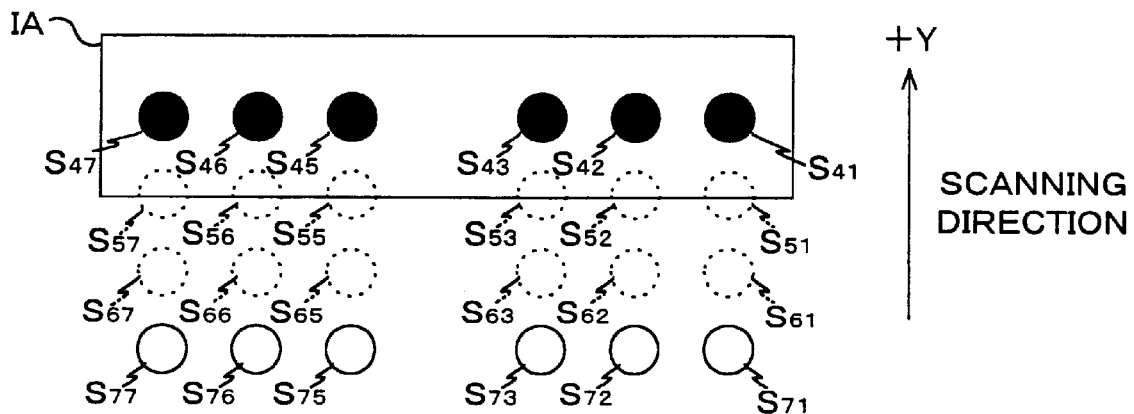
FIG. 24A and FIG. 24B shows another example of the basic type sensors selection in the second embodiment when type B of the selection criteria is set.
Figure 24B:
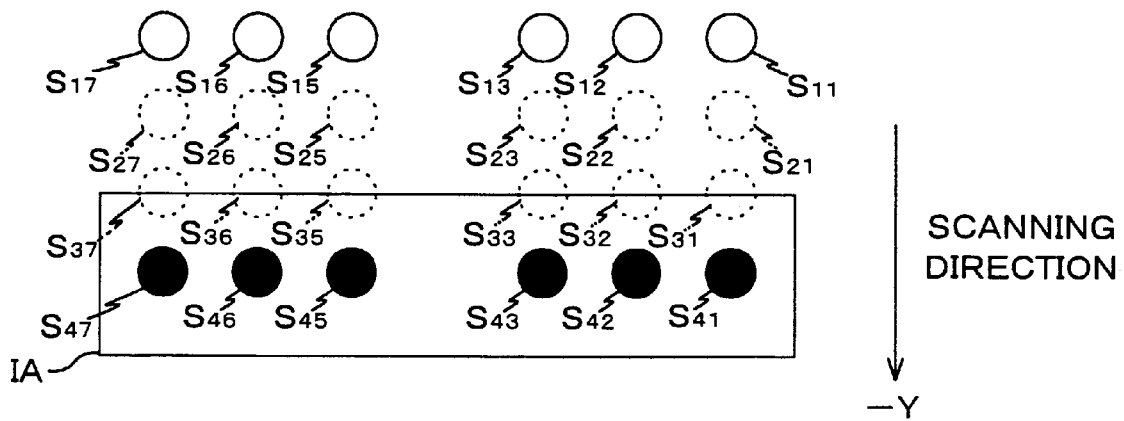

Furthermore, when the selection of the focus sensors of type B is made, alternative to the focus selection described above, the following sensors can be selected. That is, in the case of plus scan, as shown in FIG. 24A, the selection unit 93 can select the twelve focus sensors: $S_{71}$, $S_{72}$, $S_{73}$, $S_{75}$, $S_{76}$, and $S_{77}$ being the first row located before the exposure area IA; and $S_{41}$, $S_{42}$, $S_{43}$, $S_{45}$, $S_{46}$, and $S_{47}$ being the second row located in the exposure area IA (the fourth row in general). And in the case of minus scan, as shown in FIG. 24B, the selection unit 93 can select the twelve focus sensors: $S_{11}$, $S_{12}$, $S_{13}$, $S_{15}$, $S_{16}$, and $S_{17}$ being the first row located before the exposure area IA; and $S_{41}$, $S_{42}$, $S_{43}$, $S_{45}$, $S_{46}$, and $S_{47}$ being the second row located in the exposure area IA (the fourth row in general).

The focus sensors in the first row of FIGS. 24A and 24B indicated by white circles (○) are used for controlling, whereas the focus sensors in the fourth row are used for confirming the controlled results. Also, as can be seen from FIG. 24A and FIG. 24B, two sets of focus sensors are selected as focus sensors on both edges of the shot area. These sensors fit within the range of the width in the X direction, and the interval between the sensors is at a maximum. In this case, the focus sensors in the first row are used solely for pre-exposing dynamic focusing (holding the target value) when exposing an inward shot, and is the reference row for prereading. Accordingly, in this case, the prereading is by 12 mm, and focus sensors, which are capable of controlling position and posture in directions of two degrees of freedom, are selected. That is, the position of the wafer W with respect to the optical axis direction (Z axis direction) of the projection optical system PL, the tilt in the X axis direction (rolling) can be controlled.

In addition, when type B is set as the focus sensor selection criteria, focus selection can be made so that the second row located before the exposure area IA is set as the reference row for prereading, in this case, by 8 mm. For example, in FIGS. 23A and 23B, instead of selecting the focus sensors in the third row, the sensors in the second row can be selected. This allows a selection of focus sensors performing complete prereading and control of position and posture in directions of two degrees of freedom, that is the position of the wafer W with respect to the optical axis direction (Z axis direction) of the projection optical system PL, the tilt in the X axis direction (rolling).

Furthermore, also in the second embodiment, other than the basic type sensor selection performed by automatic judgement in accordance with the shot size as described earlier, the operator or a user may manually select the desired basic type sensor via the input/output device 94. However, in this case, it is preferable for the apparatus to indicate an error message, when a selection is made where the performance of the apparatus is not sufficient.

The setting of the selection criteria of the basic type sensor performed by the main controller 20 is described below. As is obvious from the earlier descriptions, in the second embodiment, based on the setting of the basic type sensor by the main controller 20, the selection unit 93 can switch the focus sensors from operating as the adjustment system (focus leveling control system) which controls the position of the wafer W in the Z direction and the tilt with respect to the XY plane, to confirming the controlled results. This switching can be performed on specific focus sensors arranged in the exposure area IA such as $S_{41}$ and $S_{47}$. That is, in the second embodiment, the main controller 20 and the selection unit 93 structure a switching system.

For example, in the case the switching system switches the specific sensors arranged in the exposure area IA to control the adjustment system, that is, the selection unit 93 selects the basic type sensor type A (see FIGS. 22A and 22B), the adjustment system adjusts the positional relationship of the image surface of the projection optical system PL and the surface of the wafer in accordance with the positional information of the wafer surface with respect to the optical axis direction (the Z axis direction) of the projection optical system PL by the increased number of focus sensors. Therefore, focus leveling control is performed, with the target surface to average the unevenness of the surface of the wafer W in the entire shot area subject to exposure. And, when the switching system switches the specific focus sensors arranged in the exposure area IA so that the controlled results of focus leveling can be confirmed, that is, the selection unit 93 selects the basic type sensor, type B (see FIGS. 22A and 22B), focus leveling control is performed with priority on the tilt of the wafer in the non-scanning direction.

In this case, also with the second embodiment, the main controller 20 can switch the operation of the focus sensor in accordance with, for example, the type of reticle pattern to be transferred onto the shot area subject to exposure. That is, the main controller 20 can set the selection criteria of the basic type sensor. The main controller 20 can also switch the operation of the focus sensor, or set the selection criteria of the basic type sensor based on whether the shot area subject to exposure is located in the circumferential portion on the wafer W.

Also, with the second embodiment, on exposing shot areas that are chipped, that is, when exposure is performed on shot areas other than a full shot area, the selection unit 93 similarly performs the column shift as in the first embodiment when the column shift execution mode is set up.

Next, focus leveling control during the relative scanning of the reticle R and wafer W, with respect to the projection optical system PL to transfer the pattern of the reticle onto the respective shot areas is described.

First, the case where the exposing shot area is a full shot is described. When exposing a full shot, in fore-edge positioning or during scanning exposure, in either case, focus leveling control is performed as is with the first embodiment.

The detailed description will be omitted, however, the arrangement of the respective control systems, in the second embodiment to drive the position of the substrate table 18 in the Z axis direction, to drive the rolling (the tilt in the non-scanning direction), and the pitching (tilt in the scanning direction) is identical to the first embodiment.

Next, the case where the exposing shot area is an inward shot, a chipped shot, and the basic sensor selection is type A, is described with reference to FIGS. 25A to 25C. In these FIGS., the white circles (○) indicate selected sensors that are not used for control, and the black circles (●) indicate the selected sensors being used for control. Also, the reference EE shows the outer rim of the effective area of the wafer W. In actual, the exposure area IA and the group of selected focus sensors are fixed and the wafer W is the one moving, however, for the sake of convenience, the exposure area IA and the group of selected focus sensors are hereinafter described to be moving instead of the wafer.

(1) The reticle R and the wafer W are relatively scanned along the Y axis direction. After a predetermined time has elapsed since starting the relative scanning, as shown in FIG. 25A, the focus sensor $S_{77}$ which is located in the first row in the first column on the left hand side enters the effective area of the wafer W. The main controller 20 then drives the substrate table 18 in the Z axis direction, by open control (the first controlled state), via the stage control system 19 and the wafer driving unit 21. This control is performed based on the Z position information of the surface of the wafer W (information on the distance between the surface of the wafer W and the image surface of the projection optical system PL (hereinafter appropriately referred to as (the detection result of the focus sensor)), which are based on the focus signals FS corresponding to the focus sensor $S_{59}$. With this open control, a target value is calculated based on the detection result of the focus sensor $S_{59}$ and the output value of an encoder (not shown in FIGS., hereinafter suitably referred to as a "driving system encoder") which detects the respective driving amounts of the three axes supporting the substrate table 18. The target value is held, and the substrate table 18 is driven in the Z direction by the encoder servo until the output value of the driving system encoder reaches the target value. In the following description, as well, the term "open control" is used for encoder-servo control, which is performed holding the target value as appropriate.

Figure 25A:
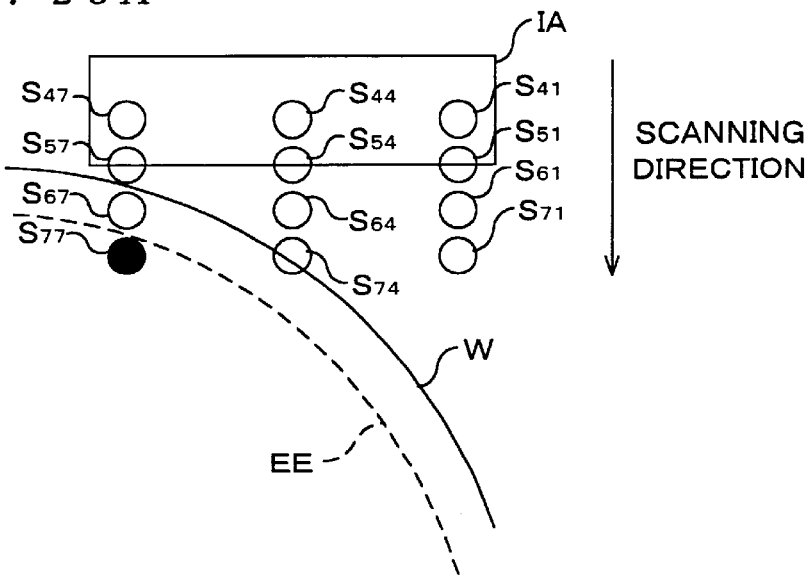
FIGS. 25A to 25C are views to explain the flow of the first stage of focus leveling control on an inward shot in the second embodiment.
Figure 25B:
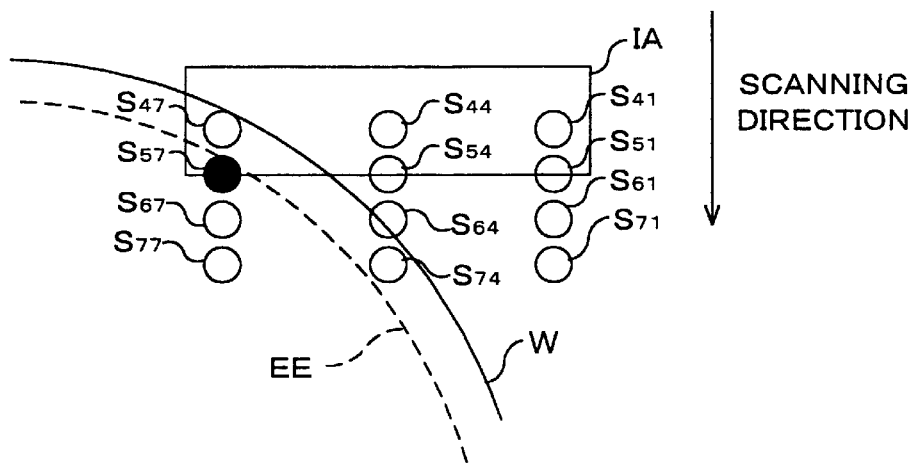

(2) As the exposure area IA and the group of selected sensors proceed from the state shown in FIG. 25A in the scanning direction, the focus sensor $S_{57}$ which is located in the third row in the first column on the left hand side enters the effective area of the wafer W as shown in FIG. 25B. After a predetermined period of time has elapsed, the main controller 20 then drives the substrate table 18 in the Z axis direction, by encoder closed loop control (the second controlled state) to correct the defocus amount which is obtained based on the Z position information of the surface of the wafer W. The Z position information is the detection result of the focus sensor $S_{57}$.

In other words, the main controller 20 successively calculates the driving system encoder target value based on the detection result (error) of the multiple focal position detection system (40, 42) at the detection point and the output value of the driving system encoder. It then inputs the driving system encoder target value into the substrate driving system after delaying it for a predetermined period of time. The substrate driving system, with respect to the target value performs closed loop control with the driving system encoder, and controls the Z position of the wafer W by successively changing the target value.

Figure 25C:
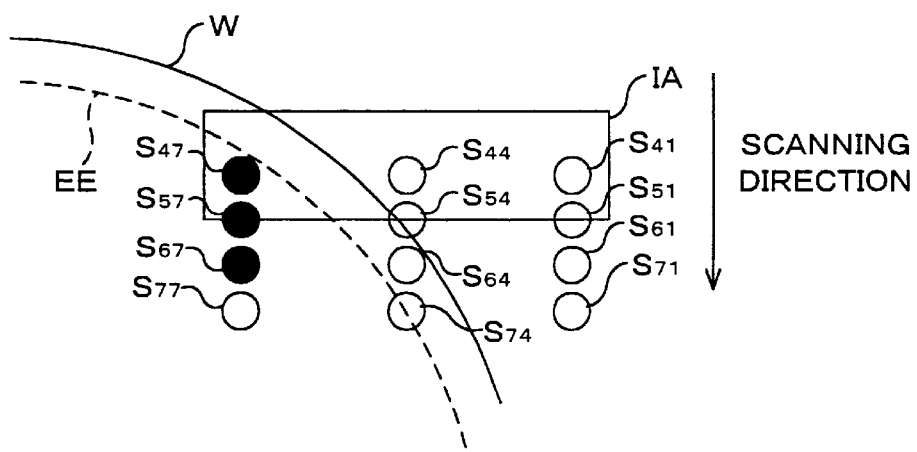

(3) As the exposure area IA and the group of selected sensors further proceed from the state shown in FIG. 25B in the scanning direction, all the selected sensors $S_{77}$, $S_{67}$, $S_{57}$, and $S_{47}$ located in the first column on the left hand side enter the effective area of the wafer W as shown in FIG. 25C. After a predetermined period of time has elapsed, the main controller 20 then performs encoder closed loop control (the third controlled state) to correct the defocus and pitching error and controls the position of the substrate table 18 in the Z axis direction and the tilt in the scanning direction. The control is performed based on the detection results of the respective focus sensors $S_{67}$, $S_{57}$, and $S_{47}$, which are located in the second, third, and fourth row in the first column on the left hand side.

That is, the main controller 20 successively calculates the driving system encoder target value based on the detection result (error) of the multiple focal position detection system (40, 42) at the detection point and the output value of the driving system encoder. It then inputs the driving system encoder target value into the substrate driving system after delaying it for a predetermined period of time. The substrate driving system, with respect to the target value performs closed loop control with the driving system encoder, and controls the Z position of the wafer W and the tilt in the scanning direction (pitching) by successively changing the target value.

Figure 26A:
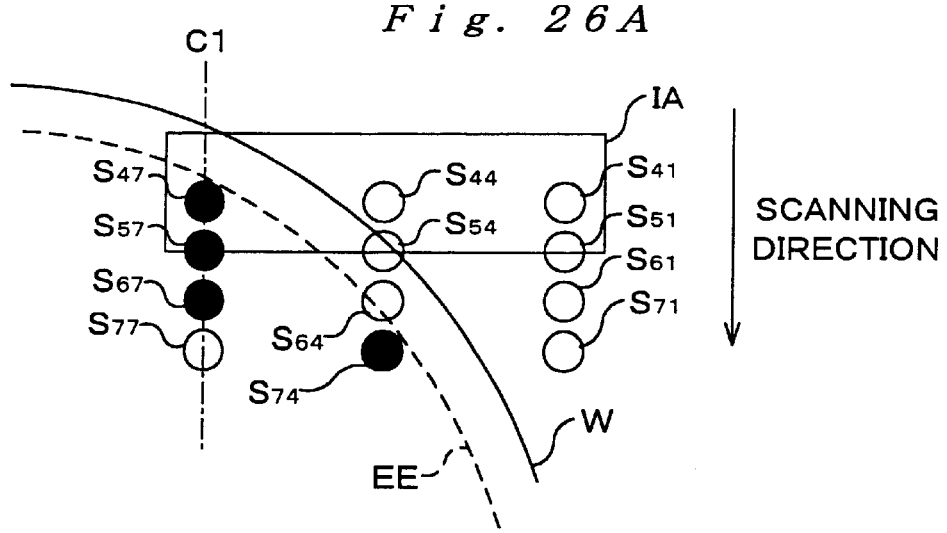
FIGS. 26A to 26C are views to explain the flow of the second stage of focus leveling control on an inward shot in the second embodiment.

(4) When the exposure area IA and the group of selected sensors further proceed from the state shown in FIG. 25C in the scanning direction, the focus sensor $S_{74}$ that is located in the first row in the second column enters the effective area of the wafer W as shown in FIG. 26A. The main controller 20, then performs closed control of the position of the substrate table 18 in the Z axis direction and the tilt in the scanning direction (pitching) based on the detection results of the focus sensors $S_{67}$, $S_{57}$, and $S_{47}$. Also, the detection result of the focus sensor $S_{74}$ is held, and based on the averaged value of the detection result $Z_{74}$ of the focus sensor $S_{74}$ and the detection results $Z_{67}$, $Z_{57}$, and $Z_{47}$ of the focus sensors $S_{67}$, $S_{57}$, and $S_{47}$, the target value to correct the tilt of the wafer W in the non-scanning direction (rolling) is obtained. And based on this target value, the rolling control of the substrate table 18 is performed by open control. In this case, the center of the rolling control (rotational axis) is the axis C1 shown in FIG. 26A. The detection result $Z_{74}$ obtained when the focus sensor $S_{74}$ enters the effective area and the encoder rolling target value obtained by the output of the encoder is held, and controlled until the focus sensor $S_{54}$ enters the effective area. However, as for the Z target value, the encoder target value is successively updated by the averaged value of the detection results $Z_{67}$, $Z_{57}$, and $Z_{47}$ of the focus sensors $S_{67}$, $S_{57}$, and $S_{47}$ and by the encoder output value, and then input to the substrate driving system after a predetermined time delay, and is controlled by encoder-servo control.

Figure 26B:
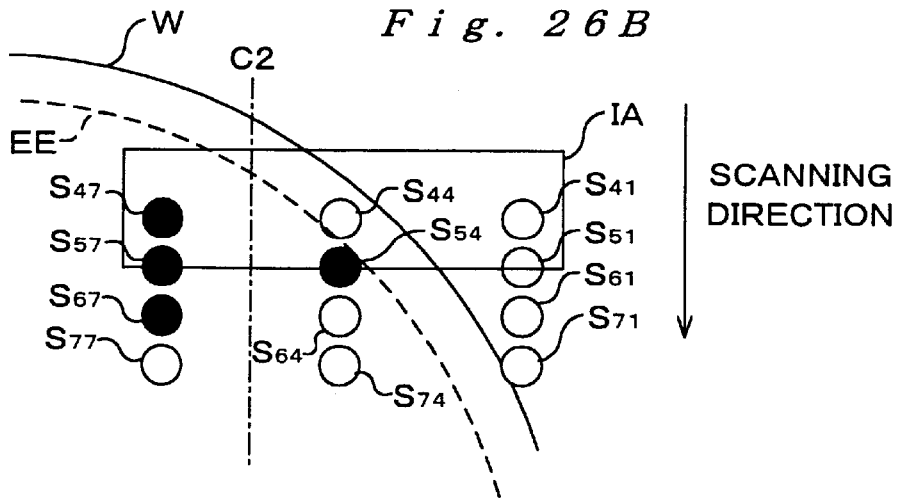

(5) When the exposure area IA and the group of selected sensors further proceed from the state shown in FIG. 26A in the scanning direction, the focus sensor $S_{54}$ that is located in the third row in the second column enters the effective area of the wafer W as shown in FIG. 26B, and the detection result of the focus sensor $S_{54}$ is used to calculate the encoder target value. The Z error, is the averaged value of the Z detection results in the respective columns. That is, $\{(Z_{67}+Z_{57}+Z_{47})/3+Z_{54}\}/2$. The encoder value is calculated so that the error of Z becomes zero, and encoder-servo control is performed on the substrate table 18 by delaying the input of the encoder target value for a predetermined period of time. The main controller 20 controls the tilt of the substrate table 18 in the non-scanning direction (rolling), while performing encoder closed loop control on the substrate table 18 to control the Z axis position and the tilt in the scanning direction (pitching). The rolling error, in this case, can be obtained in the following equation;

$$\{(Z_{67}+Z_{57}+Z_{47})/3-Z_{54}\}$$

and the encoder value is calculated so that the error of Z becomes zero, and encoder-servo control is performed on the substrate table 18 by delaying the input of the encoder target value for a predetermined period of time. The center of the rolling control is the axis C2 shown in FIG. 26B.

Figure 26C:
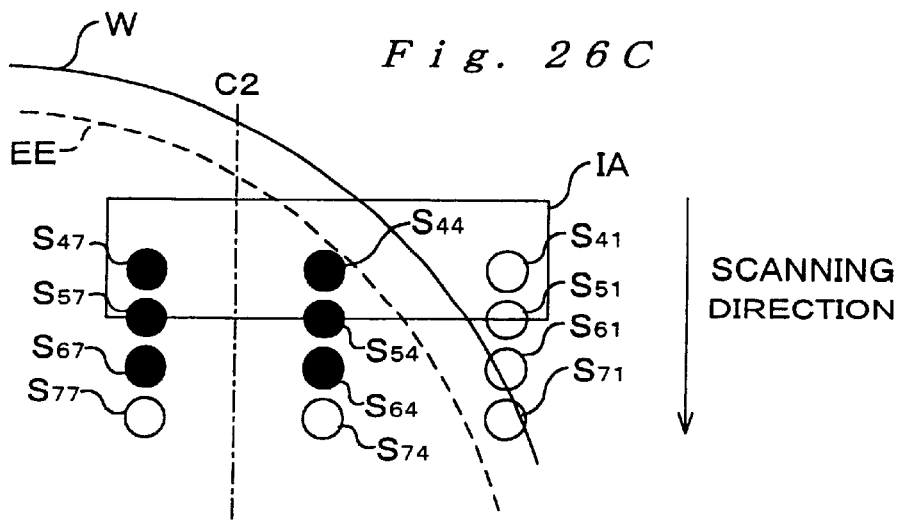

(6) As the exposure area IA and the group of selected sensors further proceed from the state shown in FIG. 26B in the scanning direction, all the selected focus sensors located in the first and second column enter the effective area of the wafer W as shown in FIG. 26C. The main controller 20 then calculates the Z error based on the detection results $Z_{67}$, $Z_{57}$, $Z_{47}$, $Z_{67}$, $Z_{54}$, and $Z_{44}$ of the focus sensors $S_{67}$, $S_{57}$, $S_{47}$, $S_{64}$, $S_{54}$, and $S_{44}$, which are located in the second, third, and fourth row of the first and second column. The Z error is the averaged value of the Z detection results in the respective columns. That is;

$$\{(Z_{67}+Z_{57}+Z_{47})/3+(Z_{64}+Z_{54}+Z_{44})/3\}/2.$$

The encoder value is calculated so that the error of Z becomes zero, and encoder-servo control is performed on the substrate table 18 by delaying the input of the encoder target value for a predetermined period of time. The rolling error is calculated by;

$$\{(Z_{67}+Z_{57}+Z_{47})/3-(Z_{64}+Z_{54}+Z_{44})/3\}$$

and the pitching error;

$$\{(Z_{67}+Z_{64})/2-(Z_{47}+Z_{44})/2\}$$

The encoder value is calculated so that these errors become zero, and by delaying the input of the encoder target value for a predetermined period of time encoder-servo control is performed on the substrate table 18. And the main controller 20 performs encoder closed control of the position of the substrate table 18 in the Z axis direction, the tilt in the scanning direction (pitching), and the tilt in the non-scanning direction (rolling).

Such control is expressed as the following equation when Z error, rolling error, and pitching error are respectively $Z_{targ}$, $R_{targ}$, and $P_{targ}$:

$$Z_{targ}=(Z_{67}+Z_{57}+Z_{47}+Z_{64}+Z_{54}+Z_{44})/6-Pt_{cmp}$$

$$R_{targ}=(Z_{67}+Z_{57}+Z_{47})/3-(Z_{64}+Z_{54}+Z_{44})/3$$

$$P_{targ}=(Z_{67}+Z_{64})/2-(Z_{47}+Z_{44})/2$$

The encoder value is calculated so that these errors become zero, and encoder-servo control is performed on the substrate table 18 by delaying the input of the encoder target value for a predetermined period of time. The center of the rolling control is the axis C2 shown in FIG. 26C.

Figure 27A:
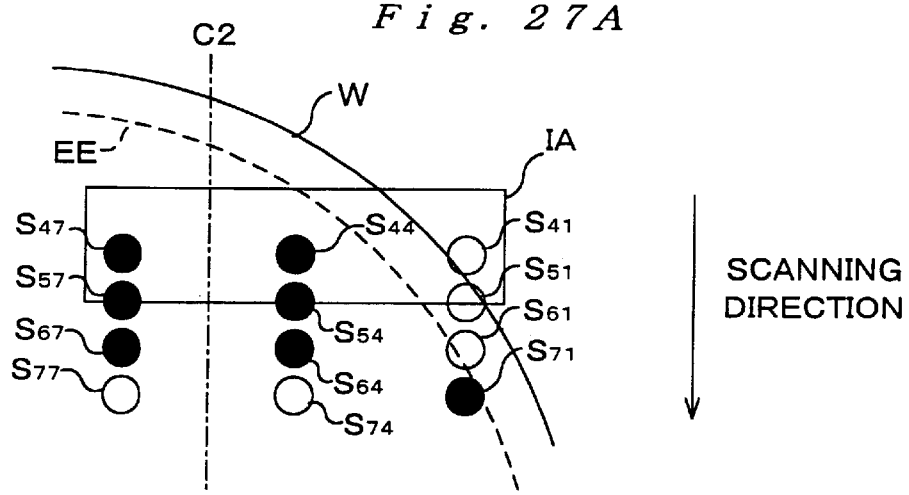
FIGS. 27A to 27C are views to explain the flow of the third stage of focus leveling control on an inward shot in the second embodiment.

(7) When the exposure area IA and the group of selected sensors further proceed from the state shown in FIG. 26C in the scanning direction, the focus sensor $S_{71}$ that is located in the first row in the third column from the left (first column from the right) enters the effective area of the wafer W as shown in FIG. 27A. Then the main controller 20 holds the detection result of the focus sensor $S_{71}$ while performing the encoder closed control of the position of the substrate table 18 in the Z axis direction, the tilt in the scanning direction (pitching). And based on the detection result $S_{71}$ and the detection results $Z_{67}$, $Z_{57}$, $Z_{47}$, $Z_{64}$, $Z_{54}$, and $Z_{44}$ of the focus sensors $S_{67}$, $S_{57}$, $S_{47}$, $S_{64}$, $S_{54}$, and $S_{44}$ the target value to correct the tilt of the wafer W in the non-scanning direction (rolling) is obtained. And based on this target value, the rolling control of the substrate table 18 is performed by open control. As for rolling control, the error is calculated as;

$$\{(Z_{67}+Z_{57}+Z_{47})/3-(Z_{64}+Z_{54}+Z_{44})/3\}/2-Z_{71}$$

and the encoder value to make the error null is held, and the rolling is driven by open control with axis C2 as the center. The update of the encoder target value in the rolling direction is performed when the focus sensor $S_{51}$ enters the effective area. In this case, the detection result of the focus sensor $S_{71}$ is not used to calculate the Z error and pitching error.

Figure 27B:
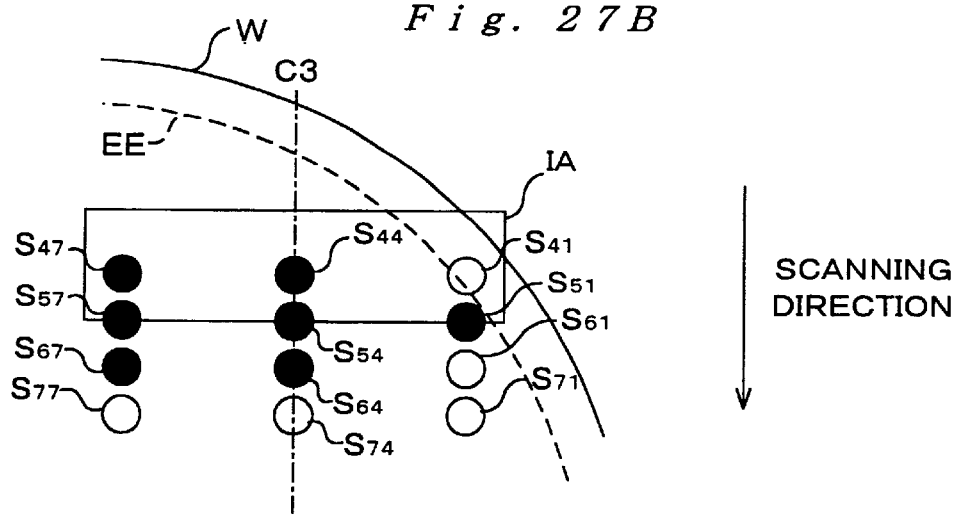

(8) As the exposure area IA and the group of selected sensors further proceed from the state shown in FIG. 27A in the scanning direction, the focus sensor $S_{51}$ that is located in the third row in the third column from the left (first column from the right) enters the effective area of the wafer W as shown in FIG. 27B. While the main controller 20 continues the closed control of the substrate table 18 to control the Z axis position and the tilt in the scanning direction (pitching), it also changes the rolling control of the substrate table 18 to a closed control based on the difference between the averaged detection result of the focus sensors $S_{47}$, $S_{57}$, and $S_{67}$ in the second, third and fourth row in the first column from the left and the detection result of the focus sensors $S_{47}$ on the third row in the third column. In this case, when the Z error, rolling error, and pitching error is respectively $Z_{targ}$, $R_{targ}$, and $P_{targ}$, then:

$$Z_{targ}=\{(Z_{67}+Z_{57}+Z_{47})/3+(Z_{64}+Z_{54}+Z_{44})/3+Z_{51}\}/3Pt_{cmp}$$

$$R_{targ}=Z_{51}-(Z_{67}+Z_{57}+Z_{47})/3$$

$$P_{targ}=(Z_{64}+Z_{67})/2-(Z_{44}+Z_{47})/2$$

The encoder values are calculated so that these errors become zero, and encoder-servo control is performed on the substrate table 18 by delaying the input of the encoder target value for a predetermined period of time. The center of the rolling control is the axis C3 shown in FIG. 27B.

Figure 27C:
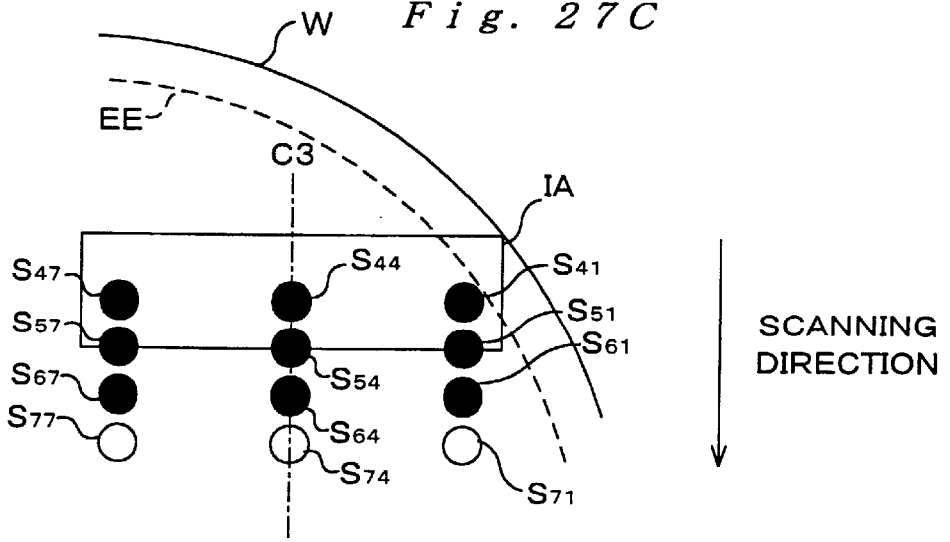

(9) As the exposure area IA and the group of selected sensors further proceed from the state shown in FIG. 27B in the scanning direction, all the selected focus sensors enter the effective area of the wafer W as shown in FIG. 27C. The main controller 20 then controls the position of the substrate table 18 in the Z axis direction, the tilt in the scanning direction (pitching), and the tilt in the non-scanning direction (rolling) by the encoder servo closed loop control. This control is performed based on the detection results $Z_{67}$, $Z_{57}$, $Z_{47}$, $Z_{64}$, $Z_{54}$, $Z_{44}$, $Z_{61}$, $Z_{51}$, and $Z_{41}$ of the focus sensors $S_{67}$, $S_{57}$, $S_{47}$, $S_{64}$, $S_{54}$, $S_{44}$, $S_{61}$, $S_{51}$ and $S_{41}$, which are located in the second, third, and fourth row of the first, second, and third column.

Such control is performed with the errors:

$$Z_{targ}=(Z_{67}+Z_{57}+Z_{47}+Z_{64}+Z_{54}+Z_{44}+Z_{61}+Z_{51}+Z_{41})/9-Pt_{cmp}$$

$$R_{targ}=(Z_{61}+Z_{51}+Z_{41})/3-(Z_{67}+Z_{57}+Z_{47})/3$$

$$P_{targ}=(Z_{61}+Z_{64}+Z_{67})/3-(Z_{41}+Z_{44}+Z_{47})/3$$

The encoder values are successively calculated so that these errors become zero, and encoder-servo control is performed on the substrate table 18 by delaying the input of the encoder target value for a predetermined period of time. In this case, the center of the rolling control is the axis C3 shown in FIG. 27C.

The description above is of the case when the selected sensors are arranged at an equivalent interval, and, when interval is not equivalent, the rolling control method is as described in the first embodiment.

Also, in the second embodiment, the pitching control of the wafer W is performed independent of the rolling control.

Since the focus leveling control is performed on exposure of an inward shot which is a chipped shot area as described, the pre-exposing dynamic focusing of an inward shot can be accelerated, compared with the exposure apparatus in the first embodiment. And, after the pre-exposing dynamic focusing has been completed, focus control can be performed by high precision based on encoder closed control, and when pitching control becomes possible during the encoder closed control, then pitching control is also performed by the encoder closed control. Accordingly, in the second embodiment, on exposing an inward shot that is a chipped shot, the adjustment of the position of the substrate table 18 in the Z axis direction, or in addition, the tilt in the scanning direction (pitching) can be made with high precision. Therefore, other than when an extremely particular shot arrangement is employed, a so-called alternate scanning can be performed to expose the entire wafer with at least Z control performed, and lack of uniformity caused by defocus can be efficiently suppressed, thus possible to maintain a substantially high throughput.

Furthermore, similar to the first embodiment, in addition to the pre-exposing dynamic focusing the tilt of the wafer W in the non-scanning direction (rolling) which is the cause of defocus can be set at a proximate level to the target value. Accordingly, as for focus and rolling, control delay when exposing of an inward shot area can be prevented.

Next, the case where the exposing shot area is an outward shot, a chipped shot, and the basic sensor selection is type A, is described with reference to FIGS. 28A to 30C. In these FIGS., the white circles (○) indicate selected sensors that are not used for control, and the black circles (●) indicate the selected sensors being used for control. Also, the reference EE shows the outer rim of the effective area of the wafer W.

Figure 28A:
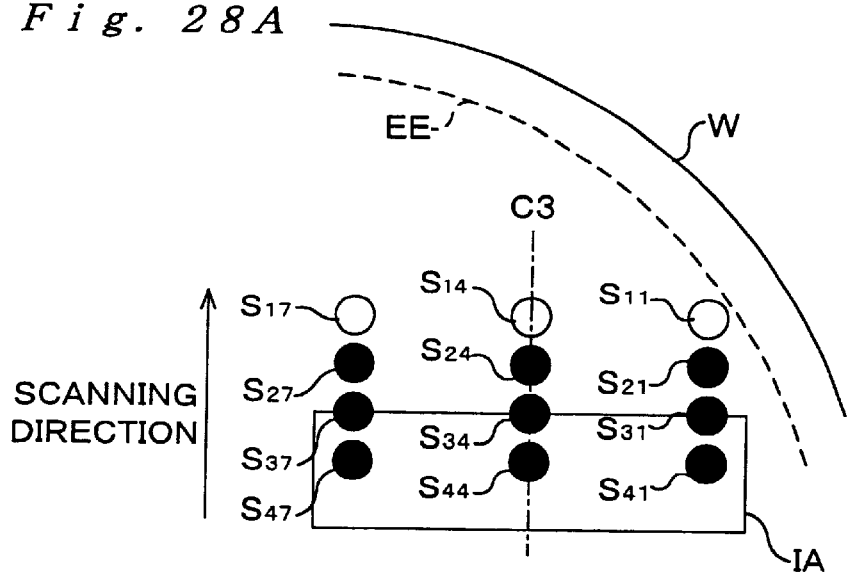
FIGS. 28A to 28C are views to explain the flow of the first stage of focus leveling control on an outward shot in the second embodiment.

(a) In this case, likewise, the reticle R and the wafer W are relatively scanned in the Y axis direction. The selected focus sensors are all within the effective area of the wafer W from the start of scanning as shown in FIG. 28A. Therefore, the main controller 20 performs closed control of the position of the substrate table 18 in the Z direction, the tilt in the scanning direction (pitching), and the tilt in the non-scanning direction (rolling). The control is based on the detection results $Z_{21}$, $Z_{31}$, $Z_{41}$, $Z_{24}$, $Z_{34}$, $Z_{44}$, $Z_{27}$, $Z_{37}$, and $Z_{47}$ of the focus sensors $S_{21}$, $S_{31}$, $S_{41}$, $S_{24}$, $S_{34}$, $S_{44}$, $S_{27}$, $S_{37}$, and $S_{47}$, which are located in the second, third, and fourth row in the first, second, and third column. The error calculation in this control is as follows:

$$Z_{targ}=(Z_{27}+Z_{37}+Z_{47}+Z_{24}+Z_{34}+Z_{44}+Z_{21}+Z_{31}+Z_{41})/9-Pt_{cmp}$$

$$R_{targ}=(Z_{21}+Z_{31}+Z_{41})/3-(Z_{27}+Z_{37}+Z_{47})/3$$

$$P_{targ}=(Z_{21}+Z_{24}+Z_{27})/3-(Z_{41}+Z_{44}+Z_{47})/3$$

In this case, the center axis of the rolling control is the axis C3 shown in FIG. 28A.

Figure 28B:
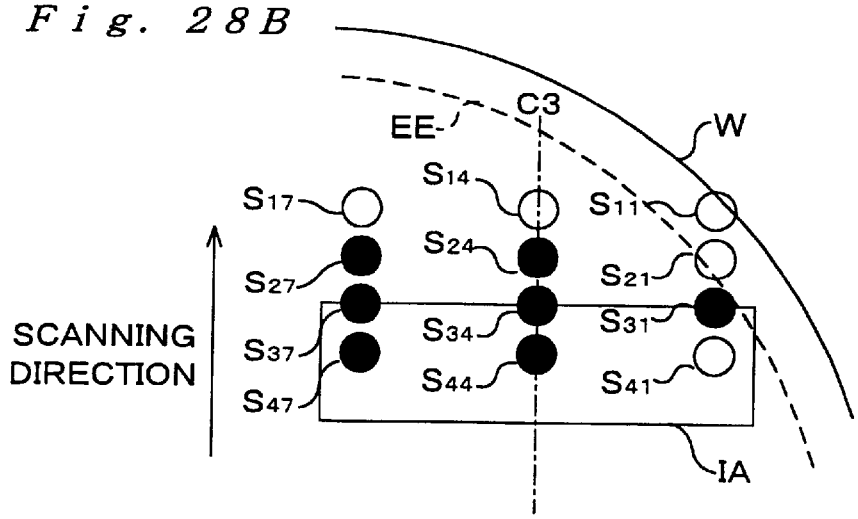

(b) As the exposure area IA and the group of selected sensors further proceed from the state shown in FIG. 28A in the scanning direction, the focus sensor $S_{21}$ that is located in the second row in the first column from the right comes off the effective area of the wafer W as shown in FIG. 28B. The main controller 20, then, performs encoder closed control of the position of the substrate table 18 in the Z direction, the tilt in the scanning direction (pitching), and the tilt in the non-scanning direction (rolling). This control is based on the detection results $Z_{24}$, $Z_{34}$, $Z_{44}$, $Z_{27}$, $Z_{37}$, $Z_{47}$ of the focus sensors $S_{24}$, $S_{34}$, $S_{44}$, $S_{27}$, $S_{37}$, $S_{47}$ located in the second, third, and fourth row in the second and third columns from the right, and also the detection result $Z_{31}$ of the focus sensor $S_{31}$ in the third row in the first column to the right.

The errors, Z error, rolling error, and pitching error, respectively as $Z_{targ}$, $R_{targ}$, $P_{targ}$, can be expressed as:

$$Z_{targ}=\{(Z_{27}+Z_{37}+Z_{47})/3+(Z_{24}+Z_{34}+Z_{44})/3+Z_{31}\}/3-Pt_{cmp}$$

$$R_{targ}=Z_{31}-(Z_{27}+Z_{37}+Z_{47})/3$$

$$P_{targ}=(Z_{24}+Z_{27})/2-(Z_{44}+Z_{47})/2$$

and the encoder value is calculated so that the errors becomes zero, and encoder-servo control is performed on the substrate table 18 by delaying the input of the encoder target value t o the driving system of the substrate table 18 for a predetermined period of time.

Figure 28C:
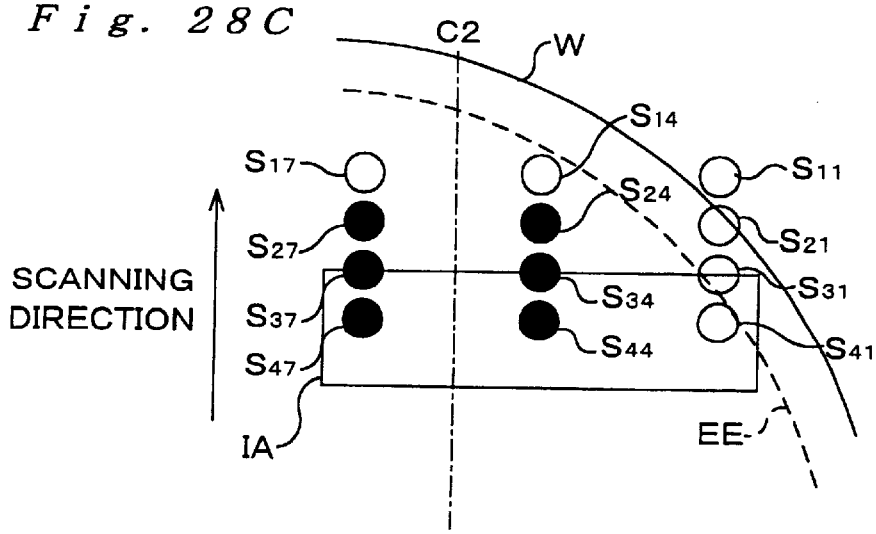

(c) As the exposure area IA and the group of selected sensors further proceed from the state shown in FIG. 28B in the scanning direction, the focus sensor $S_{31}$ that is located in the third row in the first column from the right comes off the effective area of the wafer W as shown in FIG. 28C. The main controller 20, then, performs encoder closed control of the position of the substrate table 18 in the Z direction, the tilt in the scanning direction (pitching), and the tilt in the non-scanning direction (rolling). This control is based, on the detection results $Z_{27}$, $Z_{37}$, $Z_{47}$, $Z_{24}$, $Z_{34}$, and $Z_{44}$ of the focus sensors $S_{27}$, $S_{37}$, $S_{47}$, $S_{24}$, $S_{34}$, and $S_{44}$ located in the second, third, and fourth row in the second and third columns from the right. The control errors in this control are as follows:

$$Z_{targ}=(Z_{27}+Z_{37}+Z_{47}+Z_{24}+Z_{34}+Z_{44})/6-Pt_{cmp}$$

$$R_{targ}=(Z_{24}+Z_{34}+Z_{44})/3-(Z_{27}+Z_{37}Z_{47})/3$$

$$P_{targ}=(Z_{24}+Z_{27})/2-(Z_{44}+Z_{47})/2$$

In this case, the center axis of the rolling control is the axis C2 shown in FIG. 28C.

Figure 29A:
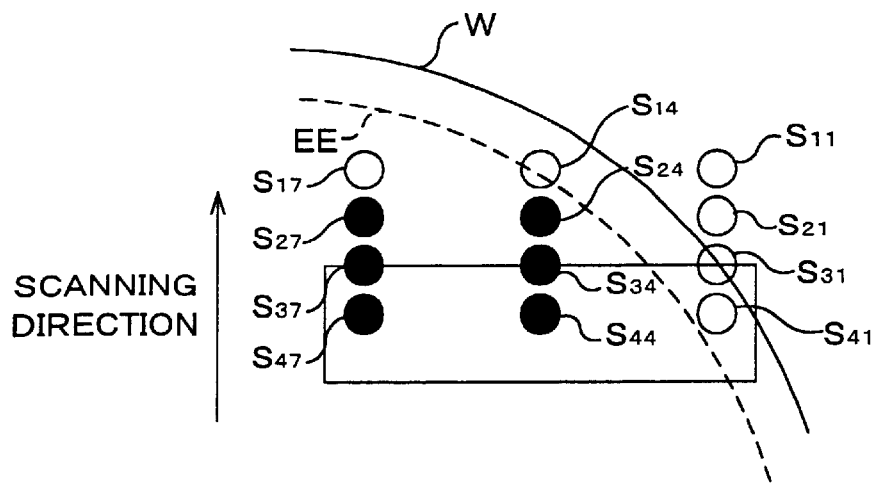
FIGS. 29A to 29C are views to explain the flow of the second stage of focus leveling control on an outward shot in the second embodiment.

(d) When the exposure area IA and the group of selected sensors further proceed from the state shown in FIG. 28C in the scanning direction, all the focus sensors located in the first column from the right come off the effective area of the wafer W as shown in FIG. 29A. At this point, since all the focus sensors located in the second and third column from the right are still within the effective area of the wafer W, the main controller 20 continues the encoder closed control of the position and posture of the substrate table 18, as described above in paragraph (c).

Figure 29B:
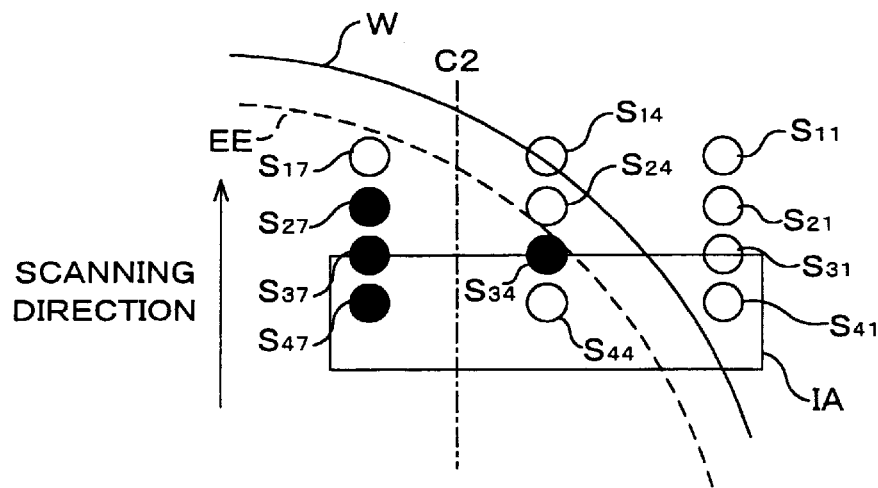

(e) As the exposure area IA and the group of selected sensors further proceed from the state shown in FIG. 29A in the scanning direction, the focus sensor $S_{24}$ that is located in the second row in the second column comes off the effective area of the wafer W as shown in FIG. 29B. The main controller 20, then performs encoder closed control of the position of the substrate table 18 in the Z direction, the tilt in the non-scanning direction (rolling) based on the detection results $Z_{27}$, $Z_{37}$, and $Z_{47}$ of the focus sensors $S_{27}$, $S_{37}$, and $S_{47}$ in the second, third, and fourth row in the third column from the right (the first column from the left) and the detection result $Z_{34}$ of the focus sensor $S_{34}$ in the third row in the second column. Also, the tilt of the substrate table 18 in the scanning direction (pitching) is controlled, based on the detection results $Z_{47}$ and $Z_{27}$ of the focus sensors $S_{47}$ and $S_{27}$. In this case, the center axis of the rolling control is the axis C2 shown in FIG. 29B.

Figure 29C:
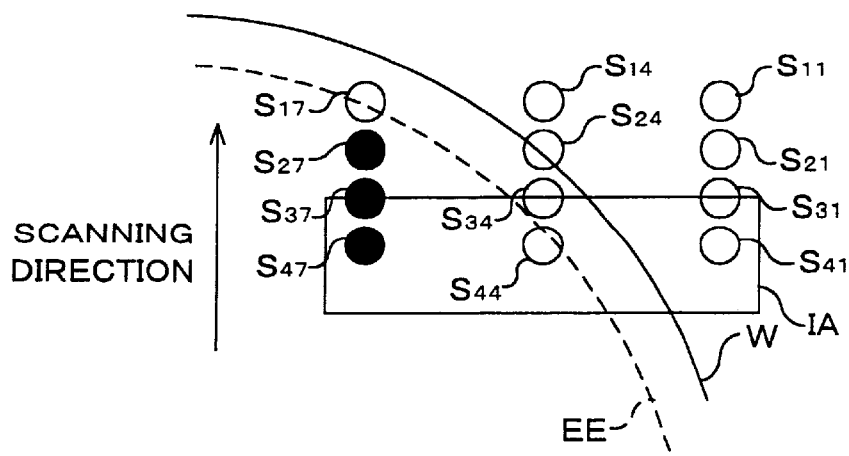

(f) As the exposure area IA and the group of selected sensors further proceed from the state shown in FIG. 29B in the scanning direction, the focus sensor $S_{34}$ that is located in the third row in the second column comes off the effective area of the wafer W as shown in FIG. 29C. The main controller 20 then performs encoder closed control (the first controlled state) of the position of the substrate table 18 in the Z direction, the tilt in the scanning direction (pitching) based on the detection results of the focus sensors $S_{27}$, $S_{37}$, and $S_{47}$. The encoder holds the angle of rolling at the latest value described in paragraph (e).

Figure 30A:
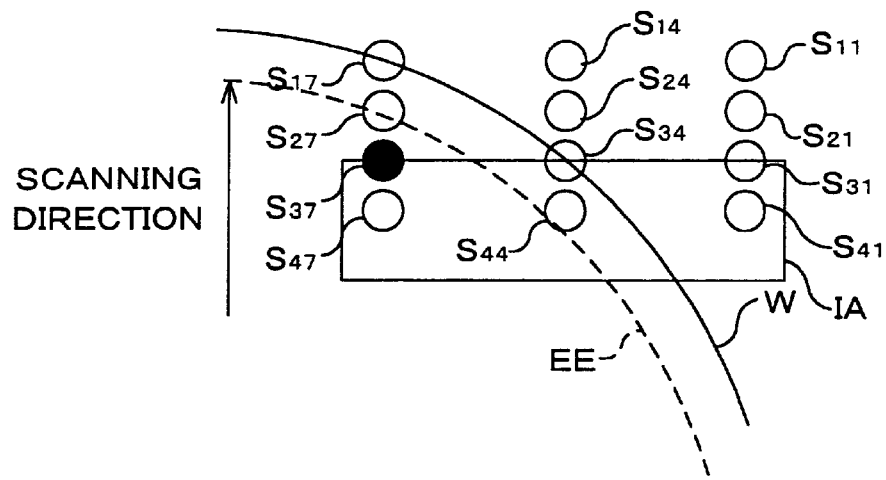
FIGS. 30A to 30C are views to explain the flow of the third stage of focus leveling control on an outward shot.

(g) As the exposure area IA and the group of selected sensors further proceed from the state shown in FIG. 29C in the scanning direction, the focus sensor $S_{27}$ that is located in the second row in the third column from the right comes off the effective area of the wafer W as shown in FIG. 30A. The main controller 20, then performs closed control (the second controlled state) of the position of the substrate table 18 in the Z direction, to correct the defocus based on the detection result of the focus sensor $S_{37}$. At this point, the encoder holds the angle of pitching at the latest value described in paragraph (f).

Figure 30B:
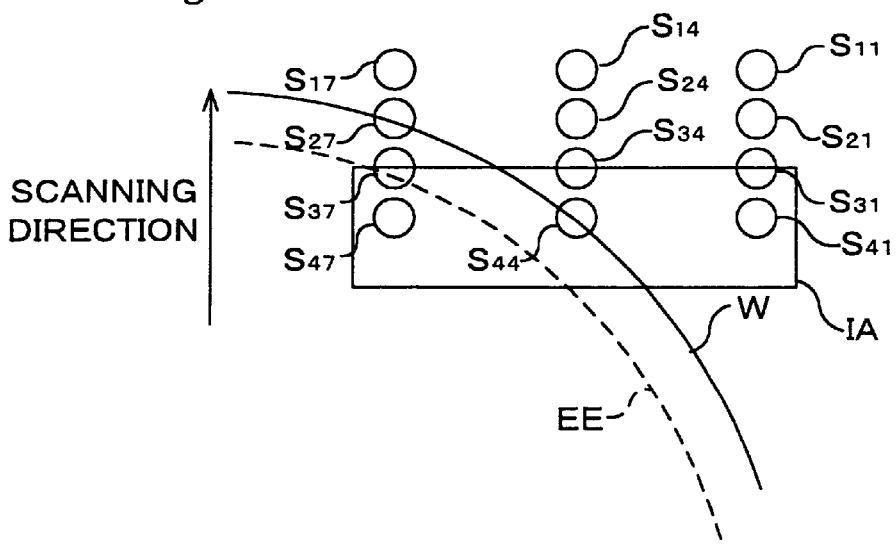

(h) When the exposure area IA and the group of selected sensors further proceed from the state shown in FIG. 30A in the scanning direction, the focus sensors in the third row comes off the effective area of the wafer W as shown in FIG. 30B. At this point, the main controller 20 locks the control (the third controlled state). That is, the position of the substrate table 18 in the optical axis direction is servo controlled based on the output of the encoder by fixing the target value of the encoder control at a constant value, or, by smoothly changing the control target value after the locking in an estimated value curve, for example, according to a device topography curve to control level differences.

Figure 30C:
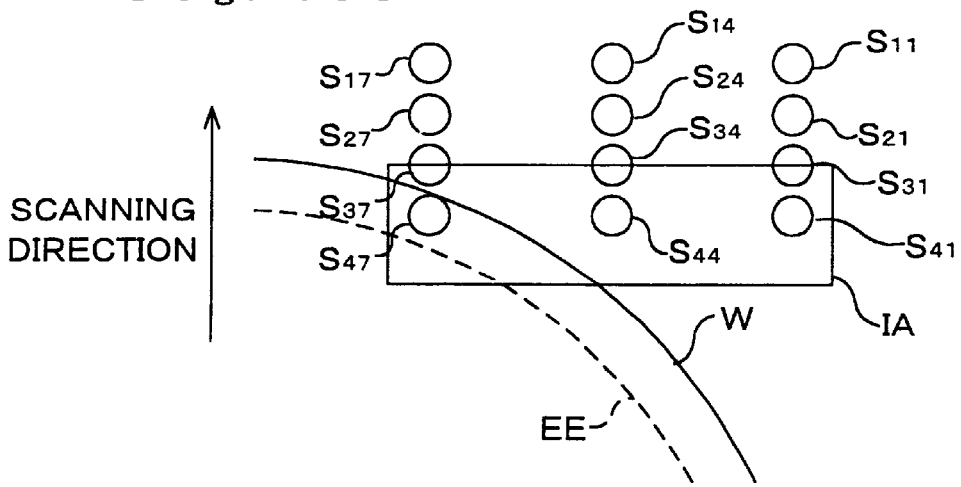

(i) Accordingly, even if the exposure area IA and the group of selected sensors further proceed from the state shown in FIG. 30B in the scanning direction, and all the focus sensors come off the effective area of the wafer W as shown in FIG. 30C, the main controller 20 keeps the state described in paragraph (h). That is, the main controller 20 maintains the locked state of control.

When an outward shot which is a chipped shot and located on both edges of the shot areas in the 12 o'clock and 6 o'clock direction is exposed, until the focus sensors in the second row come off the effective area of the wafer W, the main controller 20 similarly performs focus leveling control as with the case in paragraph (a), by using all nine focus sensors (the first controlled state). During this controlled state, when the focus sensors of the second row come off the effective area of the wafer W, closed control is performed on at least the position of the substrate table 18 in the Z direction (the second controlled state) based on the detection results of the focus sensors only in the third row. And, during the second controlled state, if the focus sensors in the third row come off the effective area of the wafer W, then the control switches to a locked state (the third controlled state).

In the case type B is selected in the basic sensor selection, similar to when type A is selected, the Z leveling control (focus leveling control of the wafer W) of the substrate table 18 is performed. On selection of type B in the basic sensor selection, the number of columns of the selected detection points is numerous and the rolling control can have multiple steps, therefore the rolling control can be performed with high precision. Also, there is the merit of being able to use the detection points in the illumination area for confirmation purposes.

Furthermore, in the second embodiment, as is with the first embodiment, the main controller 20 calculates the following error (error check method) of the focus leveling control.

As have been described, with the exposure apparatus in the second embodiment, besides having similar effects when using the exposure apparatus 100 in the first embodiment, the speed of completing the pre-exposing dynamic focusing when exposing an inward shot can be accelerated.

In the case the pre-exposing dynamic focusing cannot be completed in time when exposing an inward shot, the process previously described can be performed. Also, in the second embodiment, when scanning is at a low speed and prereading by 4 mm is far too excessive for correction, procedures similar to the first embodiment can be taken.

In each embodiment, the case where the exposing shot area located on the circumferential portion of the wafer W is a chipped shot has been described. However, depending on the size and layout of the shot area, there may be cases where there are no exposing shot areas (which is a chipped shot) on the edge of the effective area of the wafer W. In such a case, (hereinafter, such cases will be referred to as "full shot specifying mode" for the sake of convenience), the wafer surface may become uneven (irregular) between an area where there is a pattern, and an area where there is no pattern, as the wafer is processed. In the case of a full shot specifying mode, to allow focus control, the circumferential shot areas defined in the shot map of the process program, need to be exposed as an inward shot.

Following is an example describing the focus leveling control in the case of the full shot specifying mode, with reference to FIGS. 31A to 31D.

In this case, as a premise, the focus sensors selected in the exposure apparatus 100 previously described in the first embodiment, is to the focus sensors in the first, second, and fourth rows, that is, $S_{11}$, $S_{15}$, $S_{19}$, $S_{21}$, $S_{25}$, $S_{29}$, $S_{41}$, $S_{45}$, and $S_{49}$.

Figure 31A:
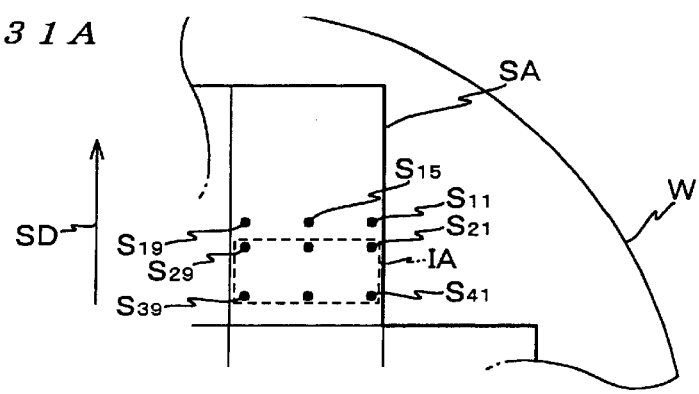
FIGS. 31A to 31D are views to explain the flow of the focus leveling control at a full shot specifying mode.

Likewise, the reticle R and the wafer W are relatively scanned in the Y axis direction. The selected focus sensors are all within the effective area of the wafer W from the start of scanning for a predetermined period as shown in FIG. 31A. So for the predetermined period, the main controller 20 performs pitching control, rolling control, and focus control based on the measurement results of all the selected focus sensors.

Figure 31B:
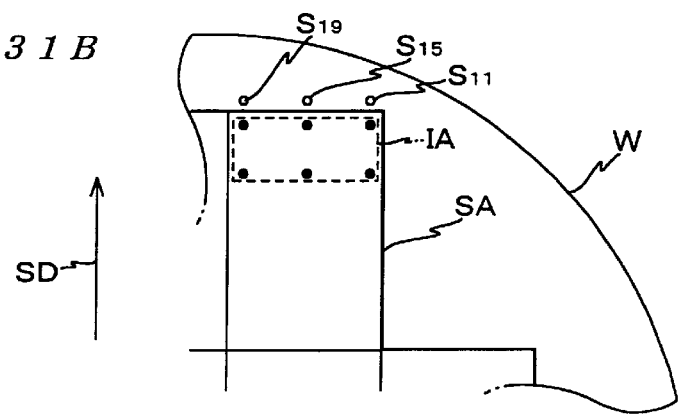

As the exposure area IA and the group of selected sensors further proceed from the state shown in FIG. 31A in the scanning direction SD, the focus sensors $S_{11}$, $S_{15}$, and $S_{19}$ that are located in the first row come off the shot area SA as shown in FIG. 31B. The main controller 20, then, performs pitching control, rolling control, and focus control based on the measurement results of the focus sensors $S_{21}$, $S_{25}$, $S_{29}$, $S_{41}$, $S_{45}$, and $S_{49}$ in the second and fourth row, without using the measurement results of the focus sensors $S_{11}$, $S_{15}$, and $S_{19}$.

Figure 31C:
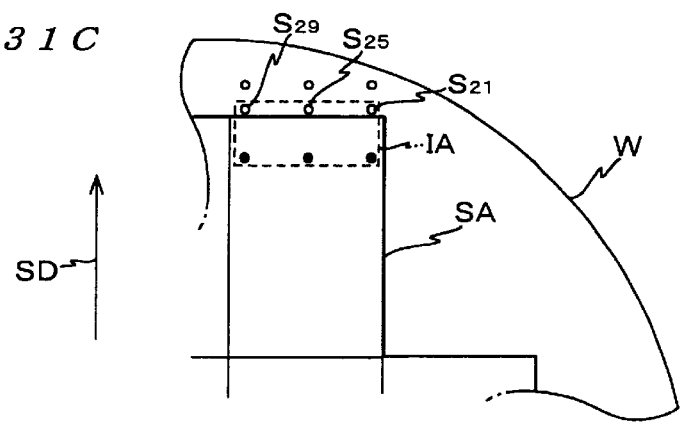

As the exposure area IA and the group of selected sensors further proceed from the state shown in FIG. 31B in the scanning direction SD, the focus sensors $S_{21}$, $S_{25}$, and $S_{29}$ that are located in the second row come off the shot area SA as shown in FIG. 31C. The main controller 20, then, fixes the pitching (tilt in the scanning direction) and continues rolling control and focus control in accordance with the measurement results of the focus sensors $S_{41}$, $S_{45}$, and $S_{49}$ that are located in the fourth row.

Figure 31D:
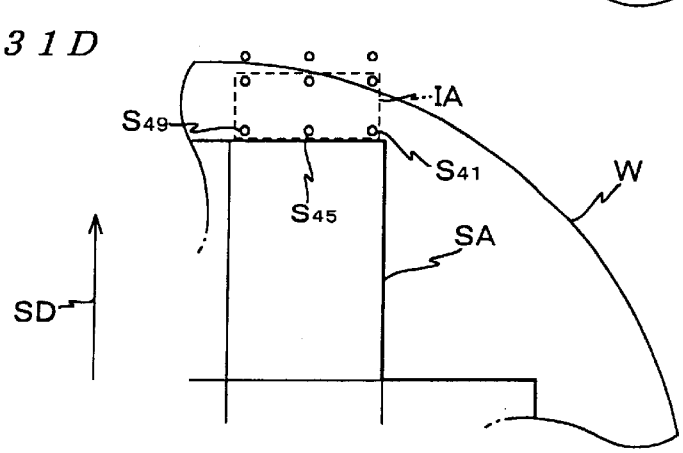

As the exposure area IA and the group of selected sensors further proceed from the state shown in FIG. 31C in the scanning direction SD, the focus sensors $S_{41}$, $S_{45}$, and $S_{49}$ that are located in the fourth row come off the shot area SA as shown in FIG. 31D. The main controller 20, then, fixes the rolling (tilt in the non-scanning direction) and focus.

As is described, in the case of the full shot specifying mode, focus leveling control is performed by the main controller 20, with the outer rim of the effective area (disable line) EE serving as portion the most circumferential of the exposure map.

In the description so far, in either case type A or type B is set as the selection criteria, once the focus sensors are selected prior to exposure, the sensors are used without change when the reticle R and wafer W are relatively scanned with respect to the projection optical system. However, the focus sensors may be changed during relative scanning, if switching of the focus sensors is possible. An example of such a case, switching focus sensors during relative scanning, is described below.

Figure 32A:
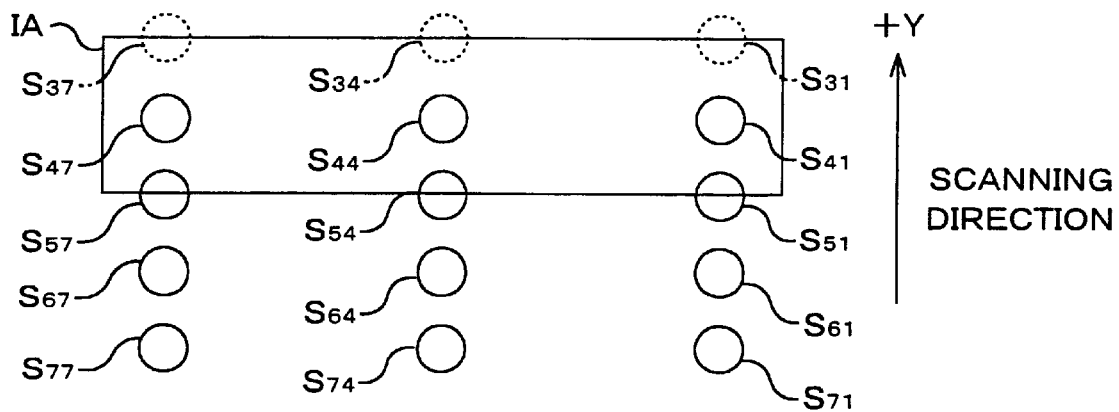
FIG. 32A and FIG. 32B are views to explain the switching of the focus sensors to be used during relative scanning when type A selection criteria is set and the scan is a plus scan.

FIG. 32A shows that the focus sensor selection of type A is set with the exposure apparatus in the second embodiment, and the exposure area IA and the group of focus sensors are relatively scanned in the −Y direction. That is, an example is described when the wafer W is scanned in the +Y direction, the selection unit 93 selects the type A basic sensors. In FIG. 32A, the basic sensor selection is the same, as of FIG. 22A. Likewise, in this case, the focus sensors in the first row (the leading row) $S_{71}$, $S_{74}$, and $S_{77}$ are used solely for the pre-exposing dynamic focusing on an inward shot. The case when scanning exposure is performed on a shot area located at an edge portion in the +Y side on the wafer W is described next, the basic type focus selection as shown in FIG. 32A. The main controller 20, performs the pre-exposing dynamic focusing based on the detection results of focus sensors in the first row while calculating the control target value base on the measurement results of the focus sensors in the second row $S_{61}$, $S_{64}$, and $S_{67}$. And, when the pre-exposing dynamic focusing is completed, the main controller 20 then disconnects the three output lines (channels) that are connected to the photosensors corresponding to the respective focus sensors, $S_{71}$, $S_{74}$, and $S_{77}$, and connects them to the photosensors corresponding to the focus sensors, $S_{31}$, $S_{34}$, and $S_{37}$ in the fifth row. After the connection is completed, based on the measurement results of the focus sensors $S_{61}$, $S_{64}$, $S_{67}$, $S_{51}$, $S_{54}$, $S_{57}$, $S_{41}$, $S_{44}$, and $S_{47}$ in the second to fourth row, the substrate table 18 is controlled. That is, the Z position of the wafer W, rolling, and pitching are controlled by encoder closed loop control. In this case, the control error is calculated only on the detection results of the focus sensors located within the exposure area IA.

Figure 32B:
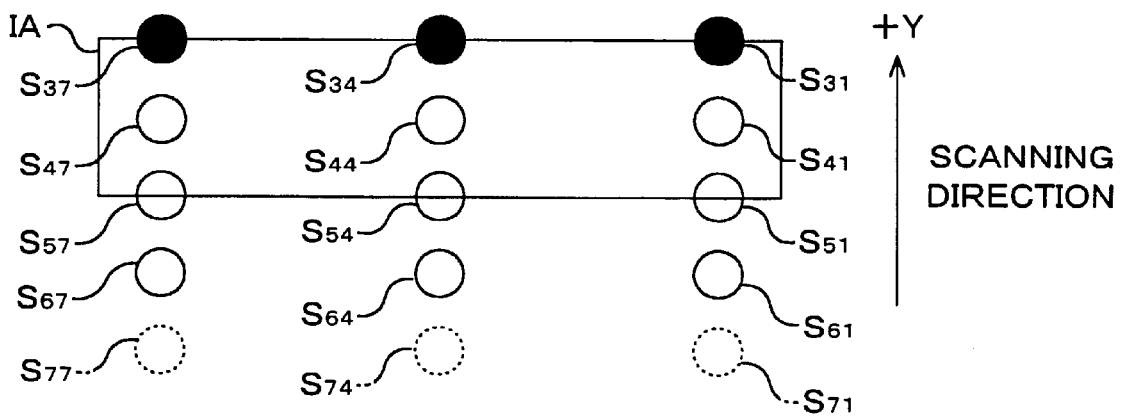

When scanning exposure is performed on an inward shot, by switching the selection of the focus sensors as shown in FIGS. 32A and 32B, it allows the use of detection results of the focus sensors located far from the illumination area to control the pre-exposing dynamic focusing without delay, until the pre-exposing dynamic focusing is completed. And, after the pre-exposing dynamic focusing has been completed, focus leveling can be performed with high precision while confirming the results, based on the detection results of the focus sensors in the exposure area IA.

Figure 33A:
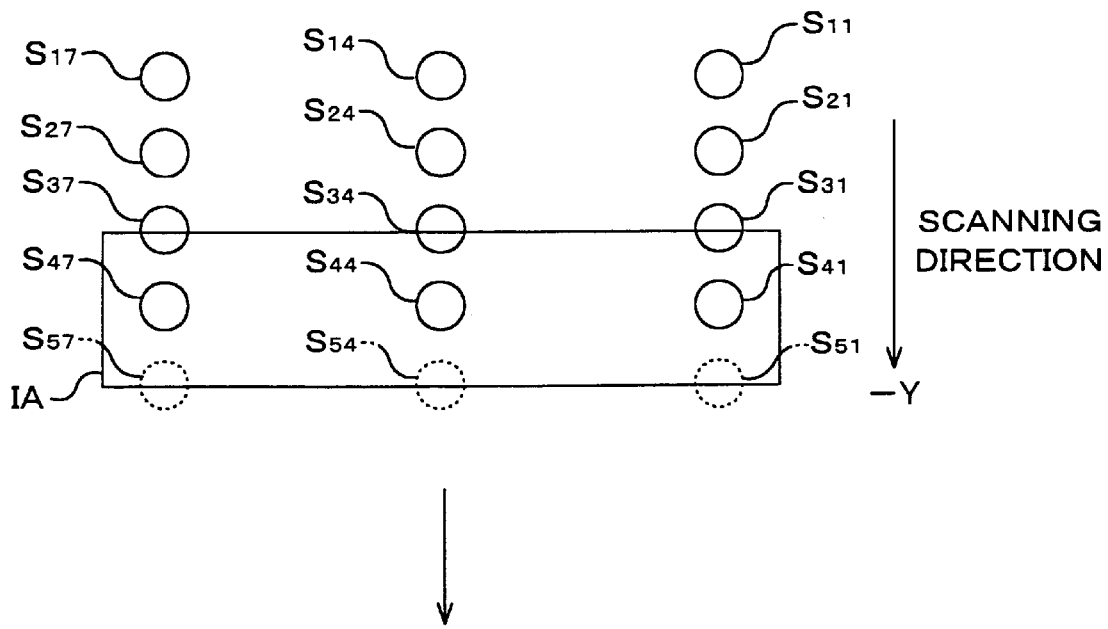
FIG. 33A and FIG. 33B are views to explain the switching of the focus sensors to be used during relative scanning when type A selection criteria is set and the scan is a minus scan.
Figure 33B:
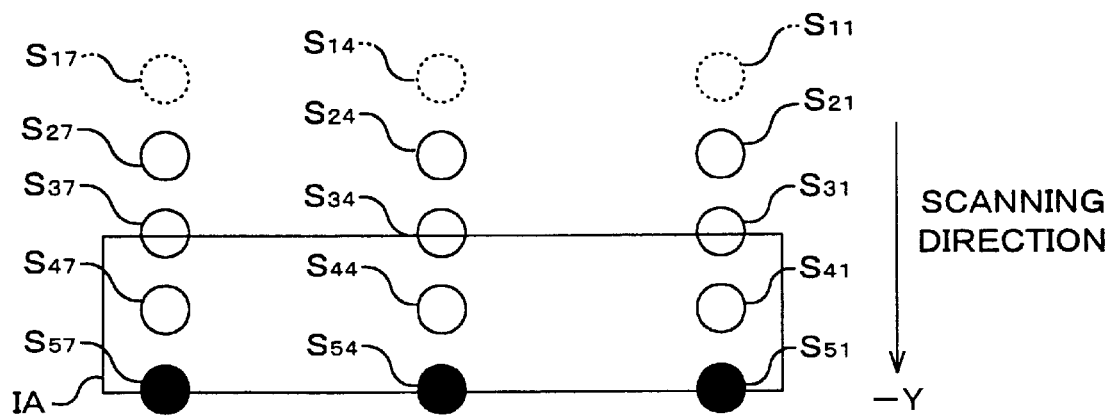

FIG. 33A shows that the focus sensor selection of type A is set with the exposure apparatus in the second embodiment, and the exposure area IA and the group of focus sensors are relatively scanned in the +Y direction. That is, an example is described when the wafer W is scanned in the −Y direction, the selection unit 93 selects the type A basic sensors. In this case, on exposing an inward shot, the main controller 20 switches the selection of the focus sensors from the first row to the fifth row as shown in FIGS. 33A and 33B, that is from $S_{11}$, $S_{14}$, and $S_{17}$ to $S_{51}$, $S_{54}$, and $S_{57}$ when the pre-exposing dynamic focusing is completed, likewise with plus scan. After switching the selected sensors, the focus sensors in the fifth row are used to confirm the results of control. This allows the pre-exposing dynamic focusing to be controlled without delay, and after the pre-exposing dynamic focusing is completed, focus leveling control with high precision is performed while confirming the results, based on the detection results of the focus sensors within the exposure area IA.

When the selection criteria is set at type A, in either cases of plus scan (FIG. 32A and FIG. 32B) or minus scan (FIG. 33A and FIG. 33B), the selection unit 93 selects the focus sensors capable to control rolling and pitching, as well as to perform the column shift process of the focus sensors in accordance with the lacking portion of the shot area.

Figure 34A:
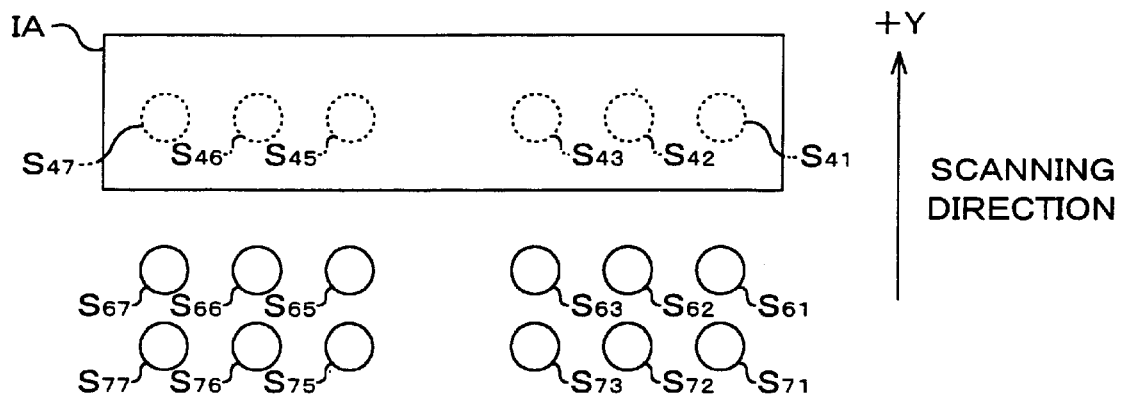
FIG. 34A and FIG. 34B are views to explain the switching of the focus sensors to be used during relative scanning when type B selection criteria is set and the scan is a plus scan.

FIG. 34A shows that the focus sensor selection of type B is set with the exposure apparatus in the second embodiment, and the exposure area IA and the group of focus sensors are relatively scanned in the −Y direction. That is, an example is described when the wafer W is scanned in the +Y direction, the selection unit 93 selects the type B basic sensors. Likewise, in this case, the focus sensors in the first row (the leading row) $S_{71}$, $S_{72}$, $S_{73}$, $S_{75}$, $S_{76}$, and $S_{77}$ are used solely for the pre-exposing dynamic focusing on an inward shot. The case when scanning exposure is performed on a shot area located at an edge portion in the +Y side on the wafer W is described next, the basic type focus selection as shown in FIG. 34A. The main controller 20, performs the pre-exposing dynamic focusing based on the detection results of focus sensors in the first row while calculating the control target value base on the measurement results of the focus sensors in the second row $S_{61}$, $S_{62}$, $S_{63}$, $S_{65}$, $S_{66}$, and $S_{67}$. And while the pre-exposing dynamic focusing is being performed, the measurement results of the focus sensors in the first row are also used to calculate the control error.

When the pre-exposing dynamic focusing is completed, the main controller 20 then disconnects the six output lines (channels) that are connected to the photosensors corresponding to the respective focus sensors $S_{71}$, $S_{72}$, $S_{73}$, $S_{75}$, $S_{76}$, and $S_{77}$, and connects them to the photosensors corresponding to the focus sensors $S_{41}$, $S_{42}$, $S_{43}$, $S_{45}$, $S_{46}$, and $S_{47}$ in the fourth row. After the connection is completed, based on the measurement results of the focus sensors $S_{61}$, $S_{62}$, $S_{63}$, $S_{65}$, $S_{66}$, and $S_{67}$ in the second and fourth row as show in FIG. 34B, the substrate table 18 is controlled. That is, the Z position of the wafer W and rolling are controlled by encoder closed loop control. In this case, the control error is calculated only on the detection results of the focus sensors $S_{41}$, $S_{42}$, $S_{43}$, $S_{45}$, $S_{46}$, and $S_{47}$ located within the exposure area IA.

Figure 34B:
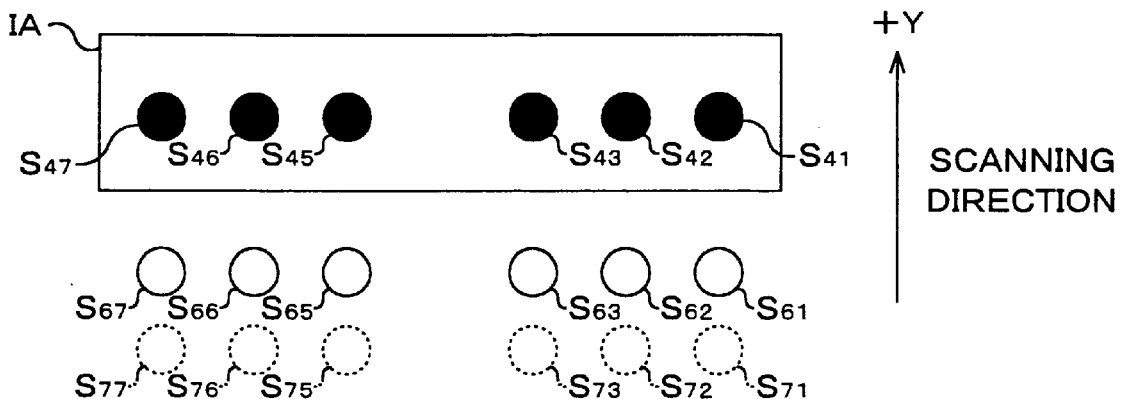

As is described, when scanning exposure is performed on an inward shot, by switching the selection of the focus sensors as shown in FIGS. 34A and 34B, it allows the use of detection results of the focus sensors located far from the illumination area to control the pre-exposing dynamic focusing without delay, until the pre-exposing dynamic focusing is completed. And, after the pre-exposing dynamic focusing has been completed, focus control and rolling control can be performed with high precision while confirming the results, based on the detection results of the focus sensors in the exposure area IA.

Figure 35A:
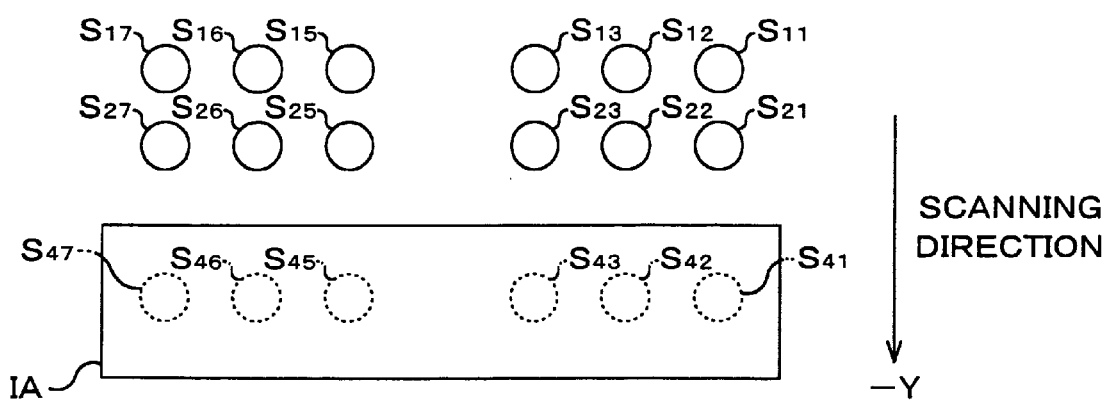
Figure 35B:
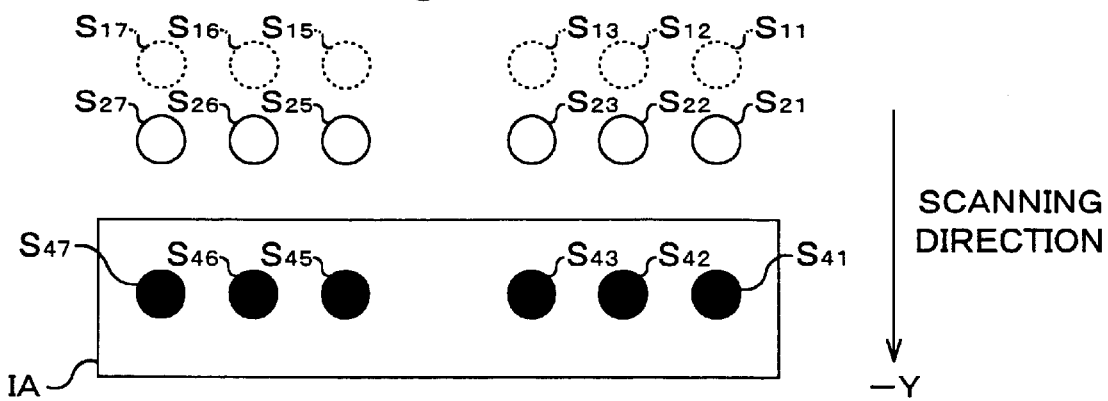

FIG. 35A shows that the focus sensor selection of type B is set with the exposure apparatus in the second embodiment, and the exposure area IA and the group of focus sensors are relatively scanned in the +Y direction. That is, an example is described when the wafer W is scanned in the −Y direction, the selection unit 93 selects the type B basic sensors. In this case, on exposing an inward shot, the main controller 20 switches the selection of the focus sensors from the first row to the fourth row as shown in FIGS. 35A and 35B, that is from $S_{11}$, $S_{12}$, $S_{13}$, $S_{15}$, $S_{16}$, and $S_{17}$ to $S_{41}$, $S_{42}$, $S_{43}$, $S_{45}$, $S_{46}$ and $S_{47}$ when the pre-exposing dynamic focusing is completed, likewise with plus scan. After switching the selected sensors, the focus sensors in the fourth row are used to confirm the results of control. This allows the pre-exposing dynamic focusing to be controlled without delay, and after the pre-exposing dynamic focusing is completed, focus control and rolling control with high precision are performed while confirming the results, based on the detection results of the focus sensors within the exposure area IA.

When the selection criteria is set at type B, in either cases of plus scan (FIG. 34A and FIG. 34B) or minus scan (FIG. 35A and FIG. 35B), the selection unit 93 selects the focus sensors capable to control rolling, as well as to perform the column shift process of the focus sensors in accordance with the lacking portion of the shot area. However, on the internal portion away from the edge of the wafer, it is possible to detect and control pitching, based on the detection results of the focus sensors in the second and fourth row.

As the illumination light of the exposure apparatus in the present invention, not only a g-line (436 nm), an i-line (365 nm), a KrF excimer laser beam (248 nm), an ArF excimer laser beam (193 nm), a metal vapor laser, or a YAG laser which is a harmonic, but also an $F_2$ light (157 nm) or EUV (Extreme UltraViolet) light which has an oscillation spectrum in the range of 5 to 15 nm belonging to the soft X-ray region can be used.

The magnification of the projection optical system may not only be a reduction magnification system, but also an equal or an enlarged system. The projection optical system uses crystal or fluorite that transmit far ultraviolet-light as glass materials, when far ultraviolet-light such as an excimer laser beam is used. In the case when $F_2$ light or X-ray is used, a reflection refraction system or a reflection system is used as the optical system (the reticle is also a reflective type).

In the case of using a linear motor (see U.S. Pat. No. 5,623,853 and U.S. Pat. No. 5,528,118 for reference) for the X stage, the Y stage, or the reticle stage, a linear motor of an air levitation type by air bearings or a magnetic levitation type by the Lorentz force or a reactance force can be used.

Also, the stage may be of a type to move along a guide, or a guideless type which does not require a guide.

The reaction force generated by the movement of the X stage and Y stage may be released to the floor (ground) using a frame member. This is disclosed, for example, in Japan Laid Open Patent No. 08-166475 and the corresponding U.S. Pat. No. 5,528,118, which are fully incorporated by reference herein.

The reaction force generated by the movement of the reticle stage during scanning exposure may be released to the floor (ground) using a frame member. This is disclosed, for example, in Japan Laid Open Patent No. 08-330224 and the corresponding U.S. patent application Ser. No. 08/416,558, which are fully incorporated by reference herein.

The usage of the exposure apparatus is not limited to the manufacturing of semiconductor devices. The present invention can be broadly applied to exposure apparatus for transferring device patterns onto glass plates used to manufacture displays including liquid crystal display devices, or to exposure apparatus used to manufacture thin-film magnetic heads.

The exposure apparatus used in the embodiment above can be made by; incorporating and optically adjusting the illumination optical system constituted by a plurality of lenses and the projection optical system to the main body of the exposure apparatus; fixing the reticle stage and the XY stage constituted by many mechanical parts to the main body of the exposure apparatus and connecting the pipes and wires; and finally by performing overall adjustment (electric adjustment, optical alignment, operation checks, and the like). The exposure apparatus is preferably made in a clean room where conditions such as temperature, degree of cleanliness, and the like are controlled.

A semiconductor device is manufactured through the steps of conducting function and performance design of the device, of manufacturing a reticle on based on this design step, manufacturing wafers from a silicon material, transferring the reticle pattern onto the wafer by the use of the exposure apparatus of the embodiment above, assembling the device (including a dicing process, a bonding step, and a packaging process), and inspection. Following is a detailed description of the device manufacturing method using the above exposure apparatus and method in a lithographic process.

Device Manufacturing Method

Figure 36:
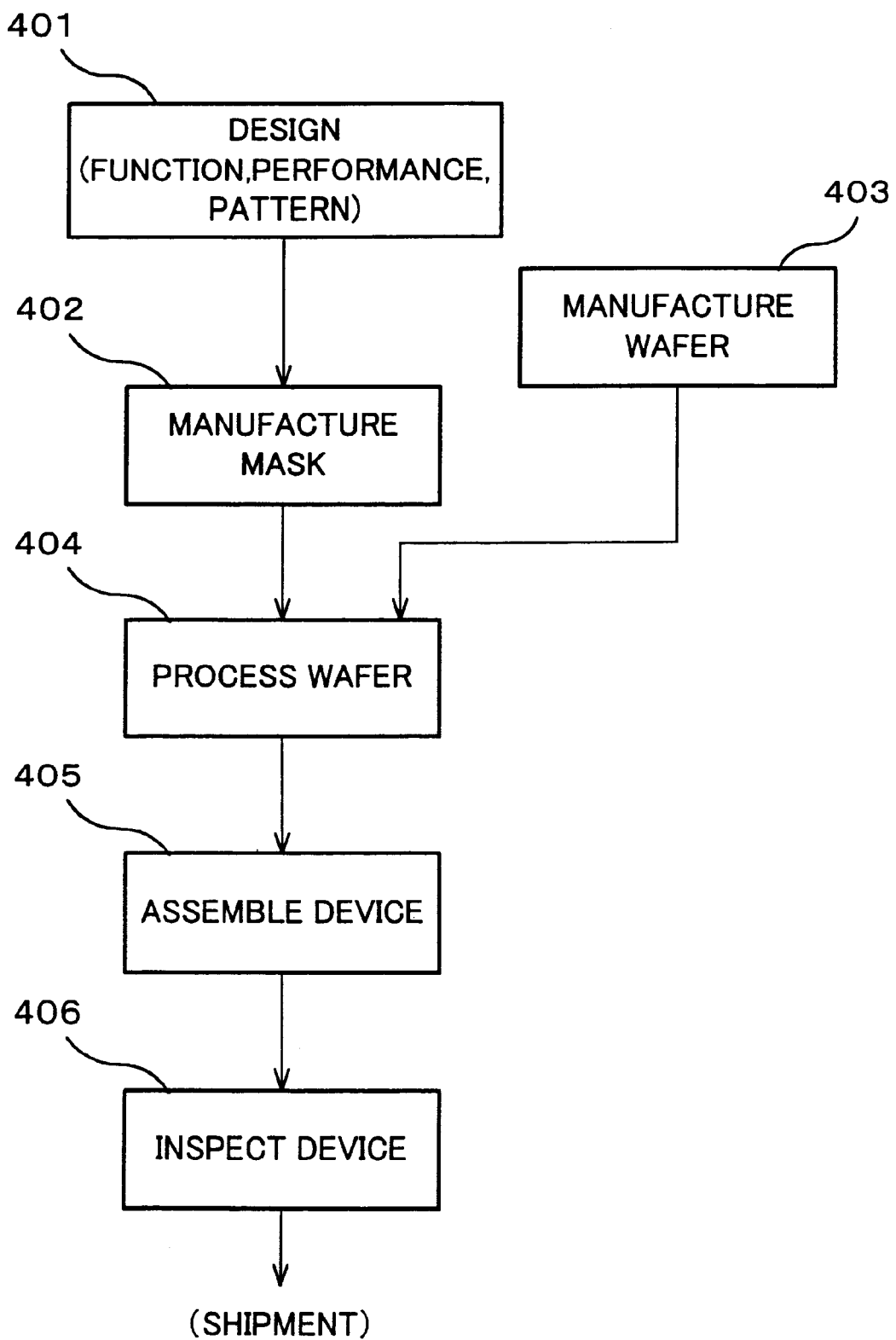
FIG. 36 is a flow chart for explaining an embodiment of a device manufacturing method according to the present invention.

FIG. 36 is a flow chart showing an example of manufacturing a device (a semiconductor chip such as an IC or LSI, a liquid crystal panel, a CCD, a thin magnetic head, a micromachine, or the like). As shown in FIG. 36, in step 401 (design step), function/performance is designed for a device (e.g., circuit design for a semiconductor device) and a pattern to implement the function is designed. In step 402 (mask manufacturing step), a mask on which the designed circuit pattern is formed is manufactured. In step 403 (wafer manufacturing step), a wafer is manufacturing by using a silicon material or the like.

In step 404 (wafer processing step), an actual circuit and the like are formed on the wafer by lithography or the like using the mask and wafer prepared in steps 401 to 403, as will be described later. In step 405 (device assembly step), a device is assembled by using the wafer processed in step 404. Step 405 includes processes such as dicing, bonding, and packaging (chip encapsulation).

Finally, in step 406 (inspection step), a test on the operation of the device, durability test, and the like are performed. After these steps, the device is completed and shipped out.

Figure 37:
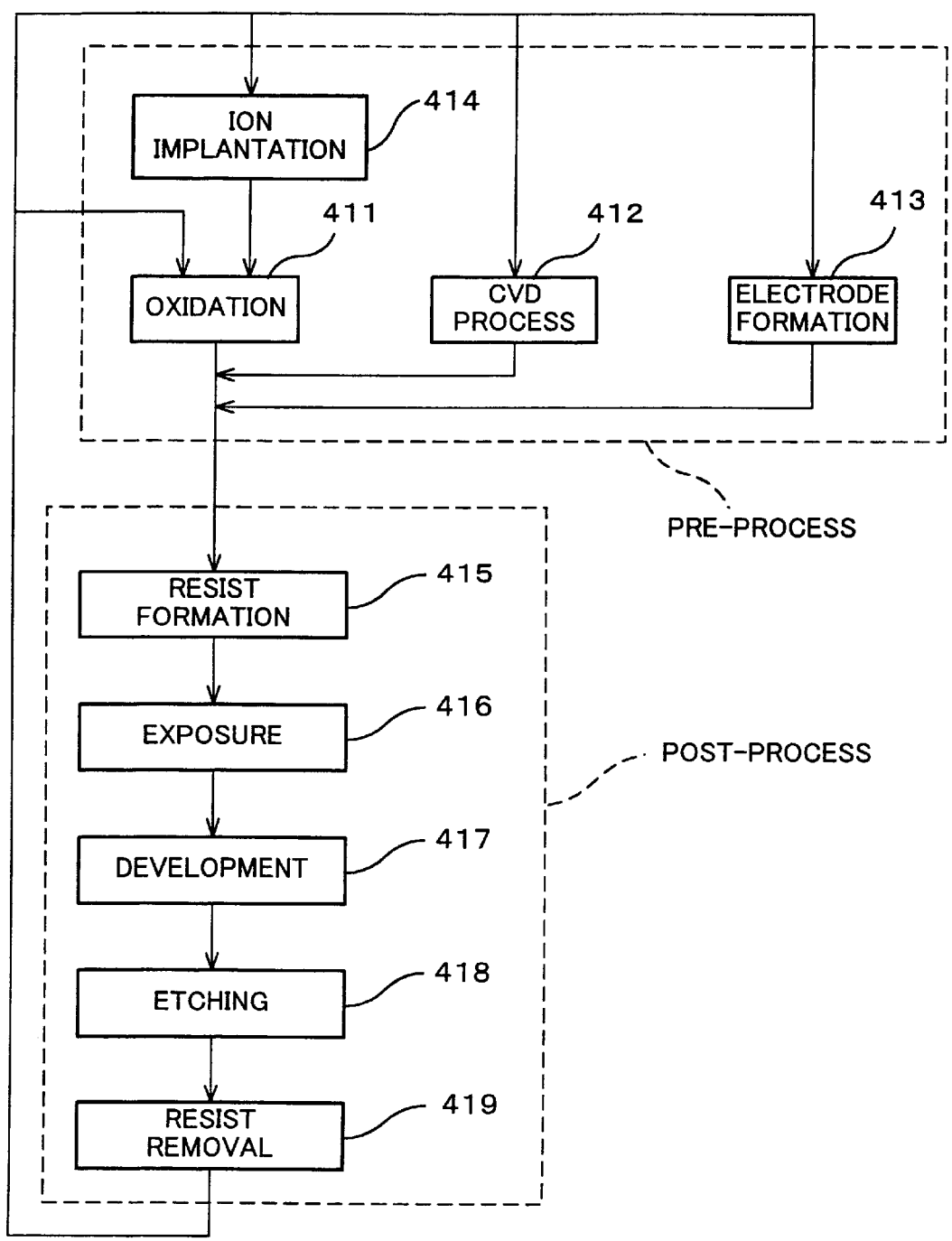
FIG. 37 is a flow chart showing the processing in step 404 in FIG. 36.

FIG. 37 is a flow chart showing a detailed example of step 404 described above in manufacturing the semiconductor device. Referring to FIG. 37, in step 411 (oxidation step), the surface of the wafer is oxidized. In step 412 (CVD step), an insulating film is formed on the wafer surface. In step 413 (electrode formation step), an electrode is formed on the wafer by vapor deposition. In step 414 (ion implantation step), ions are implanted into the wafer. Steps 411 to 414 described above constitute a pre-process for the respective steps in the wafer process and are selectively executed in accordance with the processing required in the respective steps.

When the above pre-process is completed in the respective steps in the wafer process, a post-process is executed as follows. In this post-process, first, in step 415 (resist formation step), the wafer is coated with a photosensitive agent. Next, as in step 416, the circuit pattern on the mask is transcribed onto the wafer by the above exposure apparatus and method. Then, in step 417 (developing step), the exposed wafer is developed. In step 418 (etching step), an exposed member on a portion other than a portion where the resist is left is removed by etching. Finally, in step 419 (resist removing step), the unnecessary resist after the etching is removed.

By repeatedly performing these pre-process and post-process, multiple circuit patterns are formed on the wafer.

As described above, by using the device manufacturing method of this embodiment, the exposure apparatus and exposure method described in each embodiment above are used in the exposure process (step 416). This makes it possible to perform exposure with high precision, without the uniformity being uneven due to defocus, which in turn can improve the productivity (including yield) when manufacturing devices having high integration.

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions and substitutions fall within the scope of the present invention, which is best defined by the claims appended below.

What is claimed is:

1. An exposure apparatus which relatively scans a mask and a substrate with respect to a projection optical system while said mask having a pattern formed is illuminated with an illumination light to transfer said pattern onto at least one shot area on said substrate via said projection optical system, said exposure apparatus comprising:

a focus detection system which detects positional information on said substrate surface in an optical axis direction of said projection optical system at a plurality of detection points;

a selection unit capable to set a selection criteria and select detection points according to said selection criteria, said selection criteria including a first type detection point selection criteria to control a tilt of said substrate in a moving direction and a tilt of said substrate in a direction perpendicular to said moving direction, said moving direction being a first direction whereas said direction perpendicular being a second direction, and a second type detection point selection criteria to control said tilt of said substrate with priority on said second direction; and a substrate driving unit which controls a position of said substrate in said optical axis direction and a tilt with respect to a surface perpendicular to said optical axis to adjust a positional relationship between said substrate surface within an illumination area and an image plane of said projection optical system based on positional information of said substrate surface in an optical axis direction of said projection optical system at said detection points selected.

2. An exposure apparatus according to claim 1, wherein said selection unit performs selection of said detection points in accordance with a size of a shot area subject to exposure.

3. An exposure apparatus according to claim 2, wherein when said shot area subject to exposure is an outward shot, said selection unit selects said detection points located within an effective area of said substrate at a judgement position where a rear-edge of said illumination area coincides with a fore-edge on said shot area directly after starting exposure based on a shot map prepared in advance.

4. An exposure apparatus according to claim 2, wherein when said shot area subject to exposure is an inward shot, said selection unit selects said detection points located within an effective area of said substrate at a judgement position where a fore-edge on said illumination area coincides with a rear-edge on said shot area just before completing exposure based on a shot map prepared in advance.

5. An exposure apparatus according to claim 2, wherein when said shot area subject to exposure is other than an inward shot and an outward shot, said selection unit selects said detection points located within an effective area of said substrate at a judgement position where said illumination area is located almost at a center in said first direction of said shot area subject to exposure based on a shot map prepared in advance.

6. An exposure apparatus according to claim 1, wherein said selection unit selects said detection points to confirm detection results of said driving unit within said illumination area when said second type detection point selection criteria is set.

7. An exposure apparatus according to claim 1, wherein when said second type detection point selection criteria is set, said substrate driving unit controls one of said position of said substrate in said optical axis direction, and a position of said optical axis direction and said tilt in said second direction.

8. An exposure apparatus which relatively scans a mask and a substrate with respect to a projection optical system while said mask having a pattern formed is illuminated with an illumination light to transfer said pattern onto at least one shot area on said substrate via said projection optical system, said exposure apparatus comprising:
    a focus detection system that has detection points which are capable of detecting positional information on said substrate surface in an optical axis direction of said projection optical system;
    an adjustment system which adjusts a positional relationship between an image plane of said projection optical system and said substrate surface based on detection results of said focus detection system; and
    a switching system that switches an operation of said detection points of said focus detection system located within an illumination area between controlling said adjustment system and confirming results of said adjustment performed by said adjustment system.

9. An exposure apparatus according to claim 8, wherein said switching system switches said detection points of said focus detection system arranged within an illumination area according to a type of pattern of said mask to be transferred onto said shot area subject to exposure.

10. An exposure apparatus according to claim 8, wherein said switching system switches said detection points of said focus detection system arranged within an illumination area depending on whether said shot area subject to exposure is located at the circumferential portion of said substrate.

11. An exposure apparatus which relatively scans a mask and a substrate with respect to a projection optical system while said mask having a pattern formed is illuminated with an illumination light to transfer said pattern onto at least one shot area on said substrate via said projection optical system, said exposure apparatus comprising:
    a focus detection system that detects positional information on said substrate surface in an optical axis direction of said projection optical system which has detection points in
        a first row which is located before an illumination area of said illumination light,
        a second row which is located apart from said detection points in said first row in a moving direction of said substrate being a first direction during said relative scanning, and
        a third row which is located apart from said detection points in said second row in said first direction;
    a substrate driving system which drives said substrate in said optical axis direction and a tilt with respect to a surface perpendicular to said optical axis;
    a relative scanning unit which relatively scans said mask and said substrate with respect to said projection optical system; and
    a controller which controls said substrate driving system to adjust a positional relationship between an image plane of said projection optical system and said substrate surface based on detection results of said focus detection system, and
    said controller performs after relative scanning of said mask and said substrate is started by said relative scanning unit to transfer said pattern onto said shot area which is an inward and chipped shot,
        a first controlled state control which controls a position of said substrate in said optical axis direction by open control of said substrate driving system in accordance with detection results of said detection points in said first row when only said detection points come into an effective area of said substrate,
        a second controlled state control which controls said position of said substrate in said optical axis direction by closed control of said substrate driving system in accordance with detection results of said detection points only in said second row when said detection points come into said effective area of said substrate while said first controlled state control is performed, and
        a third controlled state control which controls said position of said substrate in said optical axis direction and a tilt in said first direction by closed control of said substrate driving system in accordance with detection results of said detection points in said first, second, and third row when said detection points in said third row come into said effective area of said substrate while said second controlled state control is performed.

12. An exposure apparatus according to claim 11, wherein said controller adds a tilt in a second direction subject to said open control when two of said detection points in said first row come into said effective area of said substrate, said second direction being a direction perpendicular to said first direction.

13. An exposure apparatus according to claim 12, wherein said controller changes control of said tilt of said substrate in said second direction from said open control to said closed control in accordance with detection results of two of said detection points in said second row when said detection points come into said effective area of said substrate.

14. An exposure apparatus which relatively scans a mask and a substrate with respect to a projection optical system while said mask having a pattern formed is illuminated with an illumination light to transfer said pattern onto at least one shot area on said substrate via said projection optical system, said exposure apparatus comprising:
- a focus detection system that detects positional information on said substrate surface in an optical axis direction of said projection optical system which has detection points in
  - a first row which is located before an illumination area of said illumination light, and
  - a second row which is located apart from said detection points in said first row in a moving direction of said substrate being a first direction during said relative scanning;
- a substrate driving system which drives said substrate in said optical axis direction and a tilt with respect to a surface perpendicular to said optical axis;
- a relative scanning unit which relatively scans said mask and said substrate with respect to said projection optical system; and
- a controller which controls said substrate driving system to adjust a positional relationship between an image plane of said projection optical system and said substrate surface based on detection results of said focus detection system, and
- said controller performs after relative scanning of said mask and said substrate is started by said relative scanning unit to transfer said pattern onto said shot area which is an inward and chipped shot,
  - a first controlled state control which controls said substrate in said optical axis direction and of a tilt in a second direction which is perpendicular to said first direction to at least adjust a position in said optical axis direction by closed control of said substrate driving system in accordance with detection results of said detection points in said first row and said second row,
  - a second controlled state control which performs adjustment of one of said position of said substrate in said optical axis direction and of said tilt in said second direction to at least adjust said position in said optical axis direction by said closed control of said substrate driving system in accordance with detection results of said detection points in said second row when said detection points of said first row come off said effective area of said substrate while said first controlled state control is performed, and
  - a third controlled state control which locks said control when said detection points in said second row come off said effective area of said substrate while said second controlled state control is performed.

15. An exposure apparatus which relatively scans a mask and a substrate with respect to a projection optical system while said mask having a pattern formed is illuminated with an illumination light to transfer said pattern onto at least one shot area on said substrate via said projection optical system, said exposure apparatus comprising:
- a focus detection system that detects positional information on said substrate surface in an optical axis direction of said projection optical system which has detection points in
  - a first row which is located before an illumination area of said illumination light,
  - a second row which is located in said illumination area, and
  - a third row which is located in said illumination area;
- a substrate driving system which drives said substrate in said optical axis direction and a tilt with respect to a surface perpendicular to said optical axis;
- a relative scanning unit which relatively scans said mask and said substrate with respect to said projection optical system; and
- a controller which controls said substrate driving system to adjust a positional relationship between an image plane of said projection optical system and said substrate surface based on detection results of said focus detection system, and
- said controller obtains a control error of said substrate driving system during relative scanning of said mask and said substrate by said relative scanning unit in accordance with detection results of said detection points in
  - said first row and said second row at a first point where prereading of a distance between said detection points of said first row and said second row is performed, and
  - said second row and said third row at a second point where an area of said substrate detected at said detection points of said first row comes to said detection points of said second row.

16. An exposure apparatus according to claim 15, wherein said control error is obtained by said controller which
- stores a data of a difference between a target surface obtained by detection results of said detection points in said first, second, and third rows at said first point and said detection results of said first and second row, and
- compares said stored data with said detection results of said detection points in said second and third rows at said second point.

17. An exposure apparatus which relatively scans a mask and a substrate with respect to a projection optical system while said mask having a pattern formed is illuminated with an illumination light to transfer said pattern onto at least one shot area on said substrate via said projection optical system, said exposure apparatus comprising:
- a focus detection system which can detect positional information on said substrate surface in an optical axis direction of said projection optical system at a plurality of detection points; and
- a substrate driving unit which in accordance with said positional information of a selected plurality of detection points serving as control purposes among said plurality of detection points
  - drives said substrate in said optical axis direction and in a tilt direction to a surface perpendicular to said optical axis to adjust a positional relationship between said substrate surface within an illumination area and an image plane of said projection optical system, and
  - rotates said substrate which has a rotational axis extending in a first direction as center and passing through the barycenter of a second direction in an arrangement of said selected plurality of detection points serving as control purposes, to control a tilt in said second direction being perpendicular to a first direction being a direction of said relative scanning.

18. An exposure apparatus according to claim 17, wherein said substrate driving unit controls a position of said substrate in said optical axis direction and said tilt in said second direction so as to prevent interference between said position of said substrate in said optical axis direction and said tilt in said second direction.

19. An exposure apparatus according to claim 17, wherein said substrate driving unit further controls a tilt of said substrate in said first direction by making said substrate rotate around a predetermined axis parallel to said second direction.

20. An exposure apparatus according to claim 19, wherein said substrate driving unit controls a position of said substrate in said optical axis direction and said tilt in said first direction so as to prevent interference between said position of said substrate in said optical axis direction and said tilt in said first direction.

21. An exposure apparatus according to claim 20, wherein said substrate driving unit sets a target value of said position of said substrate in said optical axis direction in consideration of a correction value to remove said interference between said position of said substrate in said optical axis direction and said tilt in said first direction.

22. An exposure apparatus which relatively scans a mask and a substrate with respect to a projection optical system while said mask having a pattern formed is illuminated with an illumination light to transfer said pattern onto at least one shot area on said substrate via said projection optical system, said exposure apparatus comprising:

a focus detection system which can detect positional information on said substrate surface in an optical axis direction of said projection optical system at a plurality of detection points; and a substrate driving unit which in accordance with said positional information of a selected plurality of detection points among said plurality of detection points drives said substrate in said optical axis direction and in a tilt direction to a surface perpendicular to said optical axis to adjust a positional relationship between said substrate surface within an illumination area and an image plane of said projection optical system, and switches detection points to be used in accordance with progress of control during said relative scanning.

23. An exposure apparatus according to claim 22, wherein said plurality of detection points is respectively arranged within said illumination area illuminated by said illumination light and away from said illumination area in a first direction, said first direction being a direction of said relative scanning, and said substrate driving unit switches detection points to be used from said detection points away from said illumination area which serve control purposes to said detection points arranged within said illumination area which serve confirmation purposes in accordance with progress of control during said relative scanning.

24. A device manufacturing method including a lithographic process, wherein exposure is performed in said lithographic process by using said exposure apparatus according to claim 1.

25. A device manufacturing method including a lithographic process, wherein exposure is performed in said lithographic process by using said exposure apparatus according to claim 8.

26. A device manufacturing method including a lithographic process, wherein exposure is performed in said lithographic process by using said exposure apparatus according to claim 11.

27. A device manufacturing method including a lithographic process, wherein exposure is performed in said lithographic process by using said exposure apparatus according to claim 14.

28. A device manufacturing method including a lithographic process, wherein exposure is performed in said lithographic process by using said exposure apparatus according to claim 15.

29. A device manufacturing method including a lithographic process, wherein exposure is performed in said lithographic process by using said exposure apparatus according to claim 17.

30. A device manufacturing method including a lithographic process, wherein exposure is performed in said lithographic process by using said exposure apparatus according to claim 22.

* * * * *